(12) United States Patent
Shinozaki

(10) Patent No.: US 6,212,092 B1
(45) Date of Patent: Apr. 3, 2001

(54) SEMICONDUCTOR INTEGRATED CIRCUIT

(75) Inventor: Naoharu Shinozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/533,886

(22) Filed: Mar. 22, 2000

(30) Foreign Application Priority Data

Jun. 14, 1999 (JP) .................................................. 11-167001

(51) Int. Cl.[7] .................................................. G11C 5/06
(52) U.S. Cl. ...................................... 365/63; 365/189.01
(58) Field of Search ................................. 365/63, 189.01

(56) References Cited

U.S. PATENT DOCUMENTS 5,801,985 * 9/1998 Roohparvar et al. ........... 365/185.01

* cited by examiner

Primary Examiner—David Nelms
Assistant Examiner—M. Tran
(74) Attorney, Agent, or Firm—Arent Fox Kintner Plotkin & Kahn, PLLC

(57) ABSTRACT

The semiconductor integrated circuit comprises a memory cell, a sense amplifier, input/output controlling circuit, a switch circuit which connects the sense amplifier and the input/output circuit, a reference timing signal generator, a timing controlling circuit having a delay element, and a switch controlling circuit which controls the switch circuit. The reference timing signal generator generates a reference timing signal necessary for read/write operations. The timing controlling circuit receives the reference timing signal and generates, by using the delay element thereof, at least one of either a read controlling signal or a write controlling signal whose timing shifts from the timing of the switch controlling signal by a predetermined amount of time. Therefore, the deviation between the timings of the switch controlling signal and the read controlling signal or the write controlling signal can easily be set to a predetermined value. The timing deviation is not easily affected by fluctuations occurring in a manufacturing process, an operation voltage, or ambient temperature. Therefore, it is possible to carry out the timing design to minimize the deviation between the timings of the switch controlling signal and the read controlling signal or the write controlling signal. As a result, a high-speed operation can be performed. When the high-speed operation is not pursued, it is possible to increase timing margins of other circuits so that the yield improves.

14 Claims, 38 Drawing Sheets

SEMICONDUCTOR INTEGRATED CIRCUIT

BACKGROUND OF THE INVENTION

1. Field of the Invention

The present invention relates to a semiconductor integrated circuit comprising a memory cell for reading and writing data, more particularly, to a technology for optimizing a timing of a controlling signal which controls an internal circuit.

The present invention relates to a semiconductor integrated circuit having a testing mode, more particularly, to a technology for modifying an operation timing of an internal circuit in a testing mode.

2. Description of the Related Art

Integration levels and operation speeds of semiconductor integrated circuits such as microcomputers and DRAM's have been improving. Recently, timing margins of controlling signals used in internal circuits have been reduced due to the increasing operation speeds, and timing design considering wiring length or the like within a chip has been carried out.

FIG. 1 shows a chip layout of an SDRAM (Synchronous DRAM) among semiconductor integrated circuits of this kind, which operates in synchronization with a clock signal. FIG. 1 shows circuits related to data input/output in accordance with a column address.

An SDRAM 1 comprises four pairs of memory core units 2 laid out in mirror symmetry in each of the pairs. A peripheral circuit 3 (the stippled portion in FIG. 1) is arranged at the center of the SDRAM 1 in a cross-like shape along the vertical and horizontal directions of the SDRAM 1.

Each of the memory core units 2 comprises a plurality of main-decoders 4, sense amplifiers 5, switching circuits 6, memory cells 7, sense buffers 8, and write amplifiers 9. (Hereinafter, explanation of the plurality of the circuits above and a pad described below will be given for each single unit of the circuits, such as "the sense amplifier 5" instead of "each of the sense amplifiers 5", except for some cases of the sense buffers 8 and the write amplifiers 9 where each buffer or amplifier is specified by a reference code.) A pre-decoder 10 is arranged between each pair of the memory core units 2 laid out in mirror symmetry.

Pads 11 for receiving and transmitting signals from and to the exterior of the chip are arranged within the peripheral circuit 3 along the horizontal direction of FIG. 1. wirings of a read data signal RDBZ, a write data signal WDBZ, testing read data signals TRDBZ and TRDBX, and a testing write data signal TWDBZ is arranged within the peripheral circuit 3 along the horizontal direction of FIG. 1. The peripheral circuit 3 comprises a data input/output circuit 12, a clock buffer 13, a clock pulse generator 14, a timing controlling circuit 15, a resetting circuit 16, a testing circuit 17, a controlling circuit 18, or the like.

The clock buffer 13 receives a clock signal CLK from the exterior through the pad 11, and outputs an internal clock signal CLKZ. The clock pulse generator 14 receives the internal clock signal CLKZ and outputs a clock pulse signal CEPZ. The timing controlling circuit 15 receives the clock pulse signal CEPZ and outputs a read controlling signal SEBZ and a write controlling signal WAEZ. The resetting circuit 16 receives the read controlling signal SEBZ, the read data signal RDBZ, and the testing read data signals TRDBZ and TRDBX. The data input/output circuit 12 receives the read data signal RDBZ, the write data signal WDBZ, the testing read data signals TRDBZ and TRDBX and the testing write data signal TWDBZ. The data input/output circuit 12 also receives a data signal DQ through the pad 11. The testing circuit 17 outputs a testing signal TESZ. The testing signal TESZ is supplied to the data input/output circuit 12, the resetting circuit 16, the sense amplifier 8, and the write amplifier 9, which is not shown in FIG. 1.

The pre-decoder 10 receives the clock pulse signal CEPZ and a row address signal which is not shown in FIG. 1. The pre-decoder 10 outputs a column decoding signal CAZ to the main-decoder 4. A portion of wiring of the clock pulse signal CEPZ is formed horizontally along the memory core unit 2, and wiring length thereof is long. Therefore, a load of the wiring of the clock pulse signal CEPZ is large. Likewise, wiring of the column decoding signal CAZ is formed vertically within the main-decoder 4, and has long length. Therefore, a load of the wiring of the column decoding signal is also large.

The main-decoder 4 receives the column decoding signal CAZ and outputs a column selecting signal CLZ. The sense amplifier 5 receives bit line signals BLX and BLZ. The bit line signals BLX and BLZ are complementary signals.

The memory cell 7 receives the bit line signals BLX and BLZ. The switching circuit 6 receives the column selecting signal CLZ, the bit line signals BLX and BLZ and internal data signals GDBZ and GDBX. The sense buffer 8 receives the internal data signals GDBZ and GDBX and outputs the read data signal RDBZ and the testing read data signals TRDBZ and TRDBX. The write amplifier 9 receives the write data signal WDBZ and the testing write data signal TWDB, and outputs the internal data signals GDBZ and GDBX.

A J-shaped arrow A1 shown in the memory core unit 2 in FIG. 1 means that data read from the memory cell 7 are amplified by the sense amplifier 5 as the bit line signals BLZ and BLX and supplied to the sense buffer 8 through the switching circuit 6. A J-shaped arrow A2 means that write data output from the write amplifier 9 through the switching circuit 6 is supplied to the sense amplifier 5 as the bit line signals BLZ and BLX and written to the memory cell 7.

Each signal line described above is also connected to the pre-decoders 10 and to the memory core units 2 where the signal lines are not shown in FIG. 1.

Each signal line or wiring shown by a thick line in FIG. 1 comprises a plurality of lines. For example, the read data signal RDBZ comprises read data signals RDB0Z, RDB1Z, RDB2Z, and RDB3Z, and the write data signal WDBZ comprises write data signals WDB0Z, WDB1Z, WDB2Z, and WDB3Z.

The signals suffixed with "Z" mean signals of positive logic, while the signals suffixed with "X" are signals of negative logic.

FIG. 2 shows main circuits and flow of main signals which are related to a column address.

The switching circuit 6 comprises an nMOS transistor. The gate of the nMOS transistor receives the column selecting signal CLZ and the source and the drain thereof receive the bit line signals BLZ and BLX and the internal data signals GDBZ and GDBX, respectively. Hereinafter, an nMOS transistor and a pMOS transistor are respectively called an nMOS and a pMOS for short.

FIG. 3 shows the clock buffer 13 in detail.

The clock buffer 13 comprises a differential amplifier 19 for comparing the clock signal CLK input from the exterior with a reference voltage VREF, and a pulse generator 20 comprising an inverter and a NAND gate. The reference voltage VREF is set to a half of a supply voltage VCC (2.5V).

The differential amplifier 19 has voltage outputting parts 21 and 22 symmetric to each other and each having a pMOS and an nMOS connected in series. The gates of nM'es 21a and 22a of the voltage outputting parts 21 and 22 receive the clock signal CLK and the reference voltage VREF, respectively. The sources of the nMOS'es 21a and 22a are connected to a ground line VSS through an nMOS 23. The gate of the nMOS 23 is connected to a power supply line VCC. A node ND1 connecting the nMOS 21a to the pMOS 21b of the voltage outputting part 21 is connected to the input of the pulse generator 20.

The sources of the pMOS'es 21b and 22b are connected to the power supply line VCC. The gates of the pMOS'es 21b and 22b are connected to the drain (a node ND2) of the pMOS 22b. The voltage outputting parts 21 and 22 form a current mirror circuit.

The pulse generator 20 comprises an inverter 20a and inverter rows 20b and 20c each connecting three inverters in cascade, and a 2-input NAND gate 20d. The input of the inverter 20a is connected to the node ND1. The output of the inverter 20a is connected to one of the inputs of the NAND gate 20d and to the input of the inverter row 20b. The output of the inverter row 20b is connected to the other input of the NAND gate 20d. The output of the NAND gate 20d is connected to the input of the inverter row 20c. The output of the inverter row 20c outputs the internal clock signal CLKZ.

FIG. 4 shows the clock pulse generator 14 in detail.

The clock pulse generator 14 comprises three inverters 14a, 14b, and 14c, a flip-flop circuit 14d comprising two 2-input NAND gates, and inverter rows 14e and 14f each connecting four inverters in cascade. The input of the inverter 14a receives the internal clock signal CLKZ. The output of the inverter 14a is connected to one of the inputs of the flip-flop circuit 14d. In the flip-flop circuit 14, the output of the NAND gate which connects the inverter 14a is connected to the input of the inverter 14b. The output of the inverter 14b is connected to the input of the inverter 14c and the input of the inverter row 14e. The output of the inverter 14c outputs the clock pulse signal CEPZ. The output of the inverter row 14e is connected to the input of the inverter row 14f. The output of the inverter row 14f (a node ND3) is supplied back to the other input of the flip-flop circuit 14d.

FIG. 5 shows generation timing of the clock pulse signal CEPZ generated by the clock pulse generator 14. The clock pulse signal CEPZ rises in synchronization with a rise of the clock signal CLKZ, and falls in synchronization with a fall of a feedback signal transmitted through the node ND3. In other words, an activation period (pulse width) of the clock pulse signal CEPZ is determined by delay time of the inverter rows 14e and 14f.

FIG. 6 shows the pre-decoder 10 in detail.

The pre-decoder 10 comprises a plurality of decoding circuits 10a. Each of the decoding circuits 10a comprises a 3-input NAND gate 10b and an inverter 10c. The inputs of the NAND gate 10b receive two row address signals (for example, row address signals AZ and BZ) and the clock pulse signal CEPZ. The output of the NAND gate 10b is connected to the input of the inverter 10c. The output of the inverter 10c outputs the column decoding signal CAZ or the like.

FIG. 7 shows the main-decoder 4 in detail.

The main-decoder 4 comprises a plurality of decoding circuits 4a, as the pre-decoder 10. Each of the decoding circuits 4a comprises 3-input NAND gate 4b and an inverter 4c. The inputs of the NAND gate 4b receive three decoding signals (for example, decoding signals CAZ, CBZ and CCZ). The output of the NAND gate 4b is connected to the input of the inverter 4c. The output of the inverter 4c outputs the column selecting signals CL1Z or the like.

FIG. 8 shows the timing controlling circuit 15 in detail.

The timing controlling circuit 15 comprises six delay circuits 15a connected in cascade. Each of the delay circuits 15a comprises a CMOS inverter 15b in which the drains of a pMOS and an nMOS are serially connected to resistors R1 and R2 respectively, a MOS capacitor 15c in which the source and the drain of an nMOS are connected to the ground line VSS, and a resistor R3 connecting the output of the CMOS inverter 15b with the gate of the MOS capacitor 15c. The resistors R1, R2, and R3 are formed with diffusion layers. In other words, the delay circuit 15a is formed as a CR time constant circuit. The time constant of the delay circuit 15a is determined by a wiring load of the clock pulse signal CEPZ along the memory core unit 2, a circuit delay by the pre-decoder 10, a wiring load of the column decoding signal CAZ, and a circuit delay by the main-decoder 4, as shown in FIG. 1.

The input of the first stage delay circuit 15a receives the clock pulse signal CEPZ. The output of the second-stage delay circuit 15a outputs the write controlling signal WAEZ. The output of the final stage delay circuit 15a outputs the read controlling signal SEBZ. Activation periods of the write controlling signal WAEZ and the read controlling signal SEBZ output from the timing controlling circuit 15 are shifted by a predetermined amount of time behind an activation period of the column selecting signal CLZ, which will be explained later.

FIG. 9 shows in detail the resetting circuit 16 and peripheral circuits thereof.

The resetting circuit 16 receives the read controlling signal SEBZ, the testing signal TESZ, the read data signals RDB0Z, RDB1Z, RDB2Z, and RDB3Z, and the testing read data signals TRDBZ and TRDBX. The read data signals RDB0Z, RDB1Z, RDB2Z, and RDB3Z and the testing read data signals TRDBZ and TRDBX are signals supplied from sense buffers 8a, 8b, 8c and 8d. The sense buffers 8a, 8b, 8c, and 8d correspond to data signals DQ0, DQ1, DQ2, and DQ3, respectively. The resetting circuit 16 comprises pMOS'es 16a, 16b, 16c, 16d, 16e, and 16f for setting the read data signals RDB0Z, RDB1Z, RDB2Z, and RDB3Z, and the testing read data signals TRDBZ and TRDBX to the supply voltage VCC, inverters 16g, 16h, 16j and a 2-input NOR gate 16k controlling the pMOS'es, and a latch circuit 16m.

The input of the inverter 16g receives the read controlling signal SEBZ. The output of the inverter 16g is connected to the input of the inverter 16h and one of the inputs of the NOR gate 16k. The output of the inverter 16h is connected to the gates of the pMOS'es 16a, 16b, 16c and 16d. The other input of the NOR gate 16k receives an inverted signal of the testing signal TESZ through the inverter 16j. The output of the NOR gate 16k is connected to the gates of the pMOS'es 16e and 16f.

The latch circuit 16m comprises six latches 16n each comprising two inverters in which each one of the inputs is connected to the output of the other. Terminals of the latches 16n are respectively connected to the read data signals RDB0Z, RDB1Z, RDB2Z, and RDB3Z, and the testing read data signals TRDBZ and TRDBX. The drivability of the latches 16n is low, and data latched therein are easily inverted by operations of the pMOS'es 16a, 16b, 16c, 16d, 16e, 16f, and nMOS'es 25e, 25f, and 25g in FIG. 10 which will be explained later.

FIG. 10 shows the sense buffers 8 (8a, 8b, 8c, 8d) in detail.

The sense buffers 8 comprises a differential amplifier 24 for comparing and amplifying the internal data signals GDBZ and GDBX output from the sense amplifier 5 through the switching circuit 6, and an output circuit 25 for outputting the signals amplified by the differential amplifier 24 as the read data signal RDBZ and the testing read data signals TRDBZ and TRDBX.

The sense buffers 8 has voltage outputting parts 26 and 27 symmetric to each other and each comprising a pMOS and an nMOS connected in series. The gates of nMOS'es 26a and 27a of the voltage outputting parts 26 and 27 receive the internal data signals GDBX and GDBZ, respectively. The sources of the nMOS 26a and 27a are connected to the ground line VSS through an nMOS 28. The gate of the nMOS 28 receives the read controlling signal SEBZ. A node ND4 connecting the nMOS 26a with the pMOS 26b of the voltage outputting part 26 and a node ND5 connecting the nMOS 27a and the pMOS 27b of the voltage outputting part 27 are connected to the output circuit 25.

The sources of the pMOS'es 26b and 27b are connected to the supply line VCC. The gates of the pMOS'es 26b and 27b are connected to the node ND5. The voltage outputting parts 26 and 27 form a current mirror circuit.

The nodes ND4 and ND5 are connected to the drains of pMOS'es 29 and 30, respectively. The gates of the pMOS'es 29 and 30 receive the read controlling signal SEBZ. The sources of the pMOS'es 29 and 30 are connected to the supply line VCC.

The output circuit 25 comprises inverters 25a and 25b, two 2-input NOR gates 25c and 25d, and three nMOS'es 25e, 25f, and 25g. The input of the inverter 25a is connected to the node ND4. The output of the inverter 25a is connected to the gate of the nMOS 25e. One of the inputs of the NOR gate 25c is connected to the node ND4. One of the inputs of the NOR gate 25d is connected to the node ND5. The other inputs of the NOR gates 25 and 25d receive the inverted signal of the testing signal TESZ through the inverter 25b. The output of the NOR gate 25c is connected to the gate of the nMOS 25f. The output of the NOR gate 25d is connected to the gate of the nMOS 25g.

The drain of the nMOS 25e outputs the read data signal RDBZ. The drain of the nMOS 25f outputs the testing read data signal TRDBZ. The drain of the nMOS 25g outputs the testing read data signal TRDBX. The sources of the nMOS'es 25e, 25f, and 25g are connected to the ground line VSS.

FIG. 11 shows the write amplifier 9 in detail.

The write amplifier 9 comprises an input circuit 31 for receiving the write data signal WDBZ and the testing write data signal TWDBZ, a latch circuit 32 for latching the data received by the input circuit, and an output circuit 33 for outputting the data latched by the latch circuit 32 as the internal data signals GDBZ and GDBX.

The input circuit 31 comprises an inverter 31a and CMOS transmission gates 31b and 31c in each of which the source and the drain of a pMOS and an nMOS are connected to each other. The input of the CMOS transmission gate 31b receives the write data signal WDBZ. The input of the CMOS transmission gate 31c receives the testing write data signal TWDBZ. The outputs of the CMOS transmission gates 31b and 31c are connected to a node ND6. The PMOS gate of the CMOS transmission gate 31b and the nMOS gate of the CMOS transmission gates 31c receive the testing signal TESZ. The nMOS gate and the pMOS gate of the CMOS transmission gates 31b and 31c receive the inverted signal of the testing signal TESZ through the inverter 31a.

The latch circuit 32 comprises two inverters 32a and 32b in which each one of the inputs is connected to the output of the other. The input of the inverter 32a and the output of the inverter 32b are connected to the node ND6. The output of the inverter 32a and the input of the inverter 32b are connected to a node ND7.

The output circuit 33 comprises inverters 33a and 33b and CMOS transmission gates 33c and 33d in each of which the source and the drain of a pMOS and an nMOS are connected to each other. The input of the CMOS transmission gate 33c is connected to the node ND7 through the inverter 33a. The input of the CMOS transmission gate 33d is connected to the node ND7. The output of the CMOS transmission gate 33c outputs the internal data signal GDBZ. The output of the CMOS transmission gate 33d outputs the internal data signal GDBX. The nMOS gates of the CMOS transmission gates 33c and 33d receive the write controlling signal WAEZ. The PMOS gates of the CMOS transmission gates 33c and 33d receive an inverted signal of the write controlling signal WAEZ through the inverter 33b.

FIG. 12 shows in detail a data input circuit 34 and peripheral circuits thereof in the data input/output circuit 12.

The data input circuit 34 comprises an inverter 34a, CMOS transmission gates 34b, 34c, 34d, 34e, 34f, 34g, and 34h in each of which the source and the drain of a pMOS and an nMOS are connected to each other.

The inputs of the CMOS transmission gates 34b, 34c, 34d, and 34e receive the data signal DQ0. The output of the CMOS transmission gate 34b outputs the write data signal WDB0Z. The output of the CMOS transmission gate 34c outputs a testing write data signal TWDB1Z. The output of the CMOS transmission gate 34d outputs a testing write data signal TWDB2Z. The output of the CMOS transmission gate 34e outputs a testing write data signal TWDB3Z.

The input of the CMOS transmission gate 34f receives the data signal DQ1. The output of the CMOS transmission gate 34f outputs the write data signal WDB1Z. The input of the CMOS transmission gate 34g outputs the data signal DQ2. The output of the CMOS transmission gate 34g outputs the write data signal WDB2Z. The input of the CMOS transmission gate 34h receives the data signal DQ3. The output of the CMOS transmission gate 34h outputs the write data signal WDB3Z.

The pMOS gate of the CMOS transmission gate 34b is connected to the ground line VSS. The nMOS gate of the CMOS transmission gate 34b is connected to an internal power supply line VII. The voltage of the internal supply line VII is 2.0V. The nMOS gates of the CMOS transmission gates 34c, 34d, and 34e receive the testing signal TESZ. The PMOS gates of the CMOS transmission gates 34c, 34d, and 34e receive the inverted signal of the testing signal TESZ through the inverter 34a. The pMOS gates of the CMOS transmission gates 34f, 34g, and 34h receive the testing signal TESZ. The nMOS gates of the CMOS transmission gates 34f, 34g, and 34h receive the inverted signal of the testing signal TESZ through the inverter 34a.

The write data signal WDB0Z is also used as the testing write data signal TWDB0Z. The write data signals WDB0Z, WDB1Z, WDB2Z and WDB3Z are connected to different write amplifiers 9a, 9b, 9c and 9d, respectively. The testing write data signals TWDB0Z, TWDB1Z, TWDB2Z and TWDB3Z are connected to the different write amplifiers 9a, 9b, 9c and 9d, respectively.

In the SDRAM 1 described above, a data reading operation is carried out in the following manner.

FIG. 13 shows timings of main signals in the reading operation.

The clock pulse generator 20 in the clock buffer 13 shown in FIG. 3 generates the internal clock signal CLKZ in synchronization with a rise of the clock signal CLK [FIG. 13(a)].

By receiving the internal clock signal CLKZ, the clock pulse generator 14 shown in FIG. 4 generates the clock pulse signal CEPZ having a pulse width equivalent to the delay time caused by the inverter rows 14e and 14f [FIG. 13(b)].

The clock pulse signal CEPZ is transmitted to the pre-decoder 10, the wiring of the column decoding signal CAZ, and to the main-decoder 4 in this order, and activates the column selecting signal CLZ corresponding to a predetermined address [FIG. 13(c)]. The column selecting signal CLZ is activated lagging behind the clock pulse signal CEPZ by time T1, due to the wiring load of the lock pulse signal CEPZ, the circuit delay of the pre-decoder 10, the wiring load of the column decoding signal CAZ and the circuit delay of the main-decoder 4.

The timing controlling circuit 15 shown in FIG. 8 receives the clock pulse signal CEPZ and generates the read controlling signal SEBZ by using the delay circuit 15a [FIG. 13(d)]. The read controlling signal SEBZ is generated lagging behind the column selecting signal CLZ by time T2.

The memory cell 7 is selected by a signal and a circuit corresponding to a row address which is not shown, and the bit line signals BLZ and BLX are output from the memory cell 7 [FIG. 13(e)]. Practically, voltages of the bit line signals BLZ and BLX change by distribution of a storage charge in the memory cell 7 to the wiring of the bit line signals.

The switching circuit 6 shown in FIG. 2 is turned on by receiving the column selecting signal CLZ at high level. Signal levels of the bit line signals BLZ and BLX are transmitted as the internal data signals GDBZ and GDBX through the switching circuit 6 [FIG. 13(f)].

The resetting circuit 16 shown in FIG. 9 turns off the pMOS'es 16a, 16b, 16c and 16d by receiving the read controlling signal SEBZ at high level. The read data signal RDBZ (RDB0Z, RDB1Z, RDB2Z and RDB3Z) is retained a high level by the latch circuit 16m. Since the testing signal TESZ is at low level in a normal operation, the nMOS'es 16e and 16f are always ON.

The differential amplifier 24 in the sense buffer 8 shown in FIG. 10 accepts the internal data signals GDBZ and GDBX by receiving the read controlling signal SEBZ at high level. The differential amplifier 24 carries out differential amplification of the internal data signals GDBZ and GDBX and outputs the amplified signals to the nodes ND4 and ND5. The output circuit 25 of the sense buffer 8 receives the amplified signals and outputs the signals as read data signal RDBZ (RDB0Z, RDB1Z, RDB2Z, and RDB3Z) [FIG. 13(g)]. When the internal data signal GDBZ is at high level, the node ND4 becomes a high level. The nMOS 25e is turned off at this time and the read data signal RDBZ retains a high level. When the internal data signal GDBZ is at low level, the node ND5 is at low level. At this time, the nMOS 25e is turned on and the read data signal RDBZ is at low level. The read data signal RDBZ is supplied to the long wiring in the horizontal direction of the chip, as shown in FIG. 1. Therefore, the level of the read data signal slowly varies to the low level. By turning on the nMOS 25e', the data latched in the latch 16n shown in FIG. 9 are inverted.

By the data input/output circuit 12 shown in FIG. 2, the read data signal RDBZ is output to the pad as the data signal DQ, and the read operation is completed.

In the SDRAM 1 described above, a data writing operation is carried out in the following manner.

FIG. 14 shows timings of main signals in the write operation in the SDRAM 1. Since the timings of the clock signal CLKZ, the clock pulse signal CEPZ, and the column selecting signal CLZ are the same as in the read operation, explanation thereof is omitted.

The timing circuit 15 shown in FIG. 8 receives the clock pulse signal CEPZ and generates the write controlling signal WAEZ by using the delay circuit 15a [FIG. 14(a)]. By using the delay circuit 15a, the write controlling signal WAEZ is generated ahead of the column selecting signal CLZ by time T3.

The data input/output circuit 12 shown in FIG. 12 accepts the data signal DQ (DQ0, DQ1, DQ2, and DQ3) from the exterior. The testing signal TESZ is set at low level in a normal operation. The CMOS transmission gates 34b, 34f, 34g and 34h turn on and turn off the CMOS transmission gates 34c, 34d, and 34e turn off. Therefore, the data signals DQ0, DQ1, DQ2, and DQ3 accepted are respectively transmitted to the write amplifiers 9a, 9b, 9c, and 9das the write data signals WDB0Z, WDB1Z, WDB2Z, and WDB3Z (collectively called the write data signal WDBZ) [FIG. 14(b)].

The write amplifier 9 shown in FIG. 11 latches the accepted write data signal WDBZ by the latch circuit 32. The output circuit 33 of the write amplifier 9 outputs signals at a signal level of the node ND7 and the inverted level thereof as the internal data signals GDBX and GDBZ when the write controlling signal WAEZ is at high level [FIG. 14(c)].

The switching circuit 6 shown in FIG. 3 is turned on by receiving the column selecting signal CLZ at high level. The signal levels of the internal data signals GDBX and GDBZ are transmitted as the bit line signals BLX and BLZ through the switching circuit 6 [FIG. 14(d)].

The memory cell 7 is selected by a signal and a circuit corresponding to a row address which is not shown. The levels of the bit line signals BLZ and BLX are written to the memory cell 7, and the write operation is completed.

In the SDRAM 1 described above, data compressing test is carried out in the following manner. The shift to the compressing test mode is carried out by a command input or the like from the exterior. The testing circuit 17 shown in FIG. 1 turns the testing signal TESZ to a high level by receiving the shift to the compression mode.

A write operation in the compressing test mode will be explained first.

FIG. 15 shows timings of main signals related to the write operation.

The data input/output circuit 12 shown in FIG. 12 receives the testing signal TESZ at high level and the CMOS transmission gates 34c, 34d, and 34e is turned on while the CMOS transmission gates 34f, 34g, and 34h is turned off. The data input/output circuit 12 transmits the data signal DQ0 accepted from the exterior as the testing write data signals TWDB0Z, TWDB1Z, TWDB2Z, and TWDB3Z (collectively called the testing write data signal TWBDZ) to the write amplifiers 9a, 9b, 9c and 9d. Since the testing write data signal TWBDZ is generated only from the data signal DQ0, a waveform thereof is gentler than the waveform of the write data signals WDBZ [FIG. 15(a)].

The write amplifier 9 shown in FIG. 11 receives the testing signal TESZ at high level and turns off the CMOS transmission gates 31b while turning on the CMOS transmission gate 31c. The latch circuit 32 latches the testing write data signal TWDBZ through the CMOS transmission gate 31c. The output circuit 33 receives the write controlling signal WAEZ at high level, and outputs a signal transmitted to the node ND7 and an inverted signal thereof as the internal data signals GDBX and GDBZ [FIG. 15(b)].

As in the write operation in a normal operation, the value of the data signal DQ0 is written to each of the memory cells 7 through the forms of the bit line signals BLZ and BLX.

A data reading operation in the compressing test mode will be explained next. FIG. 16 shows timings of main signals related to the read operation in the compressing test mode.

By receiving the read controlling signal SEBZ at high level, the differential amplifier 24 in the sense buffer 8 shown in FIG. 10 accepts the internal data signals GDBZ and GDBX. The differential amplifier 24 carries out differential amplification and outputs amplified signals to the nodes ND4 and ND5. The output circuit 25 of the sense buffer 8 receives the testing signal TESZ at high level and activates the NOR gates 25c and 25d. By this activation, when the nodes ND4 and ND5 are at high level and at low level respectively, nMOS'es 25f and 25g are turned on and off respectively, while the testing read data signals TRDBZ and TRDBX are at high level and at low level respectively. When the nodes ND4 and ND5 are at low level and at high level respectively, the nMOS'es 25f and 25g are turned on and off respectively, while the testing read data signals TRDBZ and TRDBX are at low level and at high level respectively [FIG. 16(a)].

The resetting circuit 16 shown in FIG. 9 receives the testing signal TESZ at high level and turns on the PMOS'es 16e and 16f when the read controlling signal SEBZ is at low level. On the other hand, the resetting circuit 16 turns off the pMOS'es 16e and 16f when the read controlling signal SEBZ is at high level (meaning the read operation). Wiring of the testing read data signals TRDBZ and TRDBX of the sense buffers 8a, 8b, 8c, and 8d corresponding to the data signals DQ0, DQ1, DQ2 and DQ3 is shared. As has been described above, the same data have been written to the memory cells 7 each corresponding to the sense buffers 8a, 8b, 8c and 8d. Therefore, when the memory cells 7 or the like are not malfunctioning, the testing read data signals TRDBZ and TRDBX are at different levels. When the memory cells 7 or the like are malfunctioning, any one of the nMOS'es 25f or 25g of the sense buffers 8a, 8b, 8c and 8d is on. For this reason, both of the testing read data signals TRDBZ and TRDBX a low level and the malfunctioning of the memory cells 7 is detected.

Since the wiring of the testing read data signals TRDBZ and TRDBX is connected to the plurality of the sense buffers 8a, 8b, 8c and 8d, a load thereof is large. Therefore, as shown in FIG. 16, waveforms of the testing read data signals TRDBZ and TRDBX are gentler than the waveform of the read data signal RDBZ. The read operation is carried out at the same timing as the read operation timing shown in FIG. 13, except for the waveforms of the testing read data signals TRDBZ and TRDBX.

As shown in FIG. 8, the write controlling signal WAEZ and the read data signals RDBZ are generated lagging behind the column selecting signal CLZ by the predetermined amount of time, by using the delay circuits 15a combining the CR time constant circuits. Meanwhile, the activation timing of the column selecting signal CLZ is determined by the wiring load of the clock pulse signal CEPZ, the circuit delay of the pre-decoder 10, the wiring load of the column decoding signal CAZ, and the circuit delay of the main-decoder 4. Therefore, relative deviations between the activation timings of the write controlling signal WAEZ and the column selecting signal CLZ, and between the read data signals RDBZ and the column selecting signal CLZ easily fluctuate due to a change occurring in a manufacturing process, an operation voltage, and ambient temperature.

If the activation timing of the read controlling signal SEBZ is earlier than the activation timing of the column selecting signal CLZ, a problem occurs in the read operation. In other words, the sense buffer 8 shown in FIG. 10 accepts wrong data existing before the internal data signals GDBZ and GDBX are transmitted. In the sense buffer 8, the value of the read data signal RDBZ is determined by the data accepted first. Therefore, the SDRAM 1 outputs wrong data as the data signal DQ.

The problem in the read operation is caused by a narrow wiring width due to a fluctuation occurring in a manufacturing process (in photolithography process or etching process), for example. The narrower width leads to an increase in a wiring resistance, leading to a longer propagation delay time of signal. In other words, the clock pulse signal CEPZ and the column decoding signal CAZ having long total wiring lengths are affected greatly by the increase in the delay time due to the increase in the wiring resistance, and have a larger propagation delay than other signals.

The problem in the read operation also occurs in the case where the resistance of the resistors R1, R2 and R3 (diffusion resistance) used in the delay circuit 15a is decreased due to a fluctuation occurring in a manufacturing process (in ion-implantation process or heat treatment process), for example. Furthermore, the deviations between the timings are fluctuated by fluctuations occurring in the operation voltage or ambient temperature.

If the activation timing of the write controlling signal WAEZ is later than the activation timing of the column selecting signal CLZ, a problem occurs in the write operation. In other words, the switching circuit shown in FIG. 2 transmits to the sense amplifier 5 wrong data which are not proper write data from the write amplifier 9. The sense amplifier 5 amplifies the wrong data and then amplifies the proper write data from the write amplifier 9. Therefore, an access time becomes longer. In the case where the proper write data are not amplified in a write cycle, the wrong data are written to the memory cell 7.

The above problem in the write operation occurs due to reduction in wiring resistance and in diffusion resistance.

The above problem has been dealt with by increasing the time T2 shown in FIG. 13. However, if the time T2 is increased, an expected access time may not necessarily be obtained.

Especially, in the case of a chip operating at a high speed, it is necessary for timing margins of the controlling signals in the internal circuit to be set small. Furthermore, the permissible ranges of the deviations between the activation timings of the write controlling signal WAEZ and the column selecting signal CLZ and between the read data signal RDBZ and the column selecting signal CLZ need to be set as narrow as possible. For this reason, the above problem is more conspicuous.

For a chip operating at a low voltage, a delay time of a gate circuit such as an inverter changes greatly depending on a fluctuation of an operation voltage. Especially, a fluctuation of a delay time of a delay circuit combining an inverter and a CR time constant circuit tends to be large. Therefore, the above problem is more conspicuous.

Furthermore, waveform check of the column selecting signal CLZ or the like has not been carried out on a product to be shipped. A waveform of a controlling signal in an internal circuit can generally be checked by using an electron beam tester. However, this evaluation method needs to remove an insulator or the like on the chip, and is not applied to a product to be shipped. It is also possible to form an evaluating pad in advance for a controlling signal to be checked. However, molded chip cannot be evaluated by this method. Furthermore, the evaluating pad and wiring thereof are loads irrelevant to operation, which may obstructs a high-speed operation.

The SDRAM 1 described above has a further problem below.

The column selecting signal CLZ and the write controlling signal WAEZ are generated from the clock pulse signal CEPZ and have almost the same activation periods. Since the write controlling signal WAEZ is activated earlier than the column selecting signal CLZ, the column selecting signal CLZ is activated lagging behind inactivation of the write controlling signal WAEZ by the time T3, as shown in FIG. 17.

In time T4 when the write controlling signal WAEZ and the column selecting signal CLZ are both active, the difference between the levels of the bit line signals BLZ and BLX to be written to the memory cell 7 becomes larger due to the drivability of the write amplifier 9 and amplifying power of the sense amplifier 5. In the time T3 when the write controlling signal WAEZ is inactivated, the level difference between the bit line signals BLZ and BLX increases only due to the amplifying power of the sense amplifier 5. Therefore, in the time T3, the level difference between the bit line signals BLZ and BLX is gentler than in the time T4. As a result, a write voltage to the memory cell 7 is lowered, and a data retaining time of the memory cell 7 is shortened. Recently, the active time of the CLZ signal tends to be shortened due to a high-speed operation, and the level difference between the bit line signals BLZ and BLX needs to be increased in a short time.

In the compressing test mode, the following problem occurs.

As shown in FIG. 12, in the write operation, one data signal DQ is output to the write amplifier 9 as the plurality of the testing write data signals TWDB0Z, TWDB1Z, TWDB2Z, and TWDB3Z. In the read operation, as shown in FIG. 9, the wiring of the testing read data signals TRDBZ and TRDBX are connected to the plurality of the sense buffers 8a, 8b, 8c and 8d. Therefore, waveforms of the testing write data signals TWDB0Z, TWDB1Z, TWDB2Z, and TWDB3Z, and the testing read data signals TRDBZ and TRDBX become gentle due to the wiring load of each signal line and a load of the circuits connected thereto.

For example, in the read operation, as shown in FIG. 16, the activation periods of the controlling signals such as the column selecting signal CLZ and the read controlling signal SEBZ need to be set in such a manner that the low level of the testing read data signal TRDBZ takes a predetermined voltage. When only the normal operation mode is considered, timing of each signal is set to the timing which enables the read data signal RDBZ to be amplified sufficiently, as shown by dashed lines in FIG. 16. However, in the SDRAM1 described above, a high-speed operation cannot be realized regardless of a timing margin in the normal operation mode, since the timing of each signal is determined in accordance with the timings in the compressing test mode.

SUMMARY OF THE INVENTION

An object of the present invention is to minimize a deviation between the generation timings of controlling signals due to fluctuations occurring in a manufacturing process, an operation voltage, and ambient temperature.

Another object of the present invention is to write data in a memory cell in a semiconductor integrated circuit with a sufficient write voltage.

Still another object of the present invention is to operate an internal circuit at an optimal timing for the normal operation mode in a semiconductor integrated circuit having a normal operation mode and a testing mode.

Yet another object of the present invention is to indirectly evaluate an operation timing of an internal circuit and to improve the characteristic of a chip based on a result of the evaluation.

According to one of the aspects of the semiconductor integrated circuit in the present invention, a reference timing signal generator generates a reference timing signal necessary for read/write operations. The generated reference timing signal is supplied to a switch controlling circuit and a timing controlling circuit. The switch controlling circuit receives the reference timing signal and generates a switch controlling signal at a predetermined timing, and outputs the switch controlling signal to a switching circuit. The timing controlling circuit receives the reference timing signal and generates at least one of either a read controlling signal or a write controlling signal at a predetermined timing, and outputs the generated signal to an input/output controlling circuit. The timing controlling circuit comprises a delay element which is identical or equivalent to a delay element existing in a signal path between an output node of the basic timing generator outputting the reference timing signal and an input node of the switch controlling signal supplied to the switching circuit. The timing controlling circuit generates a read or write controlling signal whose timing shifts from that of the switch controlling signal by a predetermined amount of time, by using the delay element thereof. Therefore, a deviation between the timings of the switch controlling signal and the read controlling signal or the write controlling signal can easily be set to a predetermined value.

In a read operation, data are read from a memory cell and amplified by a sense amplifier. The switch controlling circuit outputs the switch controlling signal in synchronization with the data amplified to a predetermined level. The switching circuit is turned on by the switch controlling signal, and transmits the data to an input/output controlling circuit through a transmission path. By using the delay element, the timing controlling circuit generates and outputs the read controlling signal delayed by a predetermined amount of time from the switch controlling signal. A read controlling circuit in the input/output controlling circuit receives the read controlling signal and receives the data transmitted at a predetermined timing.

The read controlling signal is generated by using the delay element above. Therefore, a deviation between the timings of the read controlling signal and the switch controlling signal becomes substantially constant at all times. The timing deviation is not easily affected by fluctuations occurring in a manufacturing process, an operation voltage, or ambient temperature.

In a write operation, by using the delay element, the timing controlling circuit generates and outputs the write controlling signal at a timing earlier than that of the switch controlling signal by a predetermined amount of time. A write controlling circuit in the input/output controlling circuit receives the write controlling signal and outputs data to be written to the memory cell at a predetermined timing. The switch controlling circuit generates and outputs the switch controlling signal in synchronization with the data output from the input/output controlling circuit reaching the predetermined level. The switching circuit is turned on by the switch controlling signal and transmits the data to the sense amplifier through a transmission path. The sense amplifier amplifies the transmitted data and writes the data in the memory cell.

The write controlling signal is generated by using the delay element above. Therefore, the deviation between the timings of the write controlling signal and the switch controlling signal is substantially constant at all times. The deviation is not easily affected by fluctuations occurring in a manufacturing process, an operation voltage, or ambient temperature.

Therefore, it is possible to carry out a timing design to minimize the deviation between the timings of the switch controlling signal and the read controlling signal or the write controlling signal. As a result, a high-speed operation can be performed. When the high-speed operation is not pursued, it is possible to increase timing margins of other circuits so that the yield improves.

In another aspect of the semiconductor integrated circuit in the present invention, a plurality of the sense amplifiers are respectively connected to a plurality of the input/output controlling circuits through a plurality of the switching circuits. The switch controlling circuit generates a plurality of the switch controlling signals corresponding to the switching circuits.

The delay element of a timing controlling circuit is formed in accordance with an average of activation timings of the switch controlling signals. Therefore, the deviations between the timings of the switch controlling signals and read controlling signals or write controlling signals are different. However, the timing controlling circuit generates the read or write controlling signals by using the delay element. Therefore, the deviations between the timings of the switch controlling signals and the read or write controlling signals are within a predetermined range at all times. As a result, timing design can be easily carried out.

In another aspect of the semiconductor integrated circuit in the present invention, the characteristic of the timing controlling circuit is identical or equivalent to that of a circuit existing in a signal path. Therefore, the deviation between the timings of the read or write controlling signal and the switch controlling signal does not greatly fluctuate due to operation environments and a manufacturing condition of the chip. In other words, the timing deviation becomes substantially constant. Especially, the difference between the deviations becomes small during a low-voltage operation. As a result, timing design under the consideration of the low-voltage operation can be easily carried out so that a high-speed operation can be performed, compared with the prior art.

In another aspect of the semiconductor integrated circuit in the present invention, a delay time of a signal propagating through wiring of the timing controlling circuit is set equal to that of a signal propagating through wiring existing in a signal path. Therefore, the deviation between the timing of the read or write controlling signal and the switch controlling signal does not fluctuate greatly due to operation environments and a manufacturing condition of the chip.

In another aspect of the semiconductor integrated circuit in the present invention, the read controlling signal generated by the timing controlling circuit is always activated behind the switch controlling signal. It prevents the read controlling circuit from receiving wrong data, which have yet been amplified by the sense amplifier. Therefore, the read controlling circuit reliably receives only proper amplified data.

In another aspect of the semiconductor integrated circuit in the present invention, the deviations between the timing of switch controlling signals and the read or write controlling signals are different. However, the timing controlling circuit generates the read or write controlling signal by using the delay element in synchronization with the switch controlling signal which is activated the latest among the switch controlling signals. Therefore, the deviations between the timings of switch controlling signals and the read or write controlling signals are always within a predetermined range. AS a result, timing design can be easily carried out.

In another aspect of the semiconductor integrated circuit in the present invention, a plurality of the read or write controlling signals described above are generated so that the deviations between the timings of the switch controlling signals and the read or write controlling signals become small. Consequently, the timing design to minimize the deviation between the switch controlling signal and the read or write controlling signal can be carried out. As a result, a high-speed operation can be performed.

In another aspect of the semiconductor integrated circuit in the present invention, an activation period of a write controlling signal includes that of a switch controlling signal. A write controlling circuit receives the write controlling signal during a write operation and outputs data to be written to a memory cell. Thereafter, the switch controlling signal is activated. A switching circuit is turned on in response to the switch controlling signal and transmits the determined data (correct data to be written) output from the write controlling circuit to a sense amplifier through a transmission path. The sense amplifier amplifies the data transmitted thereto and writes the data in the memory cell. During activation of the switch controlling signal, the write controlling signal is active. Therefore, the data are written to the memory cell by using not only amplifying power of the sense amplifier but also drivability of the write controlling circuit. As a result, data can be written to the memory cell with a sufficient write voltage even when a write cycle is short. In other words, a write operation can be performed at high-speed level.

In another aspect of the semiconductor integrated circuit in the present invention, an end of an activation period of the write controlling signal WAEZ is determined by a first write controlling signal, which is generated by using a delay element. Therefore, a deviation between the end timing of the activation period of the write controlling signal WAEZ and that of the activation period of the switch controlling signal does not fluctuate greatly due to an operation environment and a manufacturing condition of the chip. A start of an activation period of the write controlling signal is determined by a second write controlling signal, which is generated by using a delay element. Therefore, a deviation between the start timing of the activation period of the write controlling signal and that of the activation period of the switch controlling signal does not fluctuate greatly due to the operation environment and the manufacturing condition of the chip. As a result, in a write operation, data output from the write controlling circuit is reliably amplified by the sense amplifier and written to the memory cell.

In another aspect of the semiconductor integrated circuit in the present invention, hazards are prevented in the write controlling signal, by using OR logic of the first write controlling signal and the second write controlling signal.

In another aspect of the semiconductor integrated circuit in the present invention, a timing modifying circuit modifies an operation timing of an internal circuit in a testing mode. The operation timing is modified in response to whether said semiconductor integrated circuit is in a normal operation mode or in the testing mode. Therefore, a timing design of the internal circuit in the normal operation mode can be separately carried out from that of the internal circuit in the testing mode. As a result, data can be read/written at an optimal timing since the operation timing of the internal circuit in the normal operation mode does not depend on the timing thereof in the testing mode.

In another aspect of the semiconductor integrated circuit in the present invention, a load of an internal data bus is increased in the testing mode so that a waveform of the internal data signal becomes gentle. By changing the operation timing of the internal circuit by the timing modifying circuit, an operation test can be performed at an optimal timing in accordance with the gentle waveform due to the increase in the load. The timing modifying circuit modifies the operation timing of the internal circuit to an optimal timing in accordance with a decrease in the load of the internal data bus in the normal operation mode.

In another aspect of the semiconductor integrated circuit in the present invention, the timing modifying circuit lengthens an activation period of a signal which controls the internal circuit in the testing mode when the load of the internal data bus increases. The internal circuit always operates at an optimal timing in the testing mode and the normal operation mode. By lengthening the activation period of the controlling signal in the testing mode, for example, a failure due to a physical defect independent on the operation timing is easily detected. Therefore, when the semiconductor integrated circuit comprises a defect relieving circuit, a circuit having a failure can be relieved based on a result of the detecting test above.

In another aspect of the semiconductor integrated circuit in the present invention, a switch controlling circuit generates a switch controlling signal at a predetermined timing, and outputs the signal to a switching circuit. A timing controlling circuit generates at least one of a read controlling signal and a write controlling signal at a predetermined timing and outputs it to an input/output controlling circuit. At this time, an activation period of at least any one of the switch controlling signal, the read controlling signal and the write controlling signal can be modified by the activation period modifying circuit.

In a read operation, data are read from a memory cell and amplified by a sense amplifier. The switching controlling circuit activates the switch controlling signal in accordance with the data amplified to a predetermined level. The switching circuit is turned on by the switch controlling signal and transmits the data to a read controlling circuit in the input/output controlling circuit through a transmission path. The timing controlling circuit generates and outputs the read controlling signal whose timing is delayed from that of the switch controlling signal by a predetermined amount of time. The read controlling circuit receives the read controlling signal and receives the data transmitted thereto at a predetermined timing.

By modifying the activation period of at least one of either the switch controlling signal or the read controlling signal to perform the read operation, the activation periods of these controlling signals, which are not measurable directly from the exterior, can be indirectly evaluated and an optimal activation timing of each controlling signal can be determined.

In a write operation, the timing controlling circuit generates and outputs a write controlling signal at an earlier timing than that of the switch controlling signal by a predetermined amount of time. A write controlling circuit in the input/output controlling circuit receives the write controlling signal and outputs data to be written to the memory cell at a predetermined timing. The switch controlling circuit generates and outputs the switch controlling signal in accordance with the data output from the input/output controlling circuit reaching a predetermined level. The switching circuit is turned on in response to the switch controlling signal and transmits the data to the sense amplifier through a transmission path. The sense amplifier amplifies the transmitted data and writes the data in the memory cell.

By modifying the timing of at least one of either the switch controlling signal or the write controlling signal to perform the write operation, the activation periods of these controlling signals which are not measurable directly from the exterior can be indirectly evaluated and an optimal activation timing of each controlling signal can be determined.

By changing a photomask or a manufacturing process based on the evaluation result, the characteristic and the yield of the chip improve.

In another aspect of the semiconductor integrated circuit in the present invention, an activation period of at least any one of the switch controlling signal, the read controlling signal, and the write controlling signal is indirectly evaluated and an optimal activation period of each controlling signal is then determined. Thereafter, a predetermined fuse is blown to set the activation periods of each controlling signal to the optimal value. Therefore, without changing a photomask and a condition of manufacturing process, a chip can be manufactured to operate at an optimal timing. Furthermore, since the activation period of each controlling signal can be modified for each chip, it is possible to suppress a variance in a chip characteristic dependent on either a position of the chip in a wafer, a position of a wafer in a manufacturing lot, or a manufacturing lot.

In another aspect of the semiconductor integrated circuit in the present invention, by modifying an activation timing of at least any one of the switch controlling signal, the read controlling signal, and the write controlling signal to perform a read or write operation, the activation periods of these controlling signals which are not measurable directly from the exterior can be indirectly evaluated and an optimal activation timing of each controlling signal can be determined. By modifying a photomask or a condition of manufacturing process based on the evaluation result, the characteristic and the yield of the chip improve.

In another aspect of the semiconductor integrated circuit in the present invention, an activation timing of at least any one of the switch controlling signal, the read controlling signal, and the write controlling signal is indirectly evaluated and an optimal activation timing of each controlling signal is determined. Thereafter, a predetermined fuse is blown to set the activation timing of each controlling signal to the optimal value. Therefore, the chip can be manufactured to operate at the optimal timing without changing the photomask and the condition of manufacturing process. Furthermore, since the activation timing of each controlling signals can be modified for each chip, it is possible to suppress a variance in a chip characteristic dependent on either a position of the chip in a wafer, a position of a wafer in a manufacturing lot, and the manufacturing lot.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be explained in detail with reference to the accompanying drawings.

Figure 18:
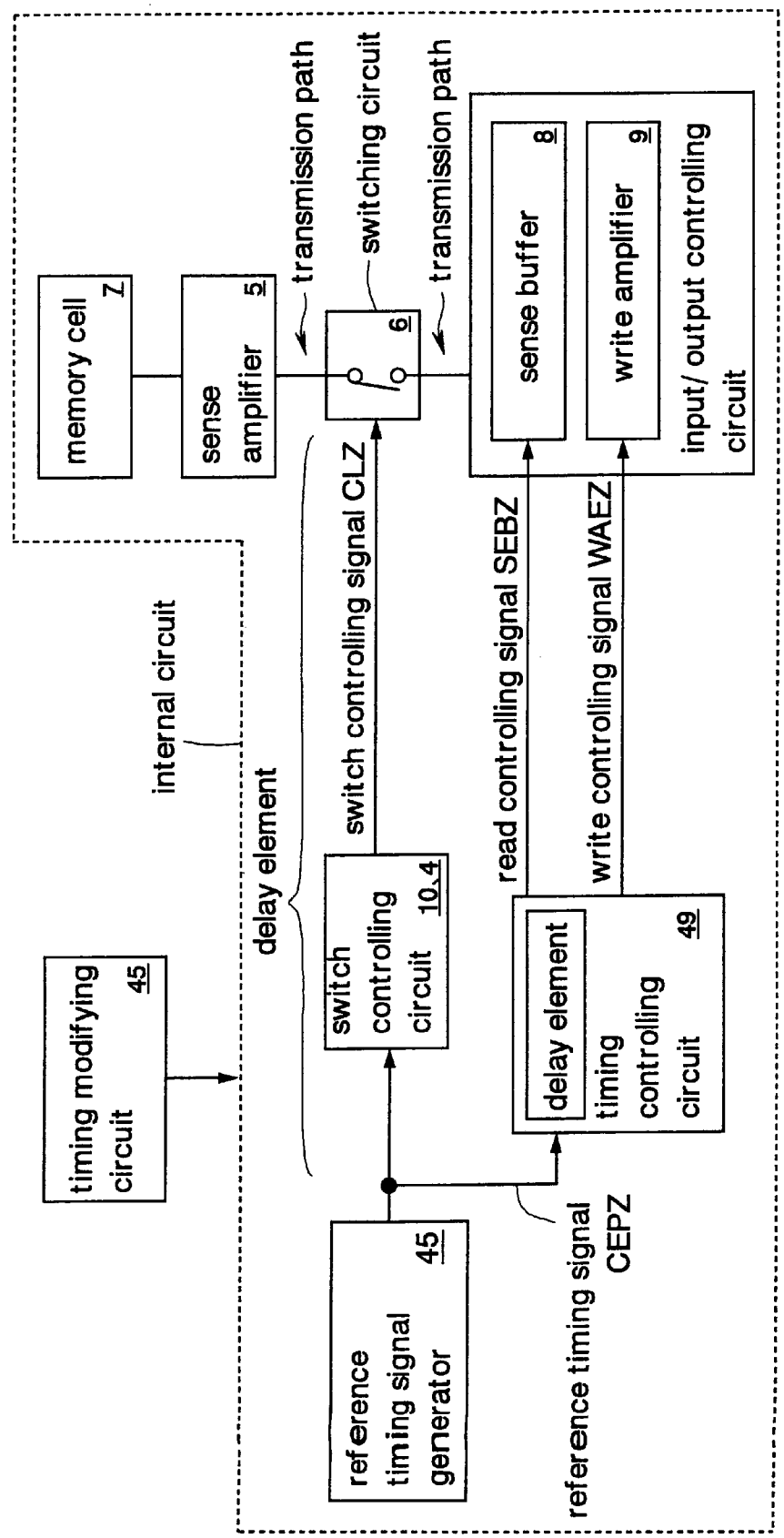
FIG. 18 is a block diagram showing a basic principle of the present invention according to the first embodiment.

FIG. 18 is a block diagram showing a basic principle of the first embodiment of the present invention.

In a semiconductor integrated circuit shown in FIG. 18, a reference timing signal generator 45 generates a reference timing signal CEPZ necessary for read and write operations. The reference timing signal CEPZ generated by the generator is supplied to switching circuits 10 and 4 and to a timing controlling circuit 49.

Figure 19:
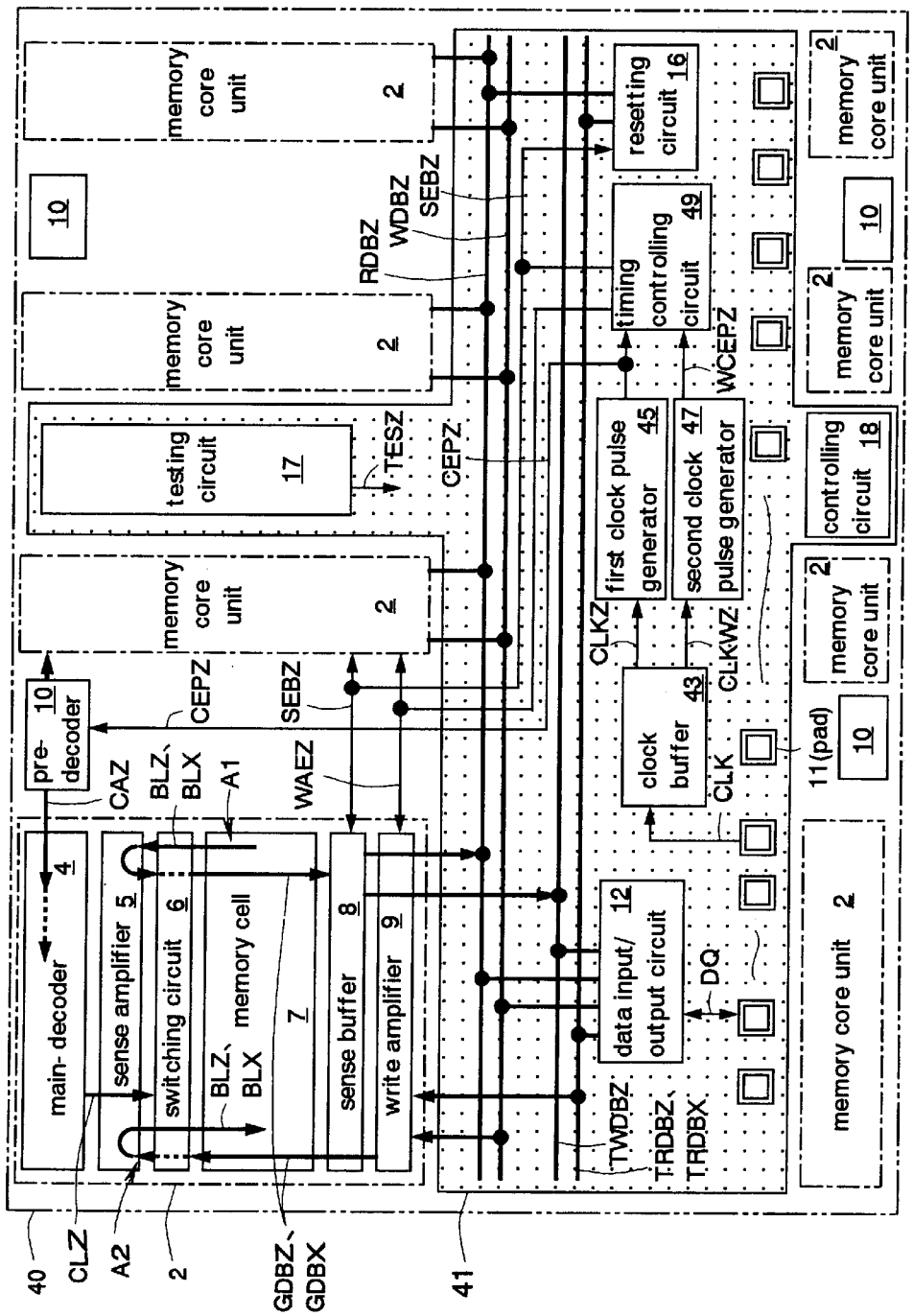
FIG. 19 is a diagram of the whole configuration of a chip showing the first embodiment of the present invention.

FIG. 19 shows the first embodiment of the semiconductor integrated circuit.

The semiconductor integrated circuit according to this embodiment is formed as an SDRAM 40 on a silicon substrate by using a CMOS processing technology. FIG. 19 shows internal circuits related to data input/output in accordance with a column address.

For circuits the same as in the description of the related art, the same reference codes are used, and detailed explanation thereof will be omitted. Moreover, signals the same as in the description of the related art have the same reference codes.

The SDRAM 40 comprises four pairs of memory core units 2 each laid out in mirror symmetry. A peripheral circuit 41 is arranged in a cross-like shape at the center of the SDRAM 40 along the horizontal and vertical directions thereof (a stippled portion of FIG. 19).

Each of the memory core units 2 has a plurality of main-decoders 4, sense amplifiers 5, switching circuits 6, memory cells 7, sense buffers 8, and write amplifiers 9. The sense buffer 8 and the write amplifier 9 comprise an input/output controlling circuit. The main-decoder 4 corresponds to a switch controlling circuit, and the sense buffer 8 and the write amplifier 9 correspond to a read controlling circuit and a write controlling circuit respectively. A pre-decoder 10 is arranged between two memory core units 2 laid out in mirror symmetry, and corresponds to a switch controlling circuit.

The peripheral circuit 41 has pads 11 along the horizontal direction of FIG. 19, for supplying and receiving a signal to and from the exterior. wirings of a read data signal RDBZ, a write data signal WDBZ, testing read data signals TRDBZ and TRDBX, and a testing write data signal TWDBZ is arranged within the peripheral circuit 41 along the horizontal directions of the chip. The read data signal RDBZ, the write data signal WDBZ, the testing read data signal TRDBZ and TRDBX, and the testing write data signal TWDBZ correspond to internal data signals. The peripheral circuit 41 comprises a data input/output circuit 12, a clock buffer 43, a first clock pulse generator 45, a second clock pulse generator 47, a timing controlling circuit 49, a resetting circuit 16, a testing circuit 17, a controlling circuit 18 or the like. The first clock pulse generator 45 corresponds to the reference timing signal generator and a timing modifying circuit, and the second clock pulse generator 47 corresponds to a timing modifying circuit.

The clock buffer 43 receives a clock signal CLK from the exterior through the pad 11 and outputs internal clock signals CLKZ and CLKWZ. The first clock pulse generator 45 receives the internal clock signal CLKZ and outputs the clock pulse signal CEPZ. The clock pulse signal CEPZ corresponds to the reference timing signal. The second clock pulse generator 47 receives the internal clock signal CLKWZ and outputs a clock pulse signal WCEPZ. The timing controlling circuit 49 receives the clock pulse signals CEPZ and WCEPZ, and outputs a read controlling signal SEBZ and a write controlling signal WAEZ. The resetting circuit 16 receives the read controlling signal SEBZ, the read data signal RDBZ, and the testing read data signals TRDBZ and TRDBX. The data input/output circuit 12 receives the read data signal RDBZ, the write data signal WDBZ, the testing read data signals TRDBZ and TRDBX, and the testing write data signal TWDBZ, and receives data signal DQ through the pad 11. The testing circuit 17 outputs a testing signal TESZ. The testing signal TESZ is supplied to the data input/output circuit 12, the first and second clock pulse generators 45 and 47, the resetting circuit 16, the sense buffer 8, and to the write amplifier 9, which is not shown in FIG. 19.

The pre-decoder 10 receives the clock pulse signal CEPZ and a row address signal which is not shown, and outputs a column decoding signal CAZ to the main-decoder 4.

The main-decoder 4 receives the column decoding signal CAZ and outputs a column selecting signal CLZ. The column selecting signal CLZ corresponds to a switch controlling signal. The sense amplifier 5 receives bit line signals BLZ and BLX. The bit line signals BLZ and BLX are complementary signals.

The memory cell 7 receives the bit line signals BLZ and BLX. The switching circuit 6 receives the column selecting signal CLZ, the bit line signals BLZ and BLX, and internal data signals GDBZ and GDBX. The sense buffer 8 receives the internal data signals GDBZ and GDBX, and outputs the read data signal RDBZ and the testing read data signals TRDBZ and TRDBX. The write amplifier 9 receives the write data signal WDBZ and the testing write data signal TWDBZ, and outputs the internal data signals GDBZ and GDBX.

A J-shaped arrow A1 shown in the memory core unit 2 in FIG. 19 means that data read from the memory cell 7 are amplified by the sense amplifier 5 as the bit line signals BLZ and BLX, and supplied to the sense buffer 8 through the switching circuit 6. A J-shaped arrow A2 shown in FIG. 19 means that write data output from the write amplifier 9 through the switching circuit 6 are supplied to the sense amplifier 5 as the bit line signals BLZ and BLX and written to the memory cell 7.

Wiring of each of the signals described above is connected to each of the pre-decoders 4 and each of the memory cell units 2, which is not shown in FIG. 19.

The wiring and signal lines shown by thick lines in FIG. 19 are formed with a plurality of lines. For example, the read data signal RDBZ is formed with read data signals RDB0Z, RDB1Z, RDB2Z and RDB3Z, and the write data signal WDBZ is formed with write data signals WDB0Z, WDB1Z, WDB2Z, and WDB3Z.

The signals suffixed with "Z" mean signals of positive logic, and the signals suffixed with "X" are signals of negative logic.

Figure 20:
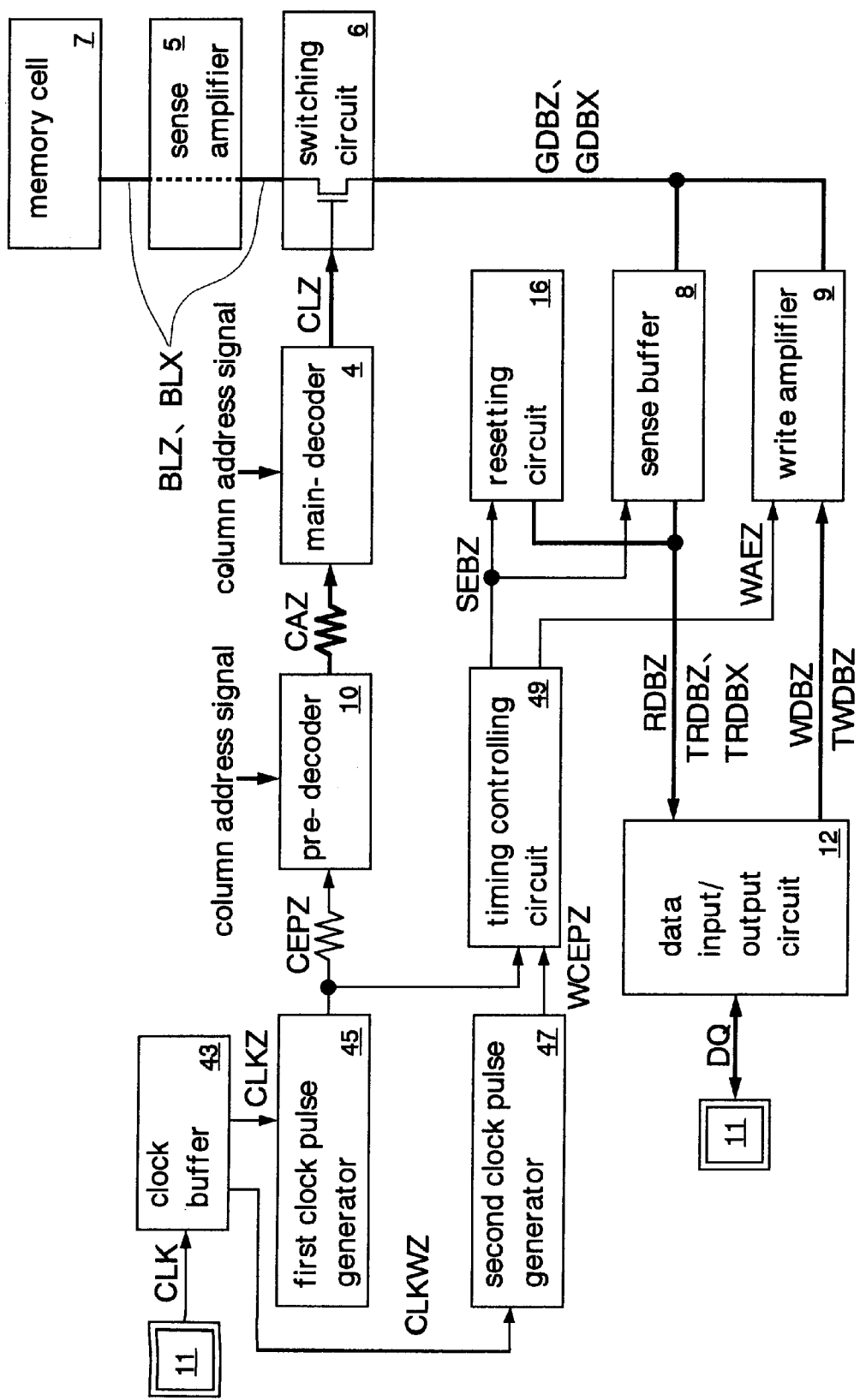
FIG. 20 is a block diagram showing main circuits and a flow of main signals which are related to the column address.

FIG. 20 shows main circuits and a flow of main signals which are related to a column address.

The switching circuit 6 is formed with an nMOS. The gate of the nMOS receives the column selecting signal CLZ and the source and drain thereof receive the bit line signals BLZ and BLX, and the internal data signals GDBZ and GDBX, respectively.

Figure 21:
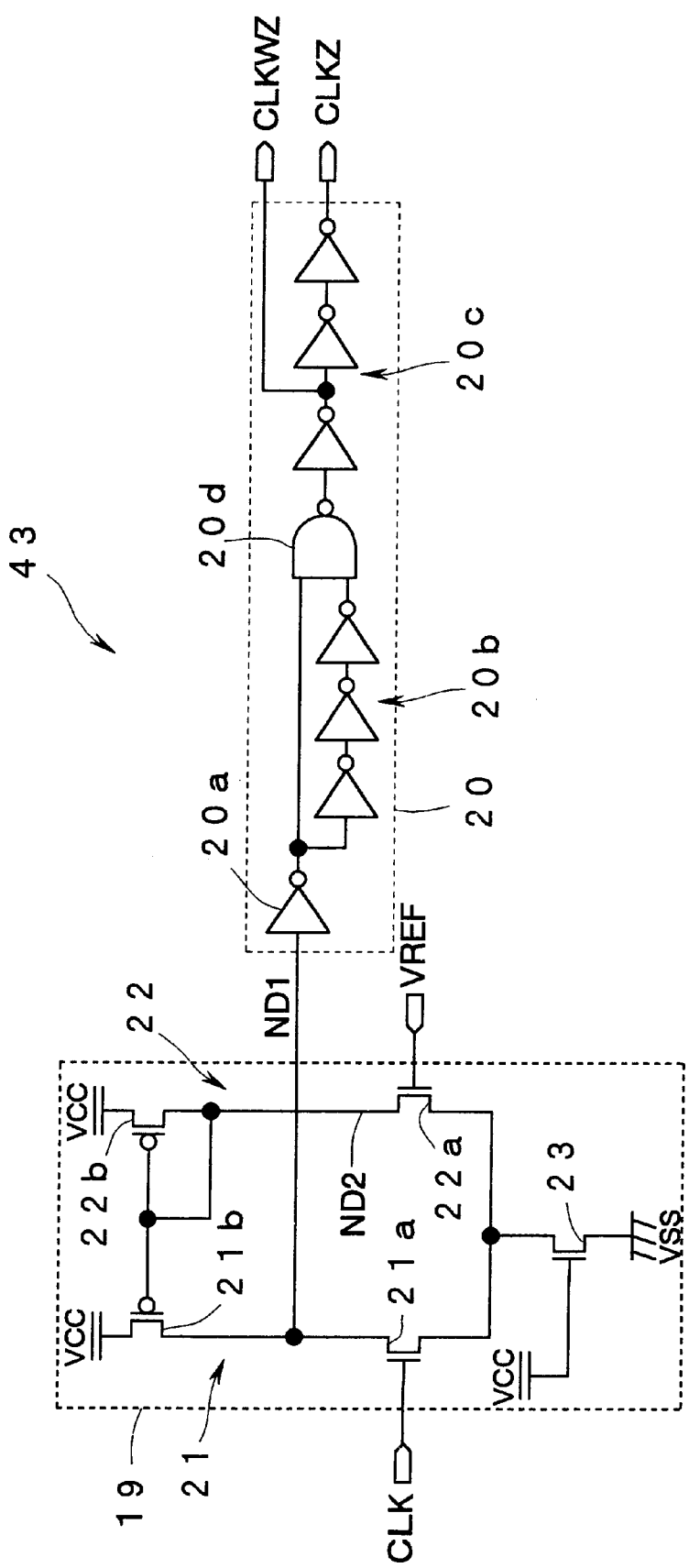
FIG. 21 a circuit diagram of the clock buffer of FIG. 20.

FIG. 21 shows the clock buffer 43 in detail.

The clock buffer 43 has a differential amplifier 19 for comparing the clock signal CLK input thereto from the exterior with a reference voltage VREF, and a pulse generator 20 comprising inverters and a NAND gate. The reference voltage VREF is set to a half of a supply voltage VCC (2.5V).

The pulse generator 20 outputs the internal clock signal CLKWZ from the first stage inverter of an inverter row 20*c*, and outputs the internal clock signal CLKZ from the output of the inverter row 20*c*. In other words, generation timing of the internal clock signal CLKWZ is earlier than the generation timing of the internal clock signal CLKZ by a difference corresponding to the two stage inverters.

Figure 22:
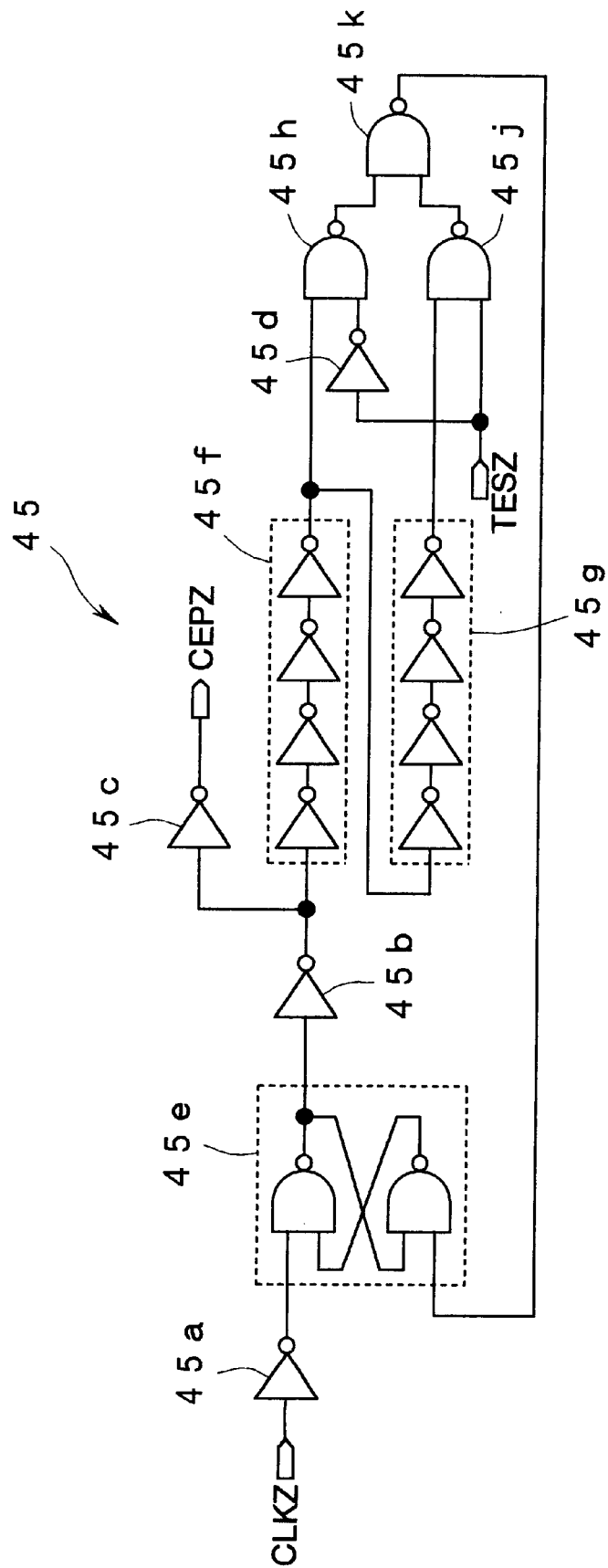
FIG. 22 a circuit diagram of the first clock pulse generator of FIG. 20.

FIG. 22 shows the first clock pulse generator 45 in detail.

The first clock pulse generator 45 comprises four inverters 45*a*, 45*b*, 45*c* and 45*d*, a flip-flop circuit 45*e* comprising two 2-input NAND gates, inverter rows 45*f* and 45*g* each comprising four inverters connected in cascade, and three 2-input NAND gates 45*h*, 45*j*, and 45*k*. The input of the inverter 45*a* receives the internal clock signal CLKZ. The output of the inverter 45*a* is connected to one of the inputs of the flip-flop circuit 45*e*. The output of the NAND gate of the flip-flop circuit 45*e* having the connection to the inverter 45*a* is connected to the input of the inverter 45*b*. The output of the inverter 45*b* is connected to the input of the inverter 45*c* and to the input of the inverter row 45*f*. The output of the inverter 45*c* outputs the clock pulse signal CEPZ. The output of the inverter row 45*f* is connected to the input of the inverter row 45*g* and to one of the inputs of the NAND gate 45*h*. The output of the inverter row 45*g* is connected to one of the inputs of the NAND gate 45*j*. The other input of the NAND gate 45*h* receives an inverted signal of the testing signal TESZ through the inverter 45*d*. The other input of the NAND gate 45*j* receives the testing signal TESZ. The outputs of the NAND gates 45*h* and 45*j* are connected to the inputs of the NAND gates 45*k* respectively. The output of the NAND gate 45k is supplied back to the other input of the flip-flop circuit 45e.

Figure 23:
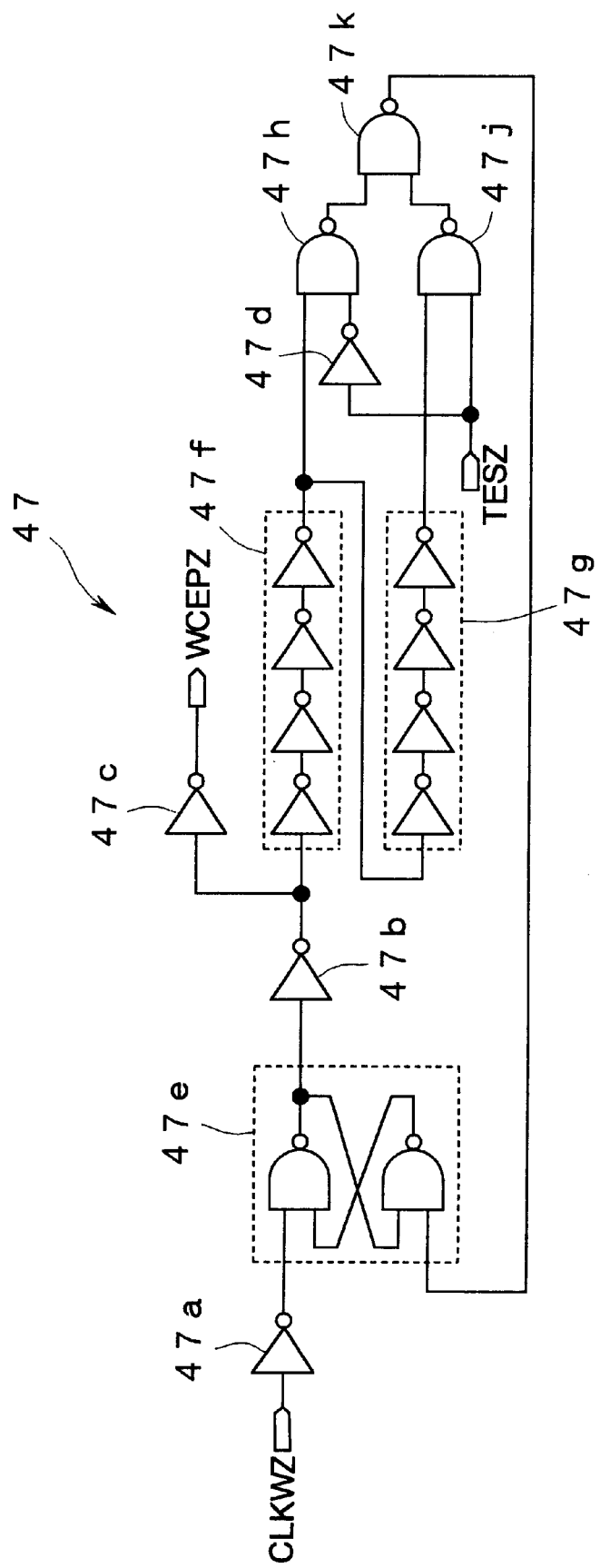
FIG. 23 a circuit diagram of the second clock pulse generator of FIG. 20.

FIG. 23 shows the second clock pulse generator 47 in detail.

The second clock pulse generator 47 is the same as the first clock pulse generator 45. The input of an inverter 47a receives the internal clock signal CLKWZ. The output of an inverter 47c outputs the clock pulse signal WCEPZ. The testing signal TESZ is supplied to an inverter 47d and to the other input of the NAND gate 47j.

Figure 24:
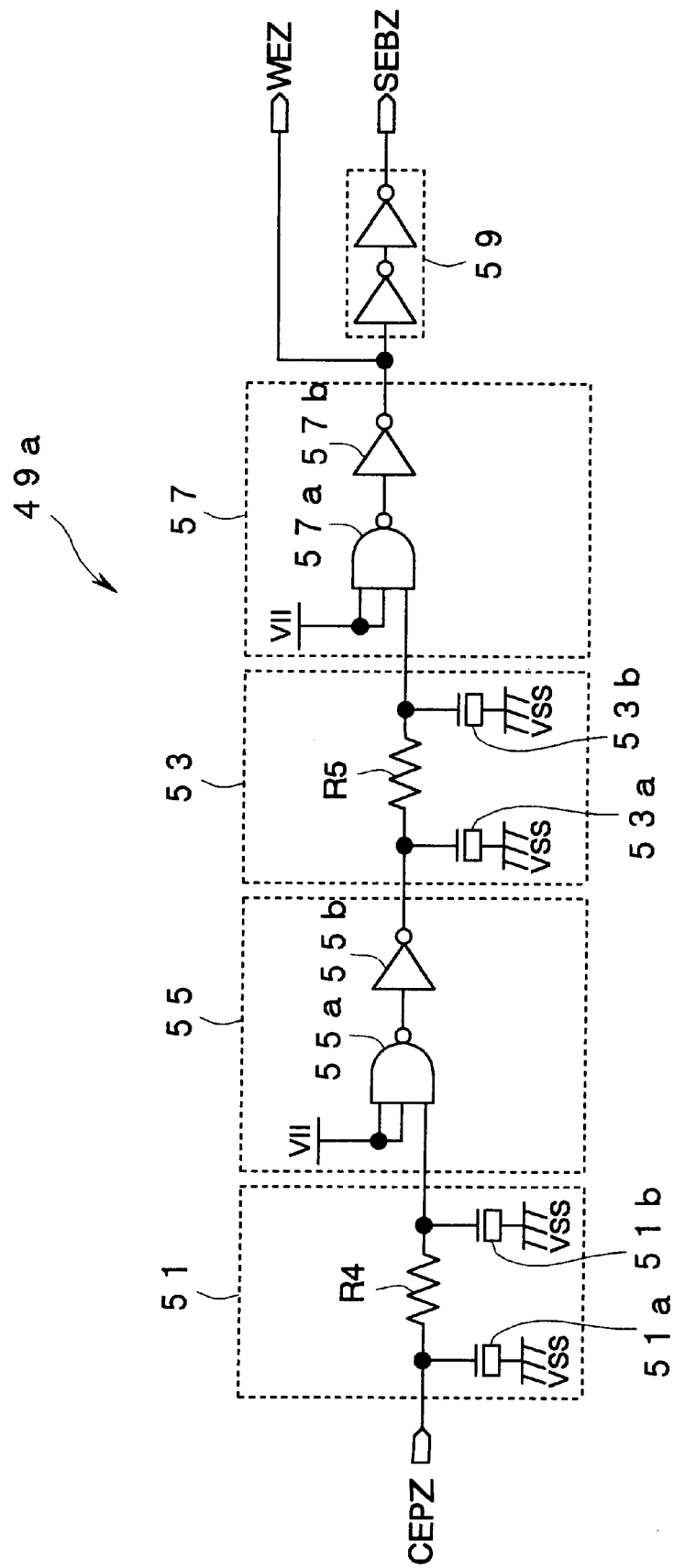
FIGS. 24 is a circuit diagram of the first timing controlling circuit(a) provided in the timing controlling circuit of FIG. 20.
Figure 25:
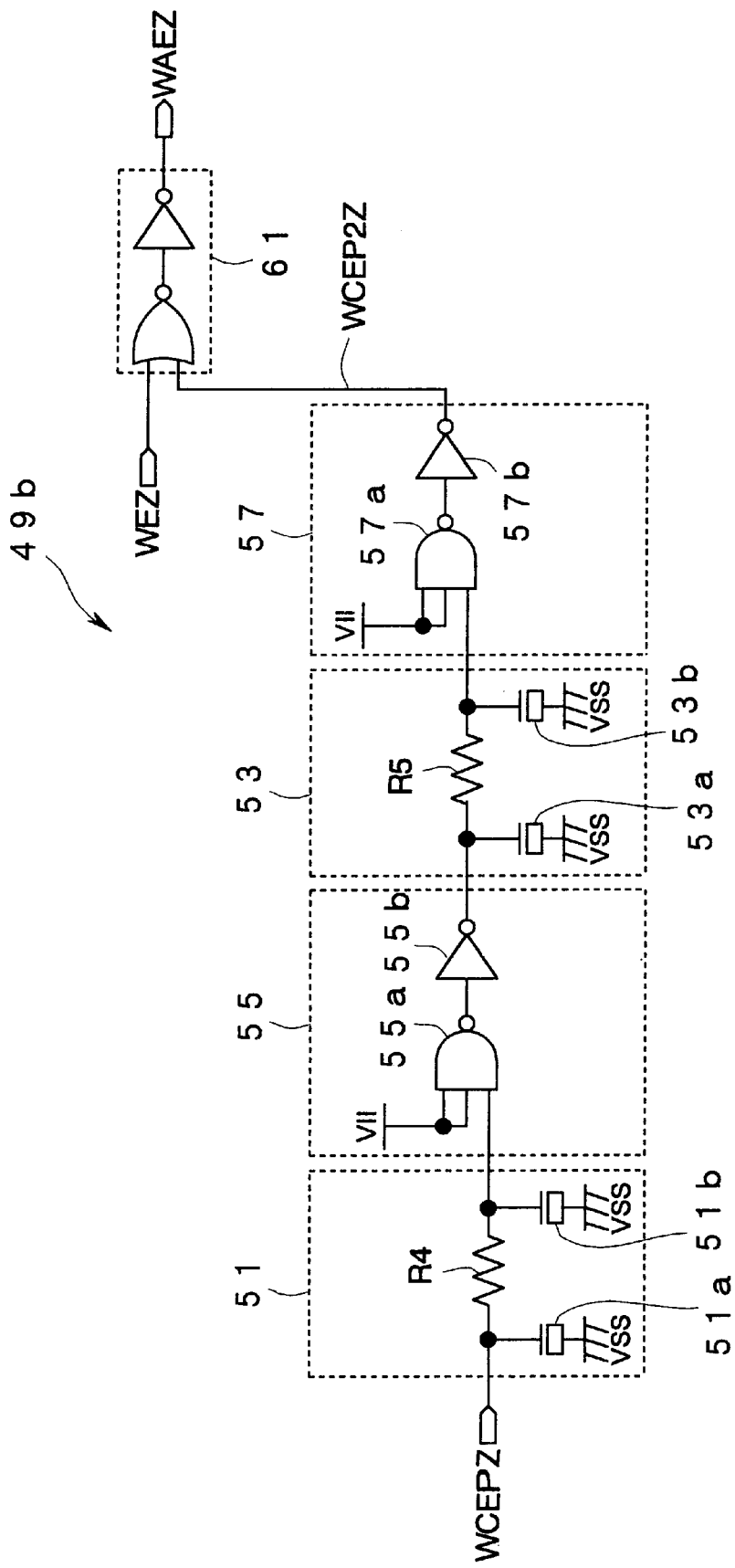
FIG. 25 is a circuit diagram of the second timing controlling circuit(a) provided in the timing controlling circuit of FIG. 20.

FIGS. 24 and 25 show the timing controlling circuit 49 in detail. The timing controlling circuit 49 is formed with a first timing controlling circuit 49a and a second timing controlling circuit 49b.

As shown in FIG. 24, the first timing controlling circuit 49a comprises a delay circuit 51, a logic circuit 55, a delay circuit 53, a logic circuit 57, and a delay gate 59 comprising two inverters. The delay circuit 51 is a delay element equivalent to a portion of a load of the wiring of the clock pulse signal CEPZ formed along the vertical direction of the memory core unit 2. The logic circuit 55 is the same as a decoder circuit 10a of the pre-decoder 10. The delay circuit 53 is a delay element equivalent to a wiring load of the column decoding signal CAZ. The logic circuit 57 is the same as a decoder circuit 4a in the main-decoder 4. The logic circuits 55 and 57 have the same characteristic as the decoder circuits 10a and 4a, even in the case of an operation at a low voltage. A propagation delay time of the column decoding signal CAZ output from the pre-decoder 10 shown in FIG. 20 becomes larger as the main-decoder 4 to which the column decoding signal CAZ is supplied is located father from the pre-decoder 10. The delay time of the delay circuit 53 in this embodiment is set to an average of propagation delay times of the column decoding signal CAZ.

The delay circuit 51 is formed with MOS capacitors 51a and 51b in each of which the source and the drain of an nMOS are connected to a ground line VSS, and a resistor R4 connecting the gates of the MOS capacitors 51a and 51b to each other. The delay circuit 53 is formed with MOS capacitors 53a and 53b in each of which the source and the drain of an nMOS are connected to the ground line VSS, and a resistor R5 connecting the gates of the MOS capacitors 53a and 53b to each other. The resistors R4 and R5 are formed with diffusion resistances or the like.

Figure 1:
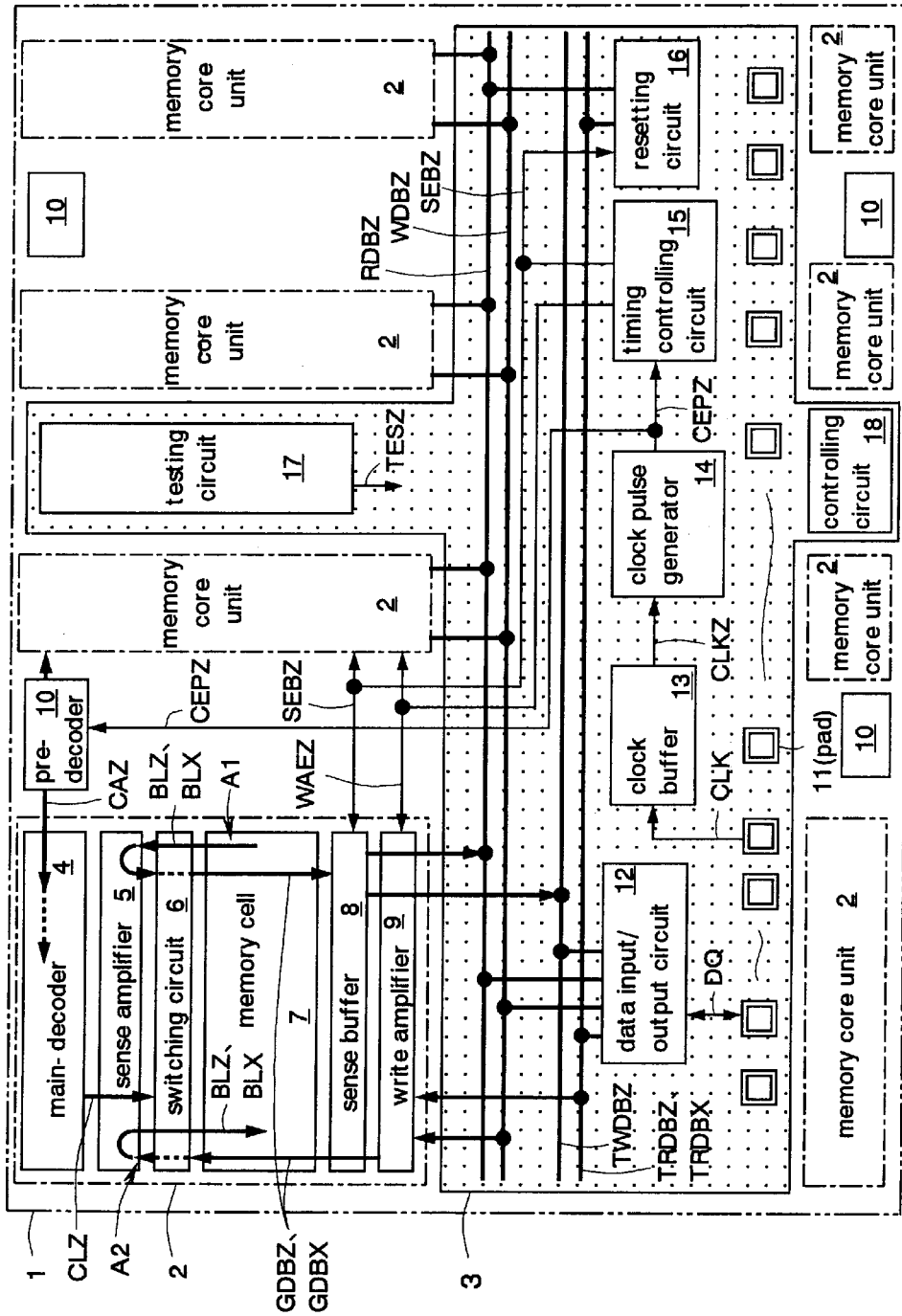
FIG. 1 is a diagram of the whole configuration of the prior art SDRAM.
Figure 2:
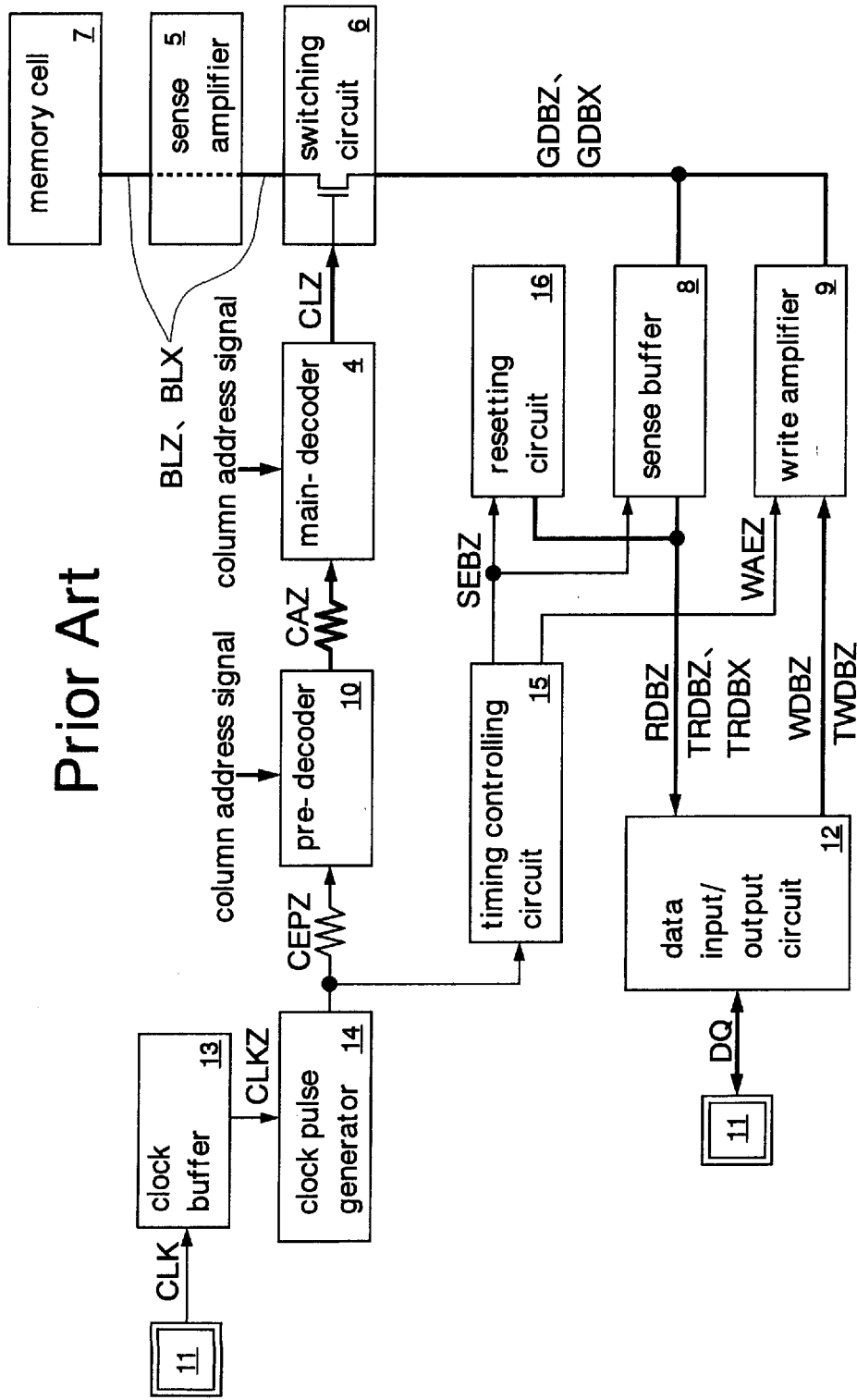
FIG. 2 is a block diagram showing a flow of main circuits and main signals according to the column address system in the prior art.
Figure 3:
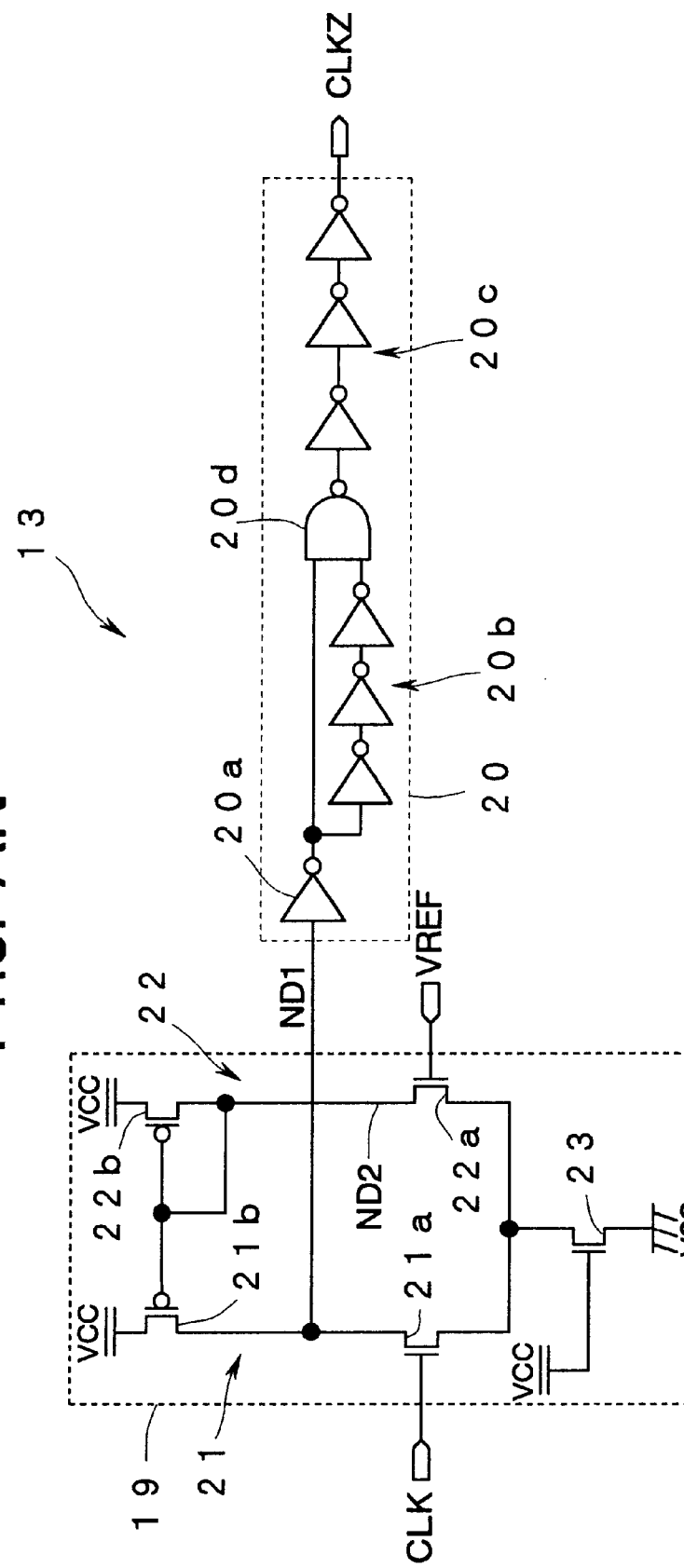
FIG. 3 is a circuit diagram of the clock buffer of FIG. 2.
Figure 4:
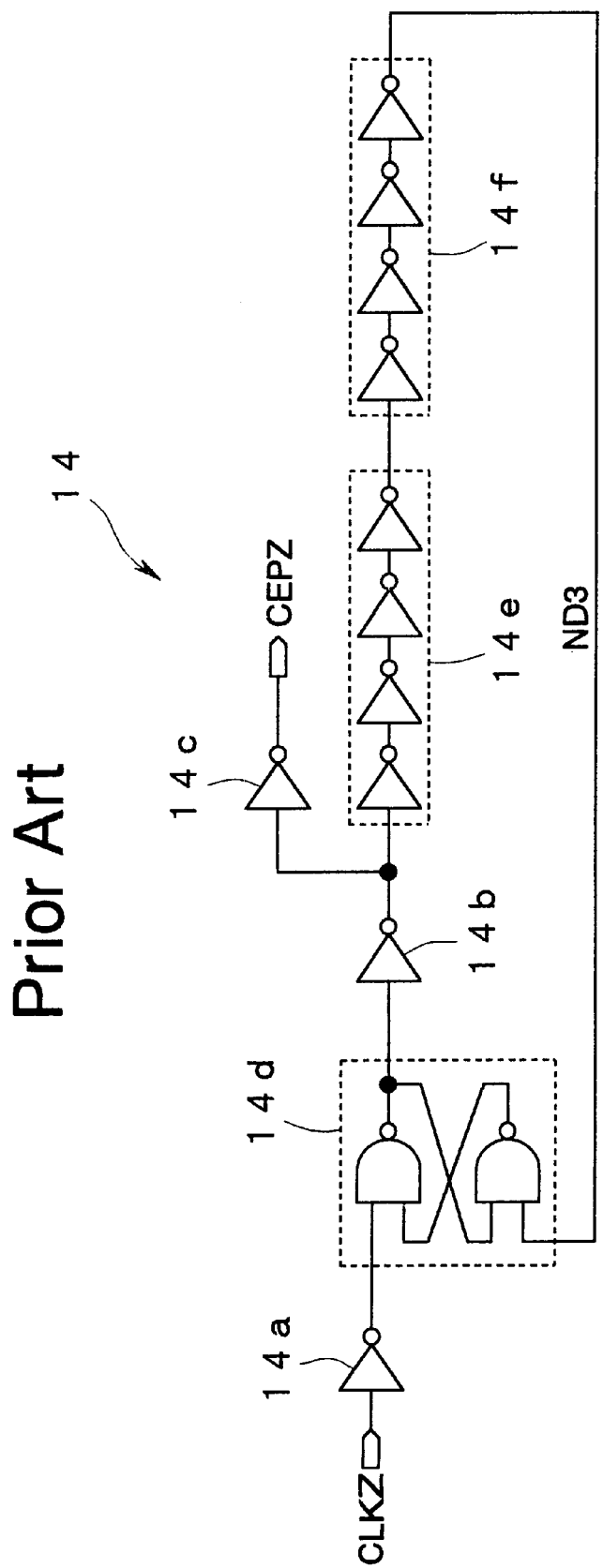
FIG. 4 is a circuit diagram of the clock pulse generator of FIG. 2.
Figure 5:
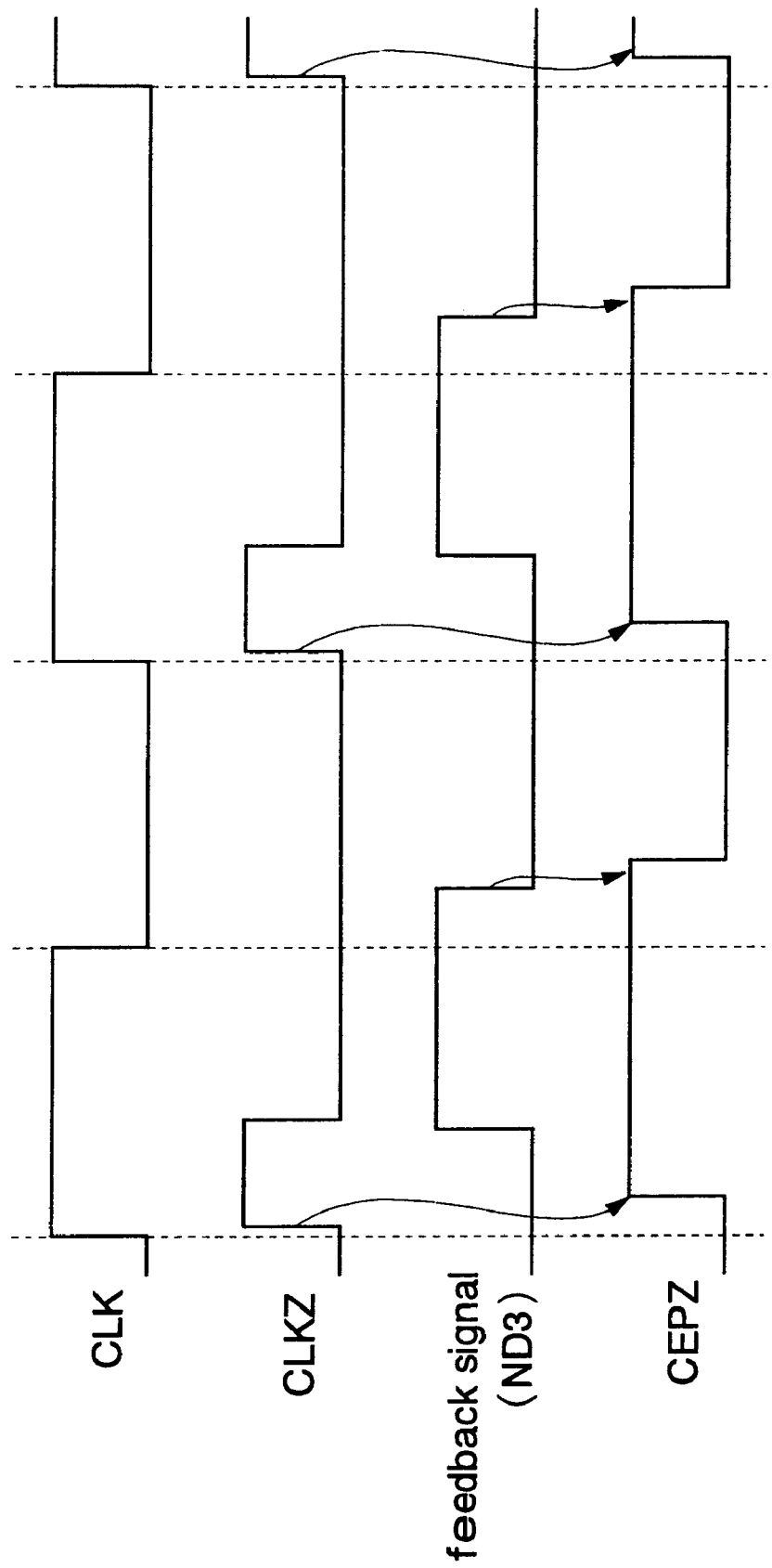
FIG. 5 is a timing chart of a clock pulse signal CEPZ in the prior art.
Figure 6:
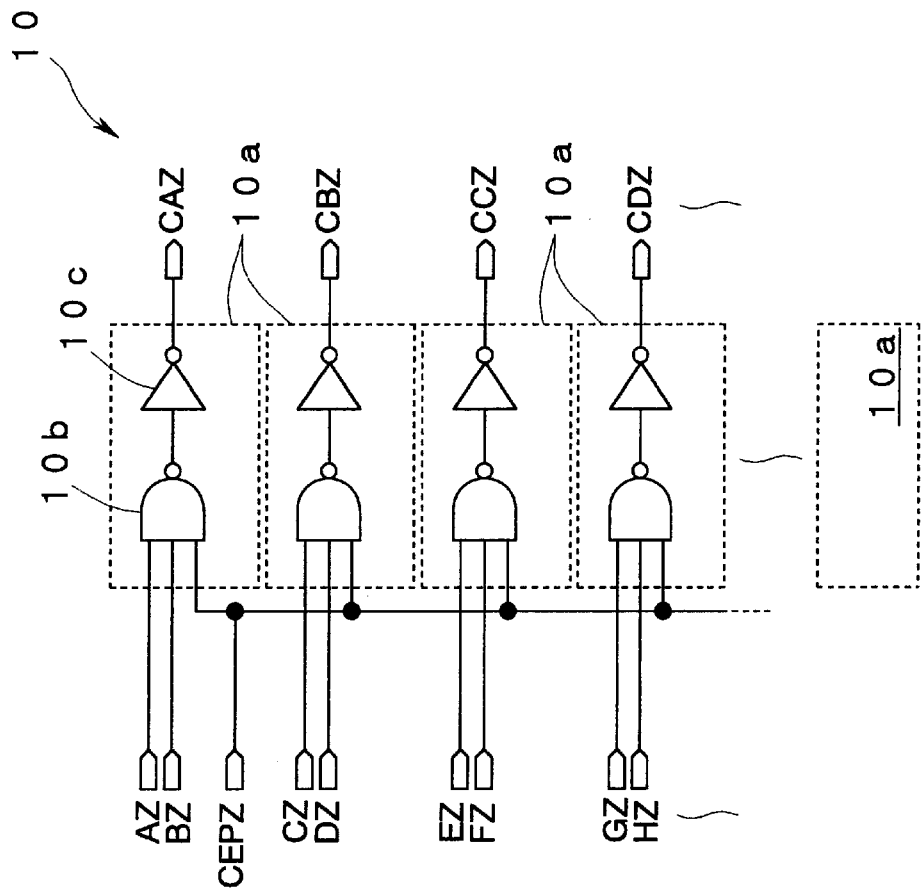
FIG. 6 is a circuit diagram of the pre-decoder of FIG. 2.
Figure 7:
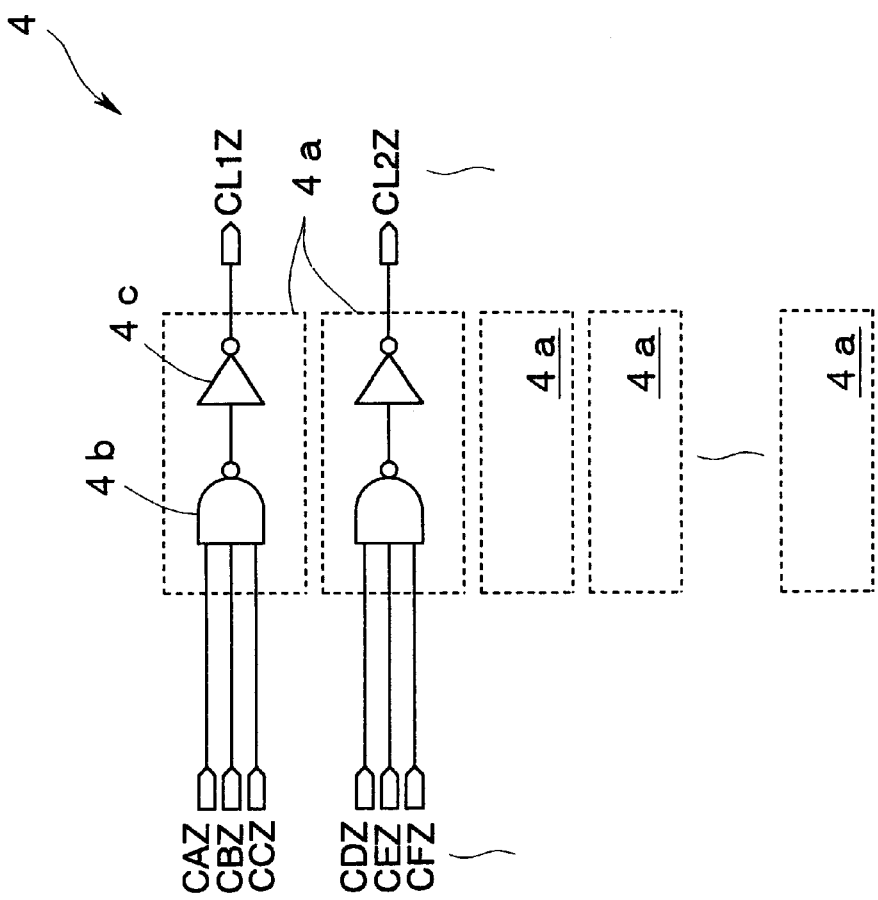
FIG. 7 is a circuit diagram of the main-decoder of FIG. 2.
Figure 8:
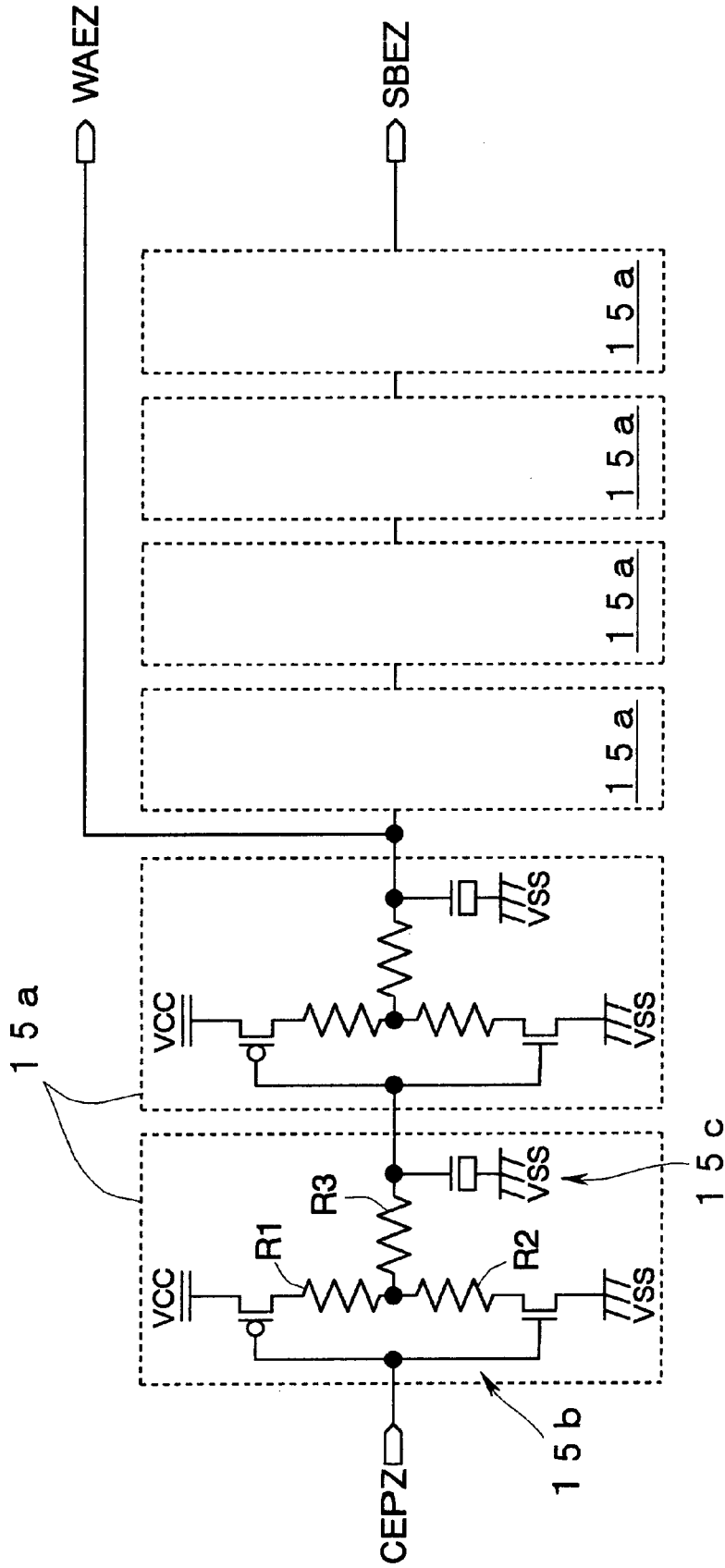
FIG. 8 is a circuit diagram of the timing controlling circuit of FIG. 2.
Figure 9:
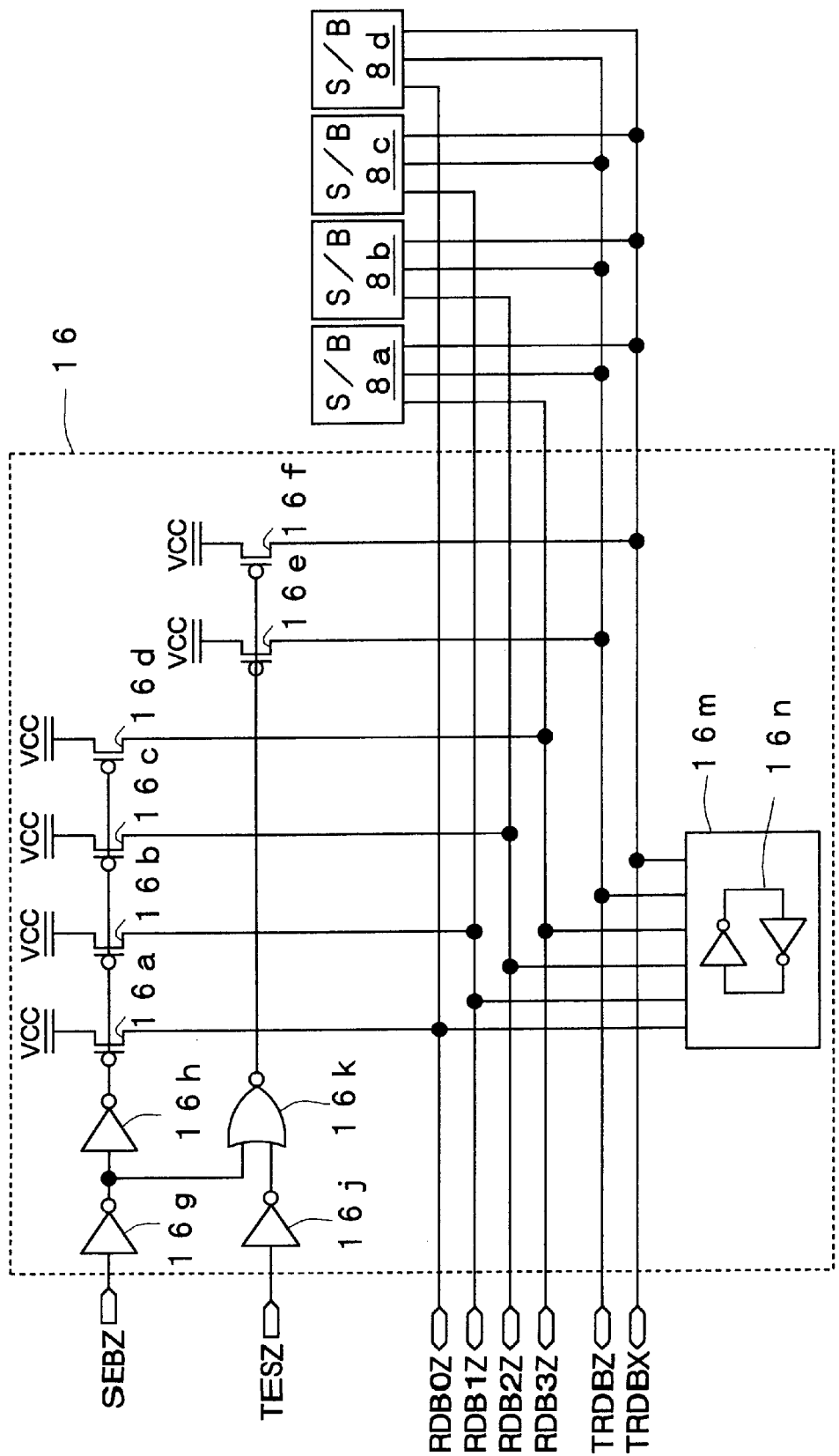
FIG. 9 is a circuit diagram of the resetting circuit and the peripheral circuits of FIG.2.
Figure 10:
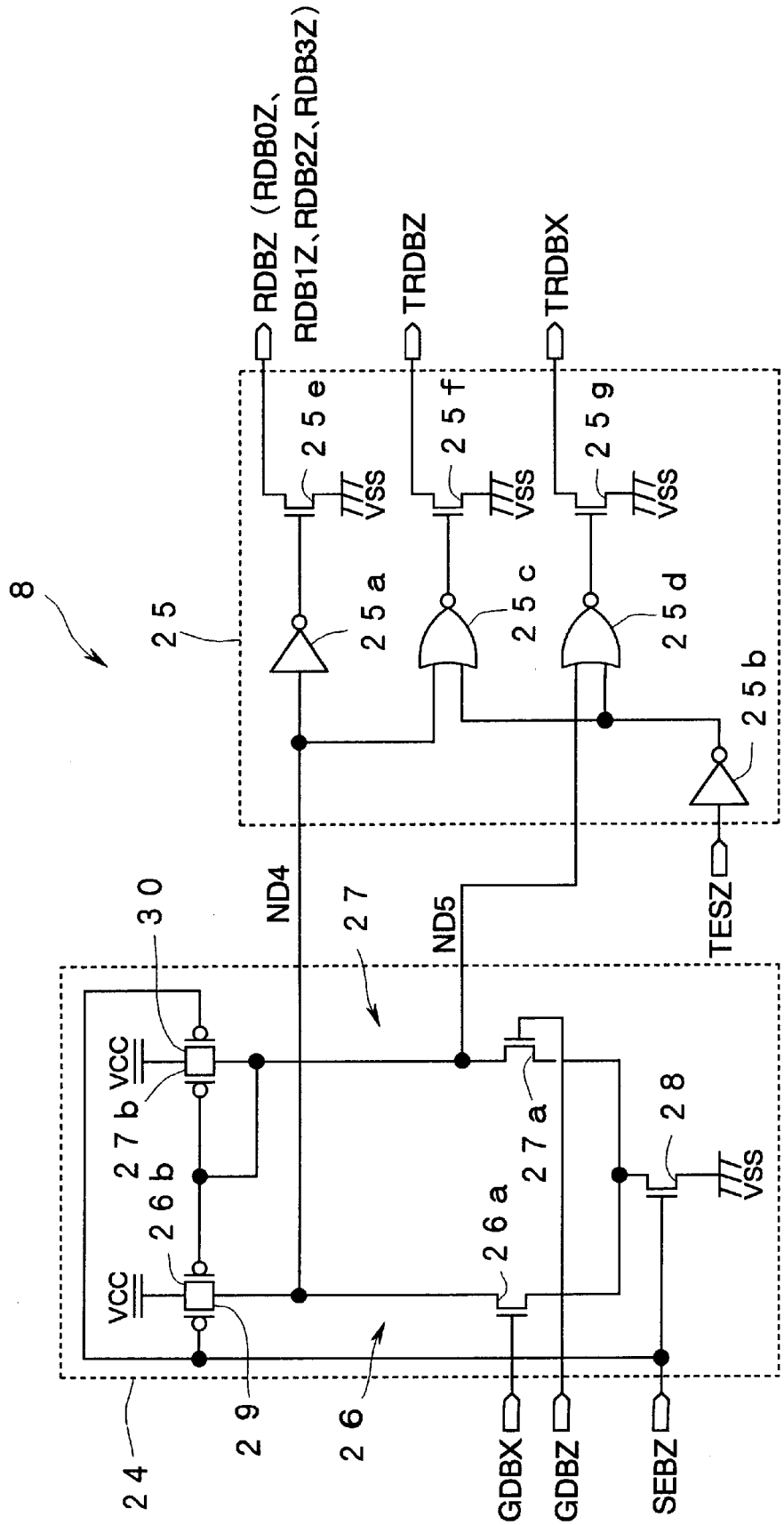
FIG. 10 is a circuit diagram of the sense buffer of FIG. 2.
Figure 11:
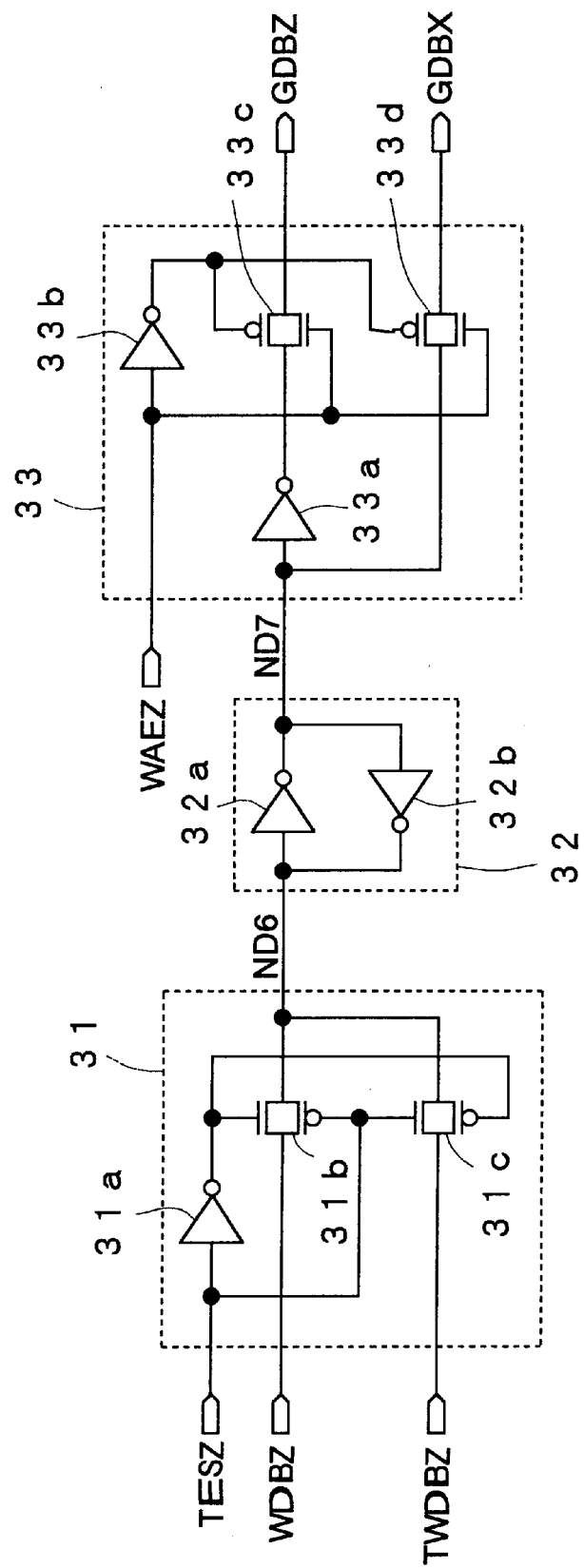
FIG. 11 is a circuit diagram of the write amplifier of FIG. 2.
Figure 12:
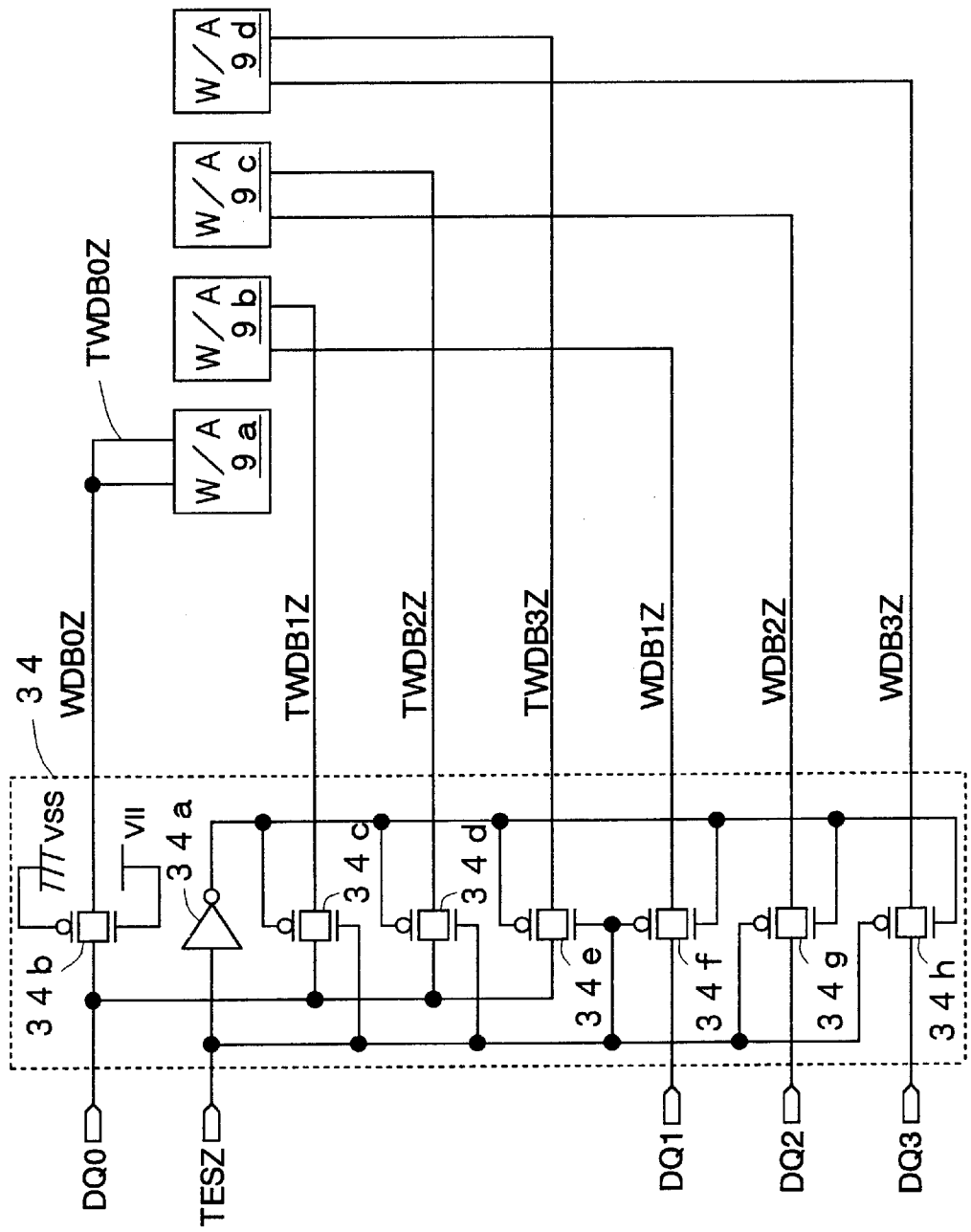
FIG. 12 is a circuit diagram of the data input circuit and the peripheral circuits of FIG. 2.
Figure 13:
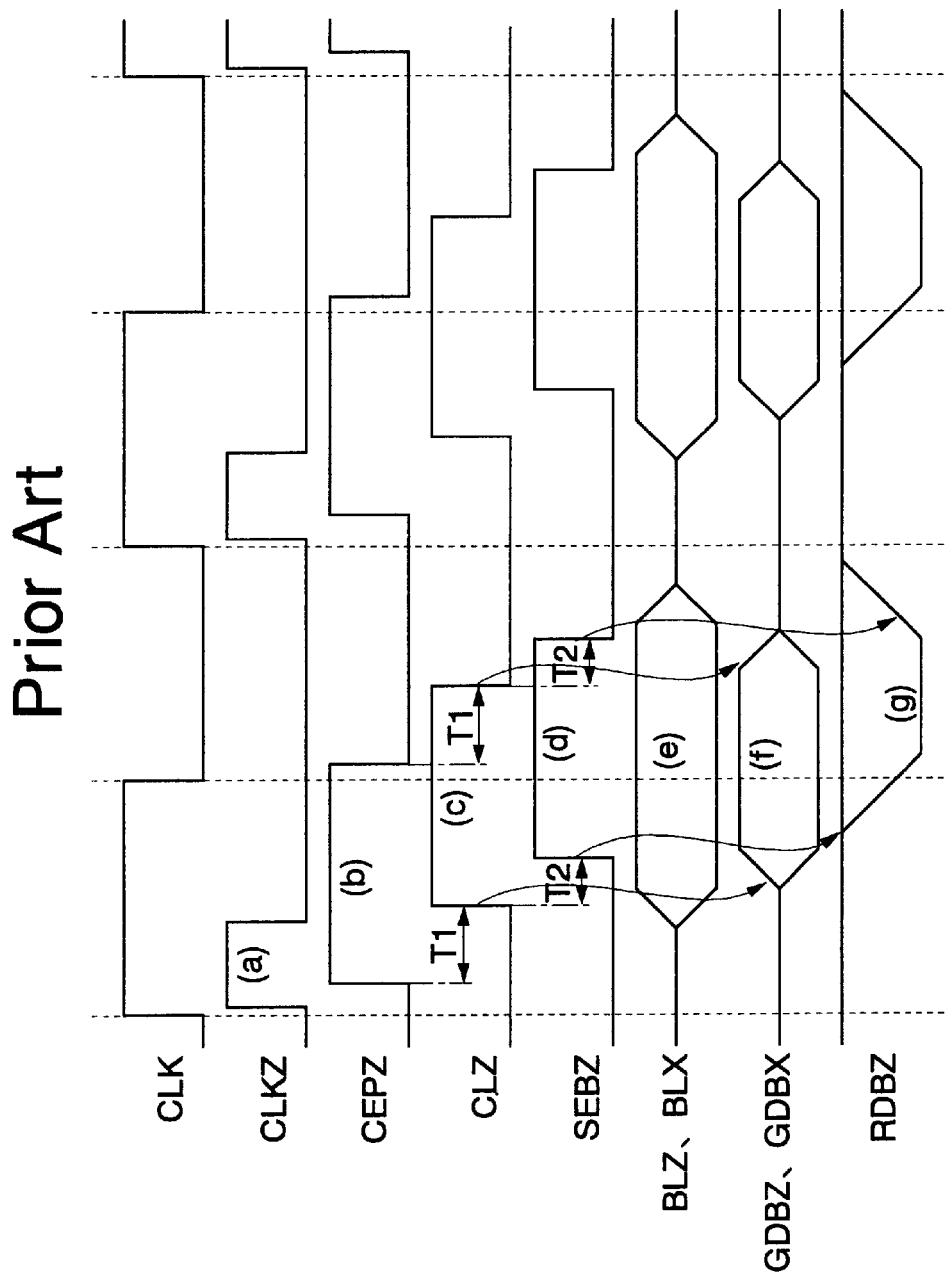
FIG. 13 is a timing chart of main signals in a read operation in the prior art SDRAM.
Figure 14:
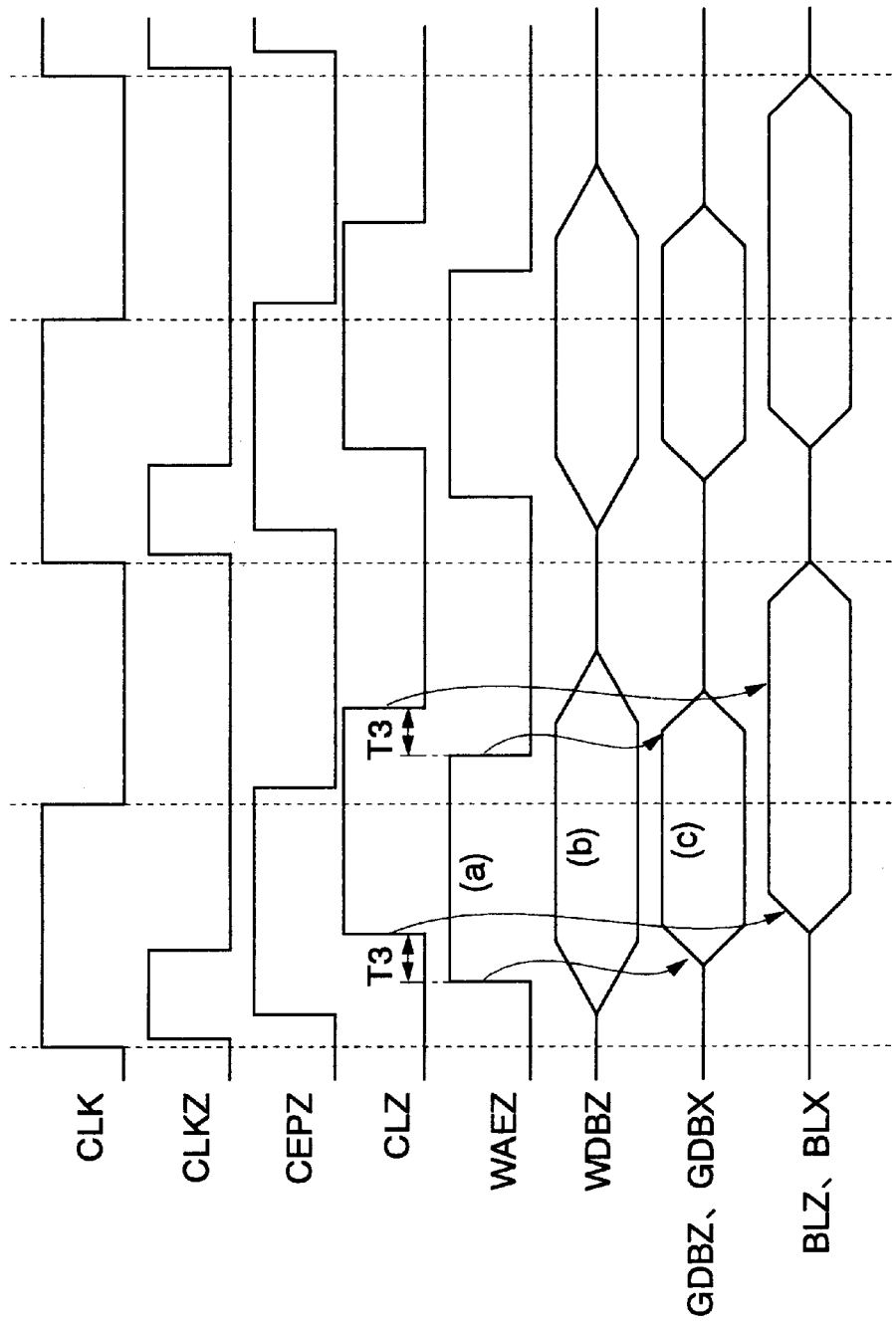
FIG. 14 is a timing chart of main signals in a write operation in the prior art SDRAM.
Figure 15:
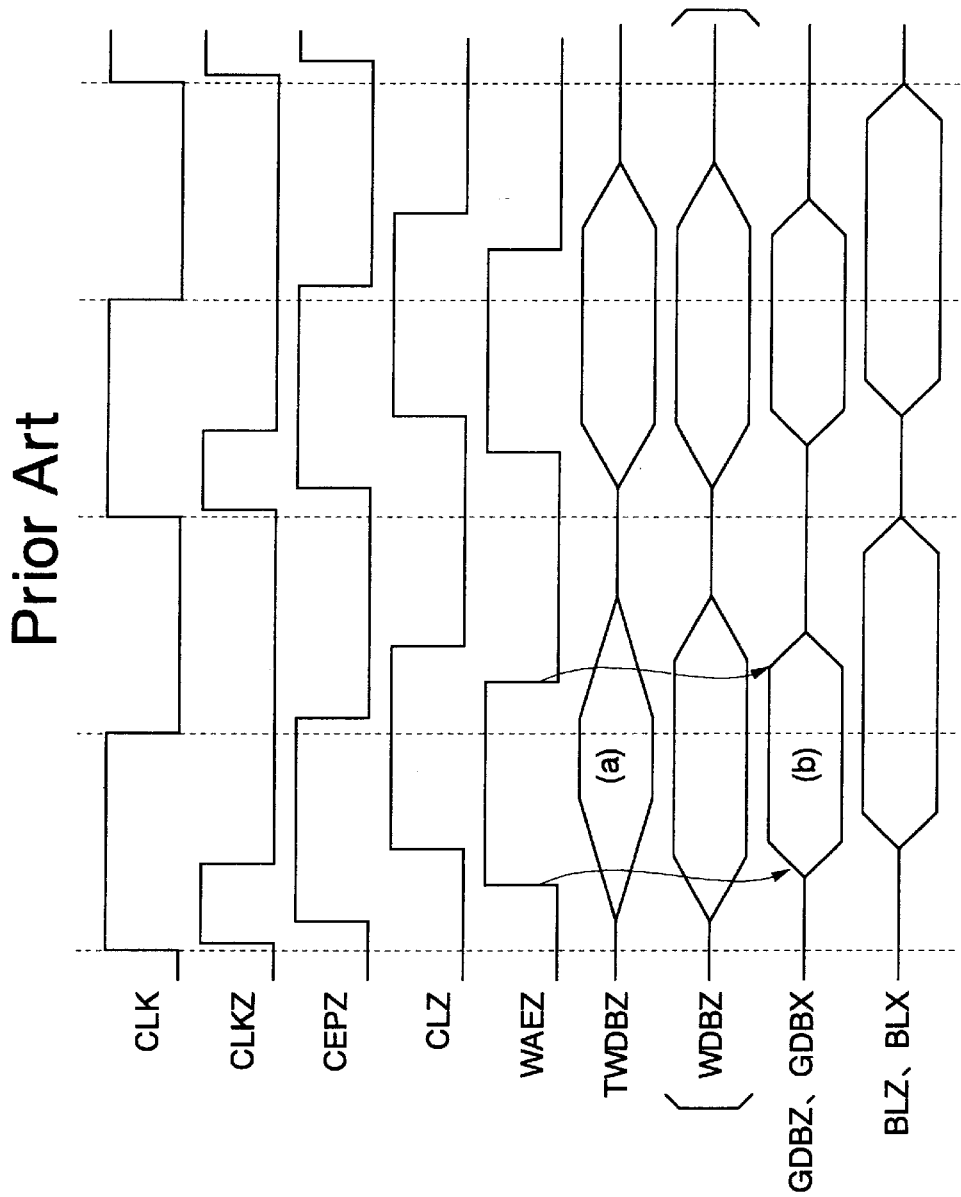
FIG. 15 is a timing chart showing a write operation in a compressing test mode in the prior art SDRAM.
Figure 16:
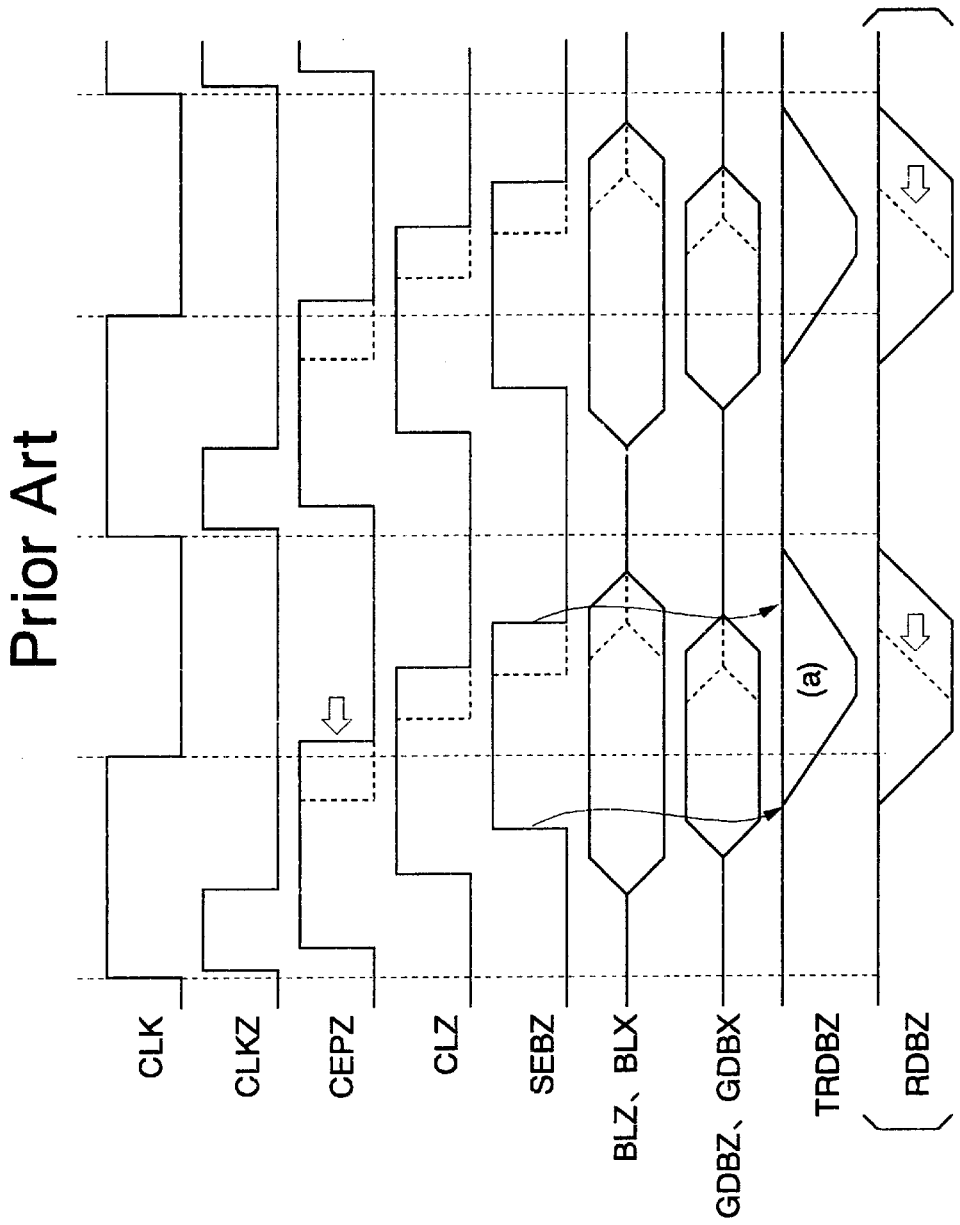
FIG. 16 is a timing chart showing a read operation in a compressing test mode in the prior art SDRAM.
Figure 17:
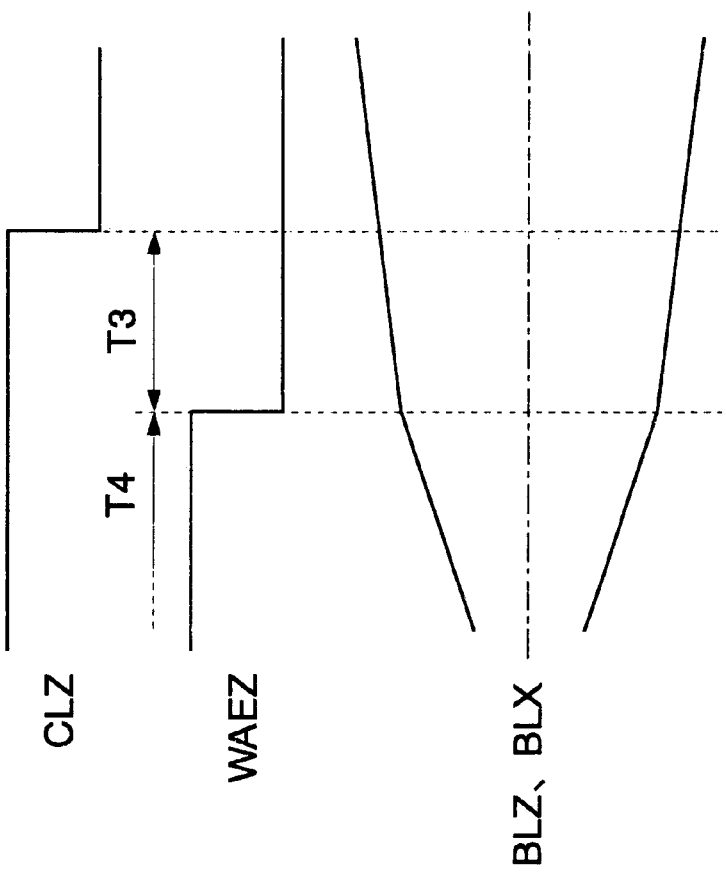
FIG. 17 is a timing chart showing a bit line signal in the prior art write operation.

The logic circuit 55 is the same circuit as the decoding circuit 10a of the pre-decoder 10 shown in FIG. 6. The logic circuit 57 is the same as the decoding circuit 4a of the main-decoder 4 shown in FIG. 7. In other words, the logic circuit 55 is formed in such a manner that the output of the 3-input NAND gate 55a is connected to the input of the inverter 55b. The logic circuit 57 is formed in such a manner that the output of the 3-input NAND gate 57a is connected to the input of the inverter 57b. The sizes of the NAND gate 55a and the inverter 55b are the same as the sizes of the NAND gate 10b and the inverter 10c of the decoding circuit 10a. The sizes of the NAND gate 57a and the inverter 57b are the same as the NAND gate 4b and the inverter 4c of the decoding circuit 4a.

The gate of the MOS capacitor 51a in the delay circuit 51 receives the clock pulse signal CEPZ. The gate of the MOS capacitor 51b in the delay circuit 51 is connected to the input of the NAND gate 55a of the logic circuit 55. The other input of the NAND gate 55a is connected to an internal power supply line VII. The voltage of the internal power supply line is set to 2.0V. The output of the inverter 55b of the logic circuit 55 is connected to the gate of the MOS capacitor 53a of the delay circuit 53. The gate of the MOS capacitor 53b of the delay circuit 53 is connected to the input of the NAND gate 57a of the logic circuit 57. The output of the inverter 57b of the logic circuit 57 outputs a first write controlling signal WEZ. The first write controlling signal WEZ is supplied to the input of the delay gate 59. The output of the delay gate 59 outputs the read controlling signal SEBZ.

As shown in FIG. 25, the second timing controlling circuit 49b comprises delay circuits 51 and 53 and logic circuits 55 and 57 having the same connections as in the first timing controlling circuit 49a, and an OR circuit 61 comprising a 2-input NOR gate and an inverter.

In the second timing controlling circuit 49b, the gate of a MOS capacitor 51a in the delay circuit 51 receives the clock pulse signal WCEPZ. An inverter 57b of the logic circuit 57 outputs a second write controlling signal WCEP2Z. One of the inputs of the OR circuit 61 receives the second write controlling signal WCEP2Z. The other input of the OR circuit 61 receives the first write controlling signal WEZ.

In the SDRAM 40 described above, a data reading operation in a normal operation mode is carried out in the following manner. In the normal operation mode, the testing circuit 17 shown in FIG. 19 sets the testing signal TESZ at low level.

Figure 26:
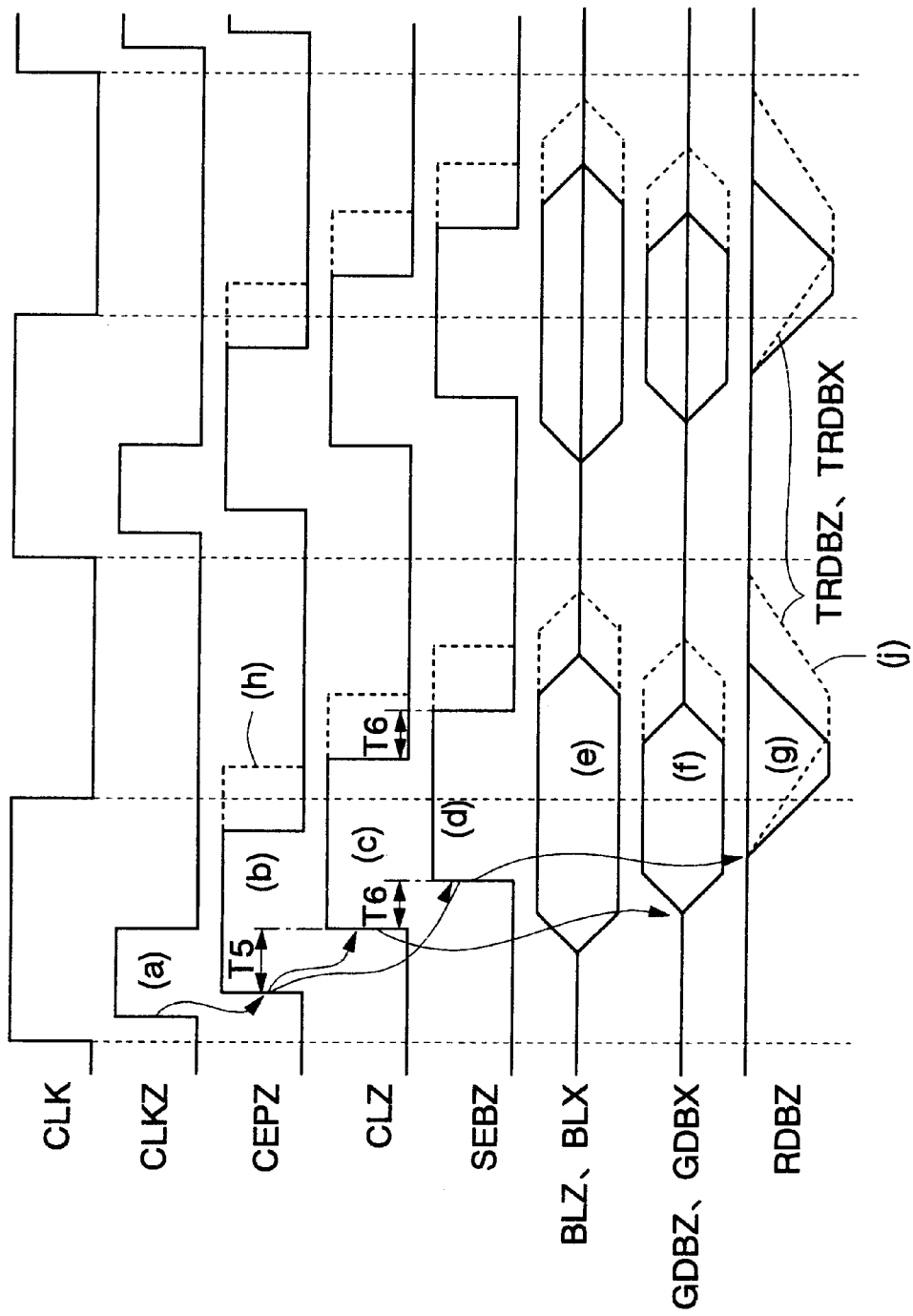
FIG. 26 is a timing chart of main signals in a read operation in the SDRAM according to the first embodiment.

FIG. 26 shows timings of main signals in the read operation in the SDRAM 40.

The pulse generator 20 of the clock buffer 43 shown in FIG. 21 generates the internal clock signal CLKZ in synchronization with a rise of the clock signal CLK [FIG. 26(a)].

The first clock pulse generator 45 shown in FIG. 22 receives the testing signal TESZ at low level and activates the NAND gate 45h while inactivating the NAND gate 45j. Therefore, a feedback circuit comprising the inverter row 45f and the NAND gates 45h and 45k is formed in the first clock pulse generator 45. The first clock pulse generator 45 receives the internal clock signal CLKZ and generates the clock pulse signal CEPZ having a pulse width equivalent to the delay time of the inverter row 45f [FIG. 26(b)].

An activation period of the clock pulse signal CEPZ is so determined that the low level of the read data signal RDBZ takes a predetermined voltage value in a read cycle in the normal operation mode. In this embodiment, low levels of the testing read data signals TRDBZ and TRDBX in a compressing test mode do not need to be considered.

The clock pulse signal CEPZ is transmitted to the pre-decoder 10, the wiring of the column decoding signal CAZ, and to the main-decoder 4 in this order, and activates the column selecting signal CLZ corresponding to a predetermined address [FIG. 26(c)]. The column selecting signal CLZ is activated lagging behind the clock pulse signal CEPZ by time T5 as in the conventional semiconductor integrated circuit described in the related art, due to the wiring load of the clock pulse signal CEPZ, the circuit delay of the pre-decoder 10, the wiring load of the column decoding signal CAZ, and the circuit delay by the main-decoder 4.

The first timing controlling circuit 49a shown in FIG. 24 generates the read controlling signal SEBZ by using the delay circuit 51 which is the delay element equivalent to the portion of the load of the wiring of the clock pulse signal CEPZ formed along the vertical direction of the memory core unit 2, the logic circuit 55 which is the same as the decoding circuit 10a in the pre-decoder 10, the delay circuit 53 which is the delay element equivalent to the average of the wiring load of the column decoding signal CAZ, the logic circuit 57 which is the same as the decoding circuit 4a in the main-decoder 4, and the delay gate 59 [FIG. 26(d)]. Therefore, the read controlling signal SEBZ generated in the above manner is activated lagging behind the average of activation timings of the column selecting signal CLZ by time T6 which is a delay time of the delay gate 59. The delay time T6 of the delay gate 59 is time necessary for the nMOS of the switching circuit 6 shown in FIG. 20 to turn on. Since the delay time of the delay circuit 53 is the average of the wiring load of the column decoding signal CAZ, the deviations between the column selecting signal CLZ and the read controlling signal SEBZ and between the column selecting signal CLZ and the write controlling signal WAEZ are always kept within a predetermined range.

The memory cell 7 is selected by a signal and a circuit corresponding to a row address which is not shown, and the bit line signals BLZ and BLX are output from the memory cell 7 [FIG. 26(e)]. Practically, the voltages of the bit line signals BLZ and BLX are changed by a storage charge being distributed to the bit lines in the memory cell 7.

The switching circuit 6 shown in FIG. 20 is turned on by receiving the column selecting signal CLZ at high level. Signal levels of the bit line signals BLZ and BLX are transmitted as the internal data signals GDBZ and GDBX through the switching circuit 6 [FIG. 26(f)].

The sense buffer 8 shown in FIG. 20 accepts the internal data signals GDBZ and GDBX by receiving the read controlling signal SEBZ at high level, carries out differential amplification of the signals, and outputs the amplified signal as the read data signal RDBZ (RDB0Z, RDB1Z, RDB2Z, and RDB3Z) [FIG. 26(g)]. In order to cause the low level of the read data signal RDBZ to have a predetermined voltage, activation periods of the clock pulse signals CEPZ or the like have been determined.

The read data signal RDBZ is output to the pad as the data signal DQ by the data input/output circuit 12 shown in FIG. 19, and the read operation is completed.

In the SDRAM 40 described above, a data reading operation is carried out in the compressing test mode in the following manner. During the compressing test mode, the testing circuit 17 shown in FIG. 19 sets the testing signal TESZ to a high level.

The first clock pulse generator 45 shown in FIG. 22 receives the testing signal TESZ at high level in the compressing test mode, and inactivates the NAND gate 45h while activates the NAND gate 45j. Therefore, a feedback circuit comprising the inverter rows 45f and 45g, and the NAND gates 45j and 45k is formed in the first clock pulse generator 45. The first clock pulse generator 45 receives the internal clock signal CLKZ and generates the clock pulse signal CEPZ having the pulse width equivalent to the delay time of the inverter rows 45f and 45g [FIG. 26(h)]. In other words, in the compressing test mode, each of the controlling signals has a longer activation period than in the normal operation mode.

As shown by dashed lines in FIG. 26, the column selecting signal CLZ and the read controlling signal SEBZ are generated thereafter, and the read operation in the compressing test mode is carried out. Control related to data compression in the compressing test mode is the same as in the conventional technique. Since wiring of testing read data signals TRDBZ and TRDBX are connected to the sense buffer, the testing read data signals TRDBZ and TRDBX have gentle waveforms. However, since the activation period of each of the controlling signals is longer, the low level of the testing read data signals TRDBZ and TRBX takes a predetermined voltage [FIG. 26(j)]. Therefore, the read operation in the data compressing test can be carried out with certainty.

In the SDRAM 40 described above, data are written in the following manner.

Figure 27:
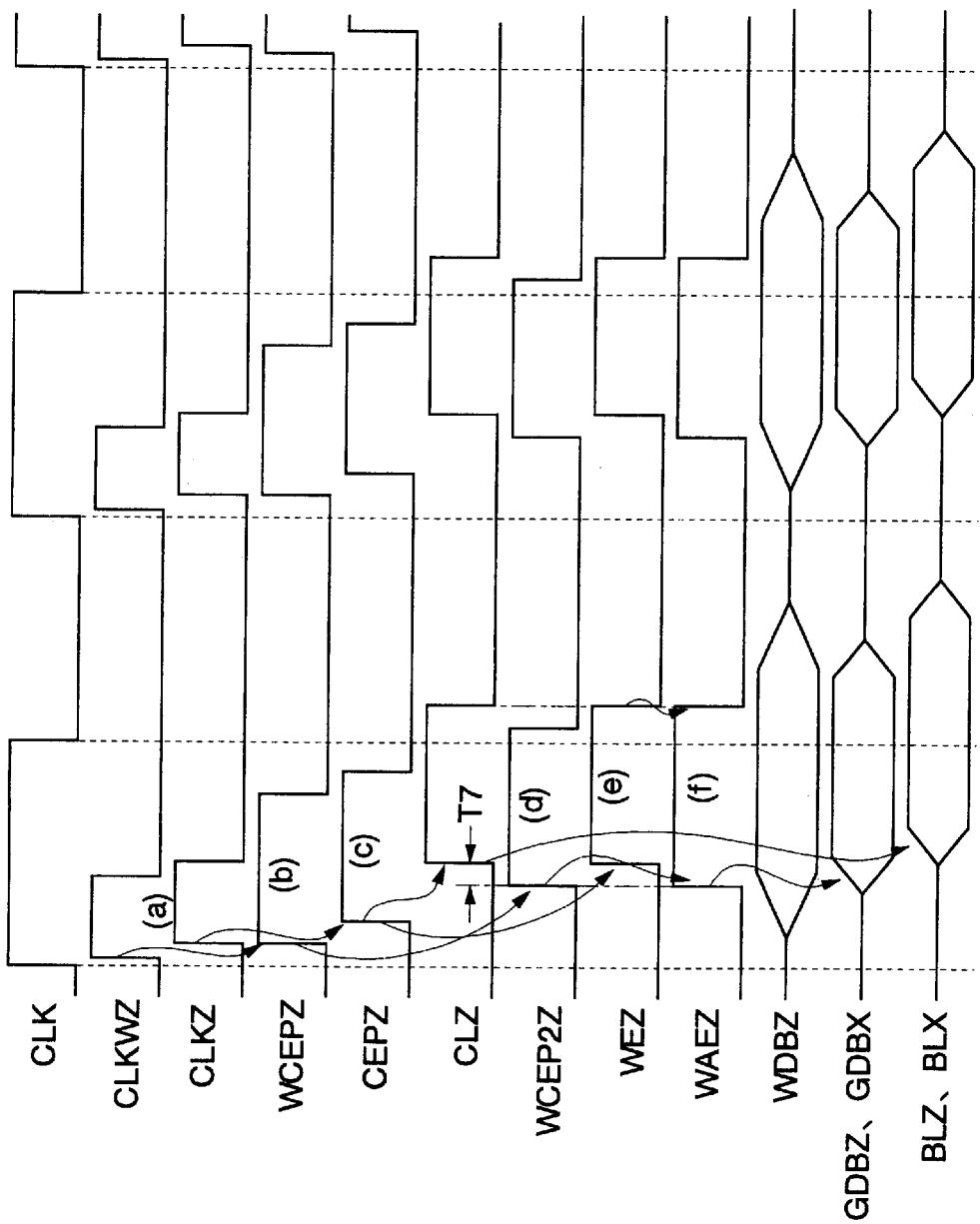
FIG. 27 is a timing chart of main signals in a write operation in the SERAM according to the first embodiment.

FIG. 27 shows timings of main signals in a write operation. The timings of the clock signal CLK, the internal clock signals CLKWZ and CLKZ, the clock pulse signals WCEPZ and CEPZ, and the column selecting signal CLZ are the same as in the read operation, and explanation thereof is omitted.

The clock buffer 43 shown in FIG. 21 receives the clock signal CLK and generates the internal clock signals CLKWZ and CLKZ [FIG. 27(a)]. The second clock pulse generator 47 shown in FIG. 23 receives the testing signal TESZ at low level and activates the NAND gate 47h while inactivating the NAND gate 47j. Therefore, a feedback circuit formed by the inverter row 47f, the NAND gates 47h and 47k is formed in the second clock pulse generator 47. The second clock pulse generator 47 receives the internal clock signal CLKWZ and generates the clock pulse signal WCEPZ having the pulse width equivalent to a delay time of the inverter row 47j [FIG. 27(b)].

The first clock pulse generator 45 shown in FIG. 22 generates the clock pulse signal CEPZ, as in the read operation [FIG. 27(c)]. The activation periods (the pulse widths) of the clock pulse signals WCEPZ and CEPZ are the same.

The second timing controlling circuit 49b shown in FIG. 25 receives the clock pulse signal WCEPZ and generates the second write controlling signal WCEP2Z [FIG. 27(d)]. The second write controlling signal WCEP2Z is generated earlier than the column selecting signal CLZ by time T7. The time T7 is equivalent to the delay time of the 2-stage inverters in the inverter row 20c shown in FIG. 21.

The first timing controlling circuit 49a receives the clock pulse signal CEPZ and generates the first write controlling signal WEZ [FIG. 27(e)]. The first write controlling signal WEZ is generated at the same timing as the column selecting signal CLZ.

The OR circuit 61 of the second timing controlling circuit 49a shown in FIG. 25 carries out an OR logic operation of the first write controlling signal WEZ and the second write controlling signal WCEP2Z, and generates the write controlling signal WAEZ [FIG. 27(f)]. Since the clock pulse signals CEPZ and WCEPZ are generated by the first and second clock pulse generators 45 and 47 having the same circuits, the activation periods (the pulse widths) thereof are the same. The deviation of the timings between the clock pulse signals CEPZ and WCEPZ is the delay time of the 2-stage inverters of the inverter row 20c shown in FIG. 21. The first and the second timing controlling circuits 49a and 49b have the same delay circuits 51 and 53 and the logic circuits 55 and 57. Therefore, the deviation of the first write controlling signal WEZ supplied to the OR circuit 61 of the second timing controlling circuit 49b from the second write controlling signal WCEP2Z is equivalent to the 2-stage inverters of the inverter row 20c. Therefore, no hazard occurs on the output (the write controlling signal WAEZ) of the OR circuit 61.

The time T7 is set shorter than the delay time of the OR circuit 61. Therefore, the write controlling signal WAEZ is generated to include the activation period of the column selecting signal CLZ. As a result, while the column selecting signal CLZ is active, that is, while the switching circuit 6 shown in FIG. 20 is on, the write amplifier 9 is always activated. Therefore, a difference in the signal levels between the bit line signals BLZ and BLX rapidly increases, compared with the case where the signals are amplified only by the sense amplifier 5. Therefore, a write voltage to the memory cell 7 becomes a high level and data retaining time of the memory cell 7 is improved. Operations of the write amplifier 9, the switching circuit 6, and the sense amplifier 5 are the same as in the conventional semiconductor integrated circuit.

Figure 28:
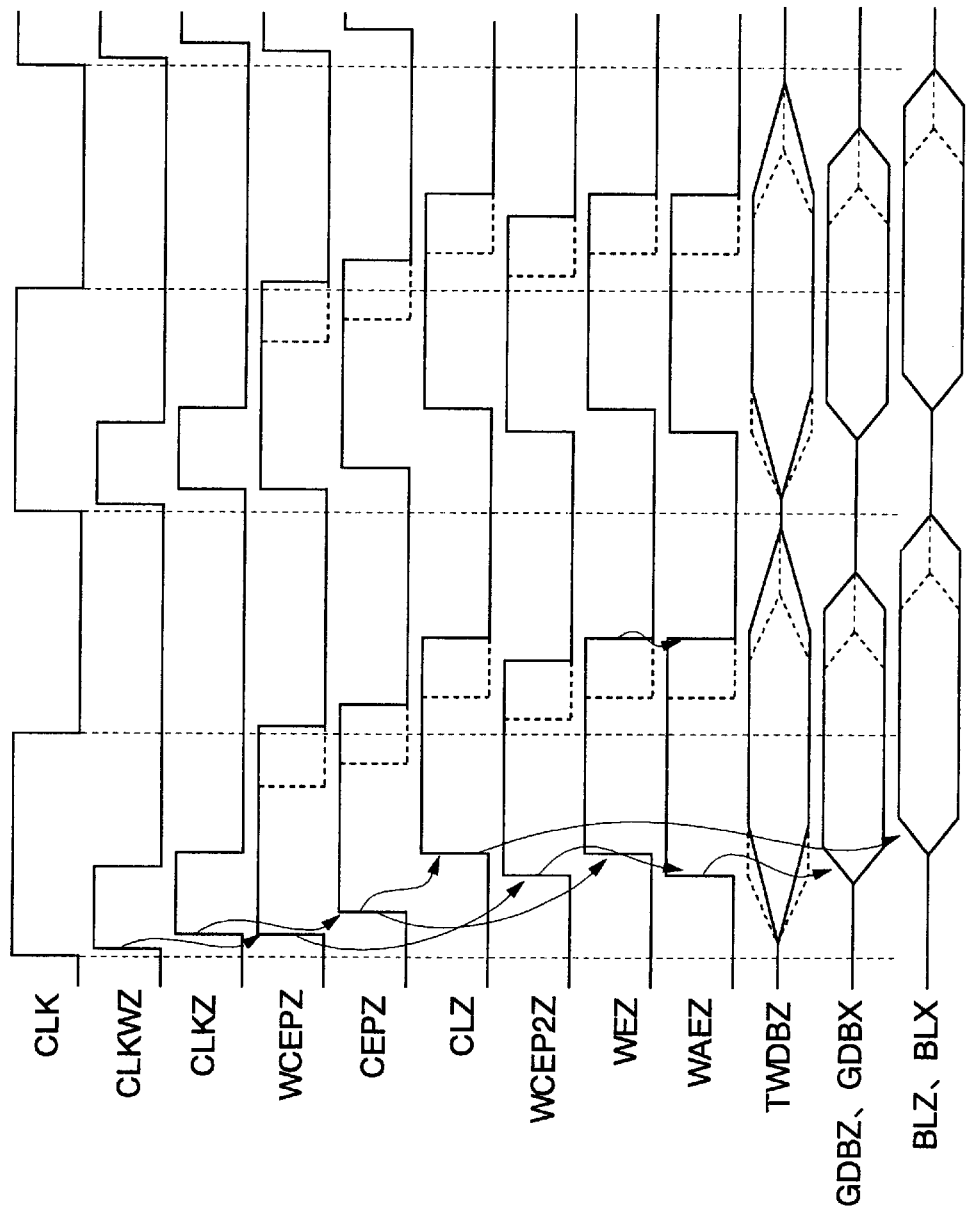
FIG. 28 is a timing chart of main signals in a write operation in the compressing test mode according to the first embodiment.

FIG. 28 shows timings of main signals in a write operation in the compressing test mode. The testing signal TESZ is at high level in the compressing test mode as in the read operation, and the activation periods of the clock pulse signals WCEPZ and CEPZ become longer. Therefore, even if the waveforms of the testing write data signal TWDBZ are gentle, the write operation can be carried out with certainty. Dashed lines in FIG. 27 show the waveform of each signal in the normal operation mode shown in FIG. 27.

In the semiconductor integrated circuit configured in the above manner, the first and second timing controlling circuits 49a and 49b comprise the delay circuits 51 which are the delay elements equivalent to the portion of the load of the wiring of the clock pulse signal CEPZ formed along the vertical direction of the memory core unit 2, the logic circuits 55 which are the same as the decoder 10a of the pre-decoder 10, the delay circuits 53 which are the delay elements equivalent to the wiring load of the column decoding signal CAZ, and the logic circuits 57 which are the same as the decoder 4a of the main-decoder 4. Therefore, the deviations between the timings of the column selecting signal CLZ and the read controlling signal SEBZ, and between the column selecting signal CLZ and the write controlling signal WAEZ due to fluctuations occurring in a manufacturing process, an operation voltage, and ambient temperature can be minimized. Therefore, timing design of the SDRAM 40 can be carried out easily. By designing timings minimizing the deviations, a high-speed chip operation is realized. In case that the high-speed operation is not pursued, timing margins of other circuits can be increased and the yield of the chip improves.

The delay time of the delay circuit 53 is set to the average of the wiring load of the column decoding signal CAZ. Therefore, the deviations between the timings of the column selecting signal CLZ and the read controlling signal SEBZ, and between the column selecting signal CLZ and the write controlling signal WAEZ can always be kept within the predetermined range.

The activation period of the column selecting signal CLZ is included in the activation period of the write controlling signal WAEZ. Therefore, while the switching circuit 6 is on, data can be written to the memory cell 7 by using not only amplifying power of the sense amplifier 5 but also drivability of the write amplifier 9. As a result, the data can be written to the memory cell 7 with a sufficient write voltage, and the data retaining time of the memory cell 7 can be improved.

The activation periods of the clock pulse signals CEPZ and WCEPZ are different between the normal operation mode and the compressing test mode. Therefore, data can be read and written at optimal timings in the normal operation, regardless of the load in the testing mode. Furthermore, the timings of the internal circuit in the normal operation mode can be designed separately from the timings thereof in the compressing test mode. The operation timings of the internal circuit in the normal operation do not depend on the operation timings in the testing mode. Therefore, the timing design of the internal circuit can be optimally carried out.

Since the logic circuits 55 and 57 are the same as in the decoders 10a and 4a, the timing deviation in a low-voltage operation can be reduced and timing design can be carried out easily.

The delay gate 59 comprising 2-stage inverters receives the first write controlling signal WEZ generated at the timing the same as the timing of the column selecting signal CLZ, and generates the read controlling signal SEBZ. Therefore, the read controlling signal SEBZ can be inactivated with certainty with a minimal deviation from the inactivation timing of the column selecting signal CLZ. AS a result, data can be read with certainty at the optimal timing.

The write controlling signal WAEZ is generated by using the OR logic of the first write controlling signal WEZ and the second write controlling signal WCEP2Z. Therefore, without a substantial modification to the conventional circuit, the write controlling signal WAEZ including the activation period of the column selecting signal CLZ can be generated easily.

Figure 29:
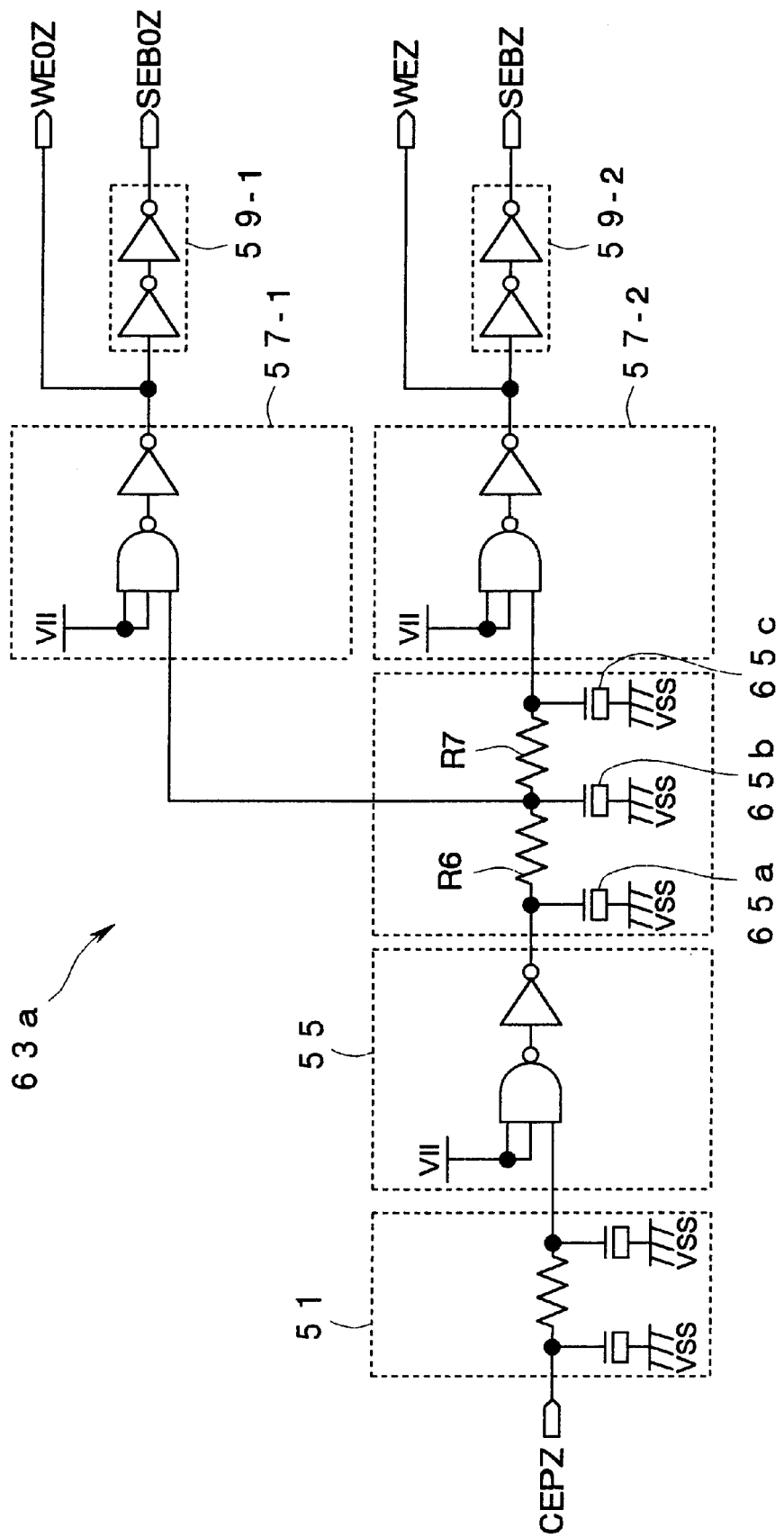
FIG. 29 is a circuit diagram of the first timing controlling circuit according to the second embodiment.
Figure 30:
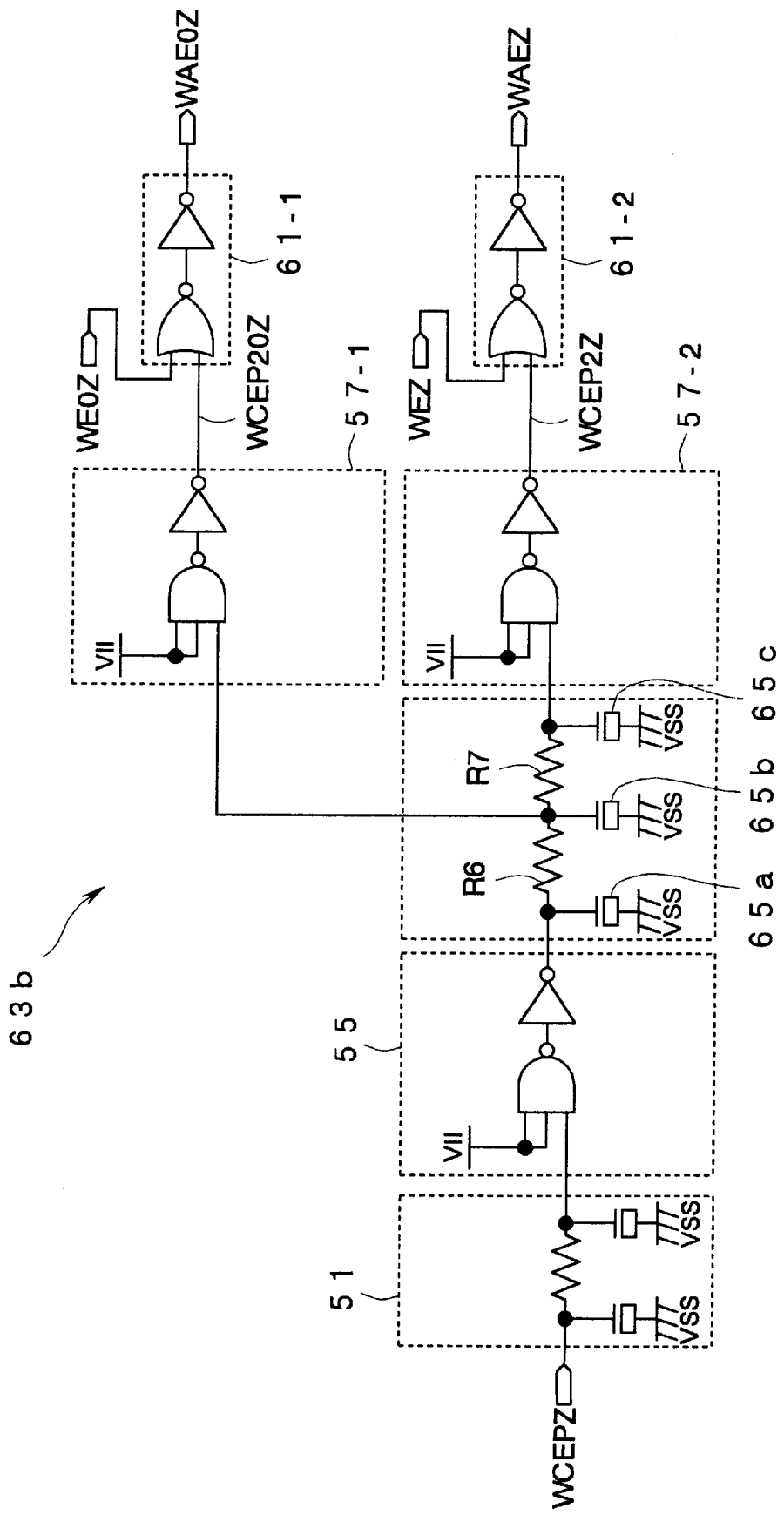
FIG. 30 is a circuit diagram of the second timing controlling circuit according to the second embodiment.
Figure 31:
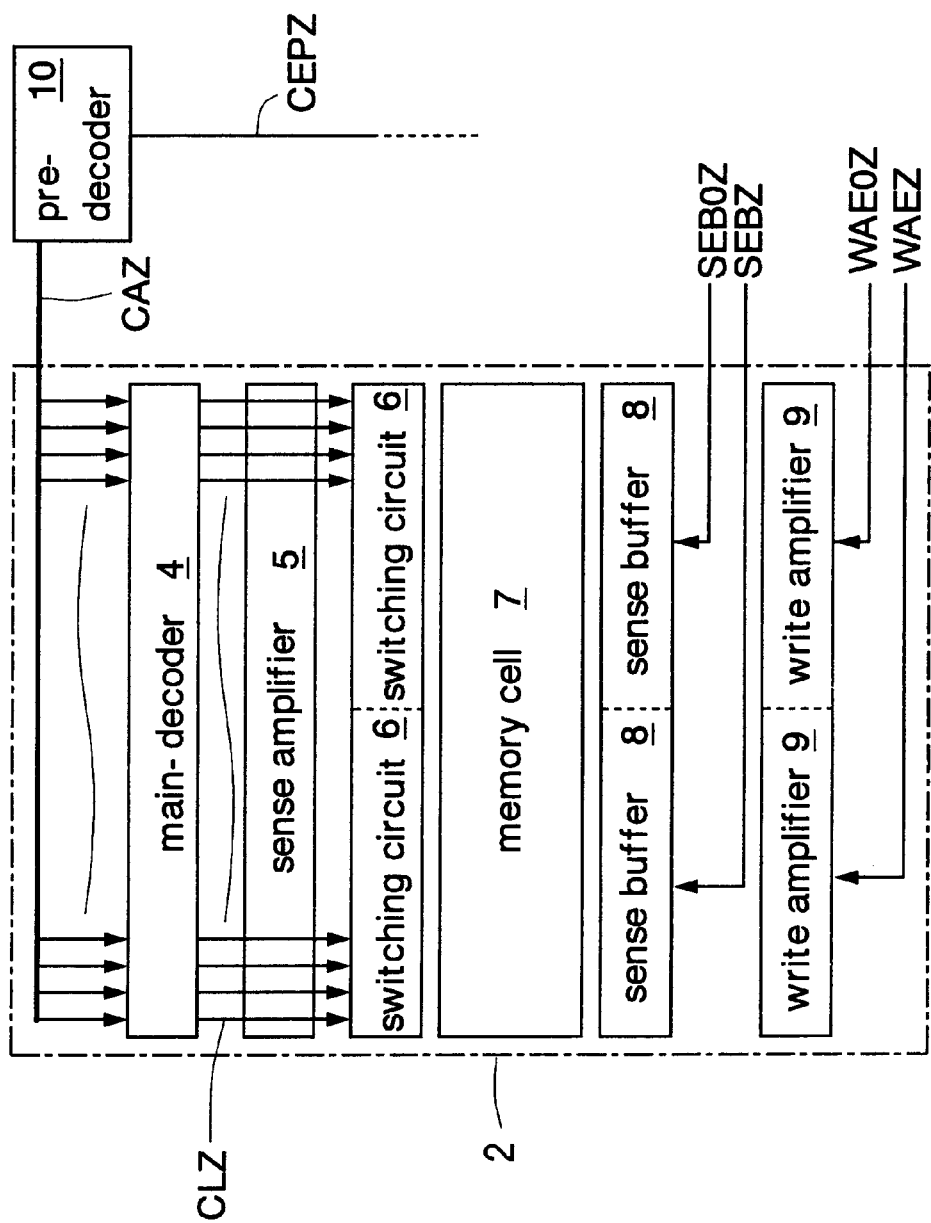
FIG. 31 is a block diagram showing the memory core unit according to the second embodiment.

FIGS. 29 through 31 show a first timing controlling circuit 63a, a second timing controlling circuit 63b, and a memory core unit 2 of the second embodiment of the semiconductor integrated circuit of the present invention.

A configuration in the second embodiment other than the first timing controlling circuit 63a and the second timing controlling circuit 63b is the same as in the first embodiment described above. In this embodiment, read controlling signals SEBZ and SEB0Z having different timings and write controlling signals WAEZ and WAE0Z having different timings are generated from the clock pulse signals CEPZ and WCEPZ, and read and write operations are carried out by using the generated signals.

As shown in FIG. 29, the first timing controlling circuit 63a has a delay circuit 65 replacing the delay circuit 53 in the first embodiment, two logic circuits 57-1 and 57-2, and two delay gates 59-1 and 59-2. Circuits other than the above are the same as in the first timing controlling circuit 49a in the first embodiment.

The delay circuit 65 comprises MOS capacitors 65a, 65b, and 65c in each of which the source and the drain of an nMOS are connected to a ground line VSS, a resistor R6 connecting the gates of the MOS capacitors 65a and 65b to each other, and a resistor R7 connecting the gates of the MOS capacitors 65b and 65c to each other. The resistors R6 and R7 are formed with diffusion resistances or the like.

The gate of the MOS capacitor 65a is connected to the output of a logic circuit 55. The gate of the MOS capacitor 65b is connected to the input of the logic circuit 57-1. The gate of the MOS capacitor 65c is connected to the input of the logic circuit 57-2.

The output of the logic circuit 57-1 outputs a first write controlling signal WEOZ. The output of the logic circuit 57-1 is connected to the input of the delay gate 59-1. The output of the delay gate 59-1 outputs the read controlling signal SEB0Z. The output of the logic circuit 57-2 outputs a first write controlling signal WEZ. The output of the logic circuit 57-2 is connected to the input of the delay gate 59-2. The output of the delay gate 59-2 outputs the read controlling signal SEBZ.

The input of the delay circuit 51 receives the clock pulse signal CEPZ.

The first timing controlling circuit 63a generates the read controlling signal SEB0Z at an earlier activation timing and the read controlling signal SEBZ at a later activation timing.

As shown in FIG. 30, the second timing controlling circuit 63b comprises delay circuits 51 and 65 having the same connections as in the first timing controlling circuit 63a, logic circuits 55, 57-1, and 57-2 having the same connections as in the first timing controlling circuit 63a, and two OR circuits 61-1 and 61-2.

The input of the delay circuit 51 receives the clock pulse signal WCEPZ. The output of the logic circuit 57-1 outputs a second write controlling signal WCEP20Z. The second write controlling signal WCEP20Z is supplied to one of the inputs of the OR circuit 61-1. The other input of the OR circuit 61-1 receives the first write controlling signal WEOZ. The output of the OR circuit 61-1 outputs the write controlling signal WAE0Z. The output of the logic circuit 57-2 outputs a second write controlling signal WCEP2Z. The second write controlling signal WCEP2Z is input to one of the inputs of the OR circuit 61-2. The other input of the OR circuit 61-2 receives the first write controlling signal WEZ. The output of the OR circuit 61-2 outputs the write controlling signal WAEZ.

The second timing controlling signal 63b generates the write controlling signal WAE0Z having an earlier activation timing and the write controlling signal WAEZ having a later activation timing.

FIG. 31 shows the memory core unit 2 and a peripheral circuit thereof.

In this embodiment, the read controlling signal SEBZ and the write controlling signal WAEZ are supplied to the sense buffer 8 and the write amplifier 9 corresponding to the switching circuit 6 (on the left of FIG. 31) farther from the pre-decoder 10. The read controlling signal SEB0Z and the write controlling signal WAE0Z are supplied to the sense buffer 8 and the write amplifier 9 corresponding to the switching circuit 6 (on the right of FIG. 31) nearer to the pre-decoder 10.

In the semiconductor integrated circuit described above, propagation delay time of the column decoding signal CAZ output from the pre-decoder 10 becomes larger as the main-decoder 4 to which the column decoding signal CAZ is supplied is farther from the pre-decoder 10. In response to this delay time, the read controlling signals SEB0Z and SEBZ and the write controlling signals WAE0Z and WAEZ each having a different activation timing are supplied to each of the sense buffers 8 and each of the write amplifiers 9. Therefore, each sense buffer 8 and each write amplifier 9 are activated at an optimal timing in accordance with an activation timing of each switching circuit 6.

By the semiconductor integrated circuit according to this embodiment, the same effect as by the first embodiment described above can be obtained. Furthermore, in this embodiment, the first timing controlling circuit 63a generates the read controlling signals SEBZ and SEB0Z having the different timings and the second timing controlling circuit 63b generates the write controlling signals WAEZ and WAE0Z having the different timings. Therefore, the sense buffer 8 accepts read data of the internal data signals GDBZ and GDBX by using either the read controlling signal SEBZ or SEB0Z. The write amplifier 9 supplies write data to the wiring of the internal data signals GDBZ and GDBX by using either write controlling signal WAEZ or WAE0Z. As a result, the deviations between the timings of the column selecting signal CLZ and the read controlling signals SEBZ and SEB0Z, and between the column selecting signal CLZ and the write controlling signals WAEZ and WAE0Z can be minimized.

Therefore, the timing design can be easily carried out, and the read and write operations of the chip can be faster performed.

Figure 32:
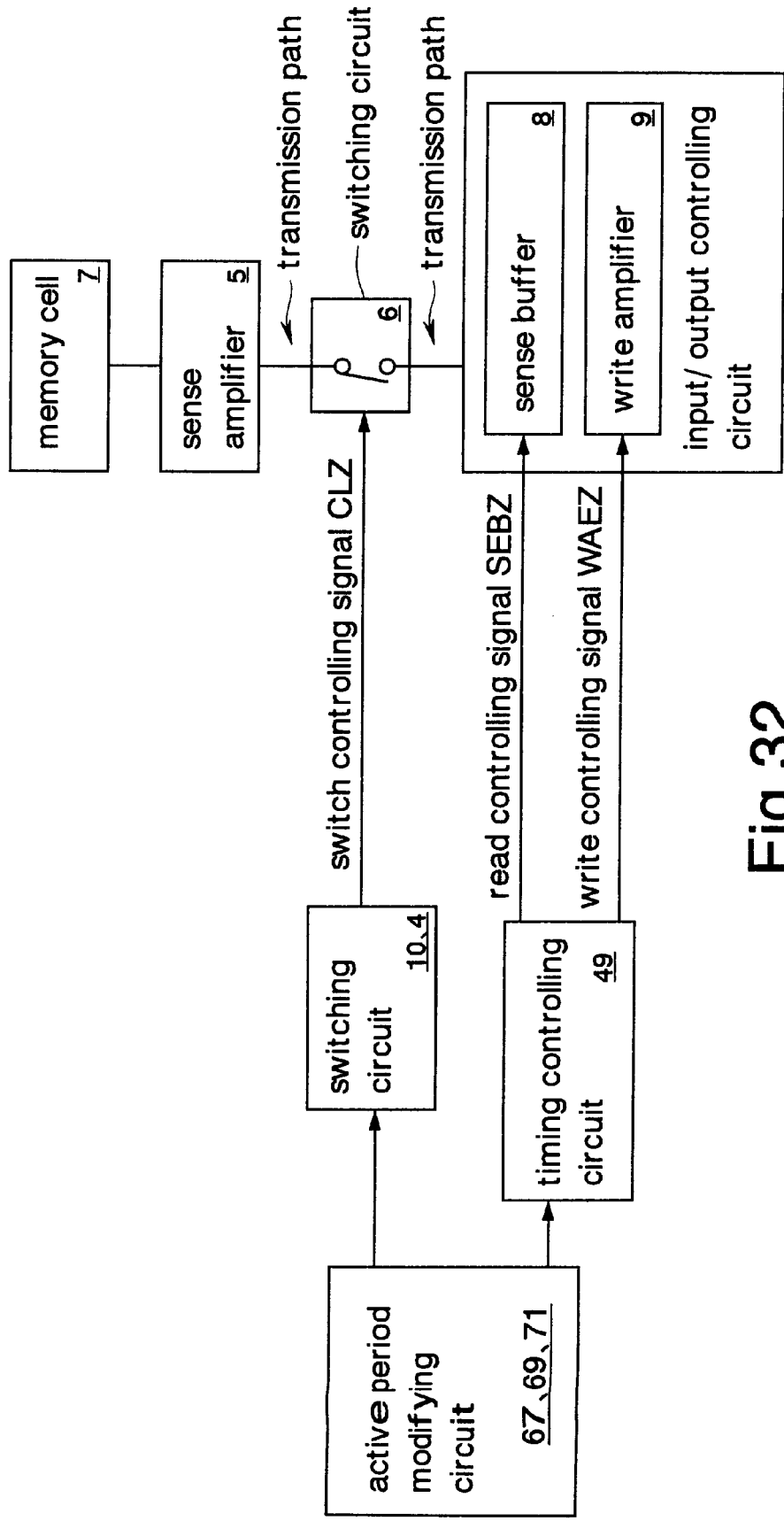
FIG. 32 is a block diagram showing the basic principle of the present invention according to the third embodiment.

FIG. 32 shows a basic principle of the third embodiment of the present invention.

In a semiconductor integrated circuit shown in FIG. 32, the switching circuits 10 and 4 generate the switch controlling signal CLZ at a predetermined timing and outputs to the switching circuit 6. The timing controlling circuit 49 generates at least one of the read controlling signal SEBZ and the write controlling signal WAEZ at a predetermined timing, and outputs to the input/output controlling circuit comprising the sense buffer 8 and the write amplifier 9. At this time, an activation period of at least any one of the switch controlling signal CLZ, the read controlling signal SEBZ and the write controlling signal WAEZ can be modified by activation period modifying circuits 67, 69 and 71.

Figure 33:
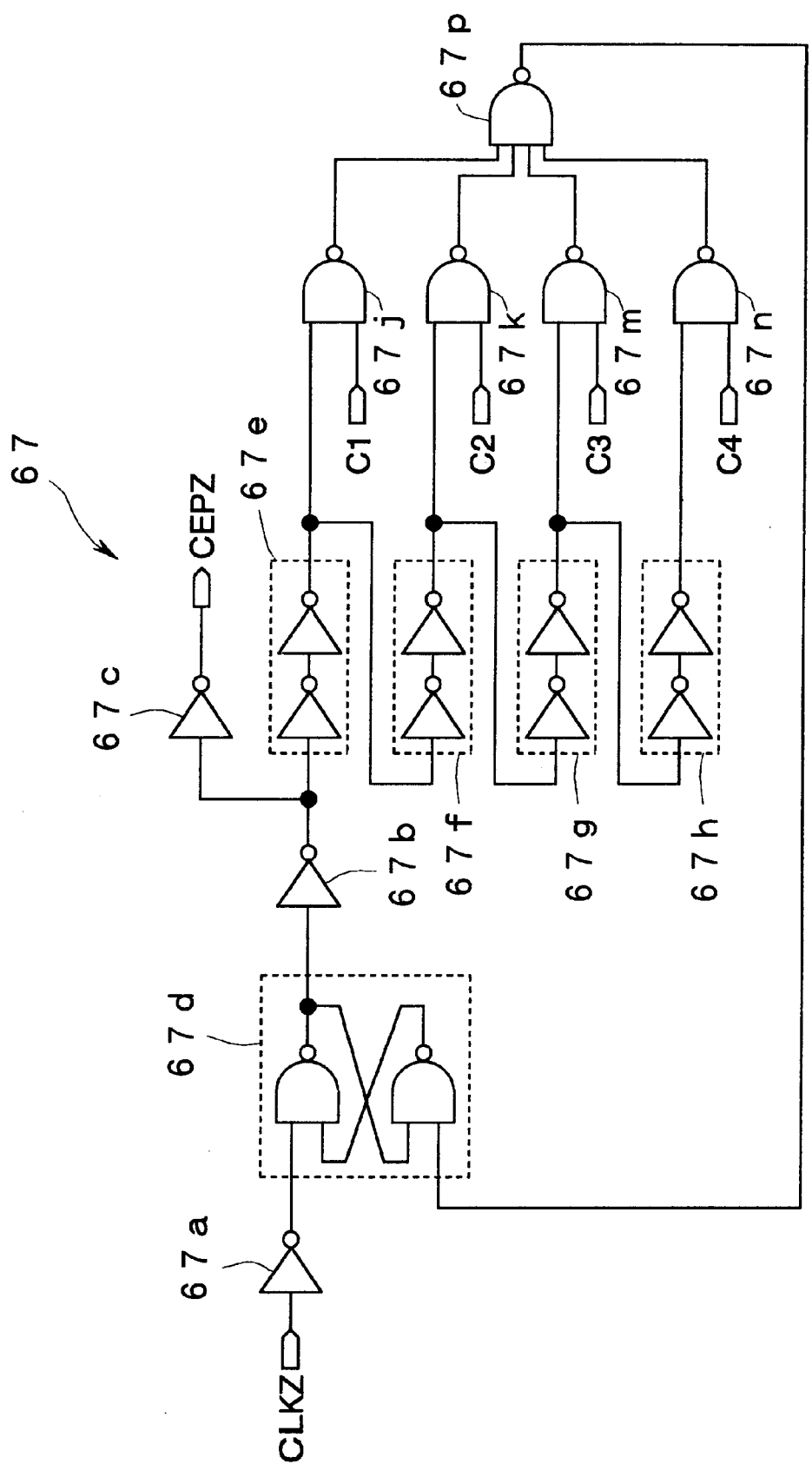
FIG. 33 is a circuit diagram of the first clock pulse generator according to the third embodiment.
Figure 34:
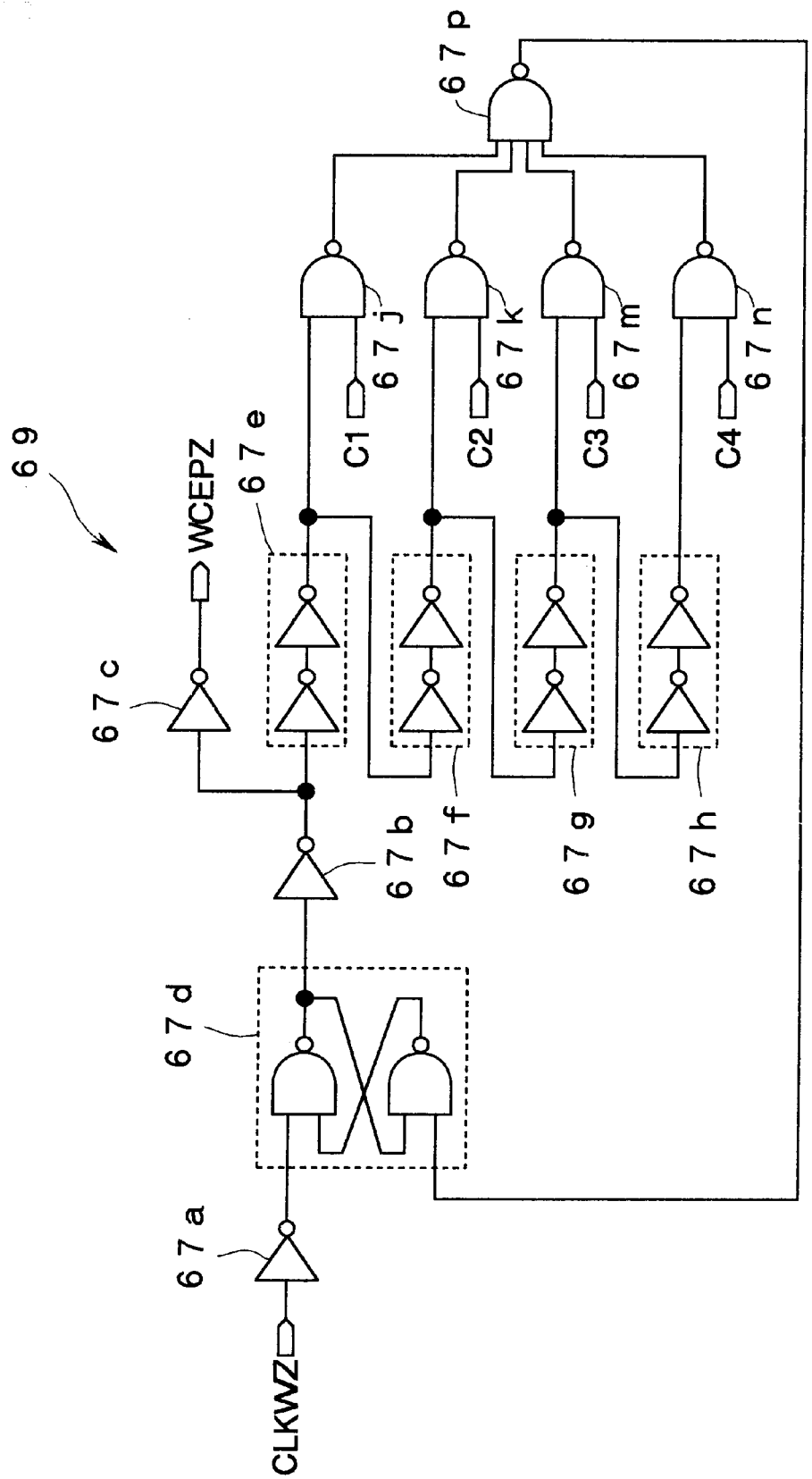
FIG. 34 is a circuit diagram of the first clock pulse generator according to the third embodiment.
Figure 35:
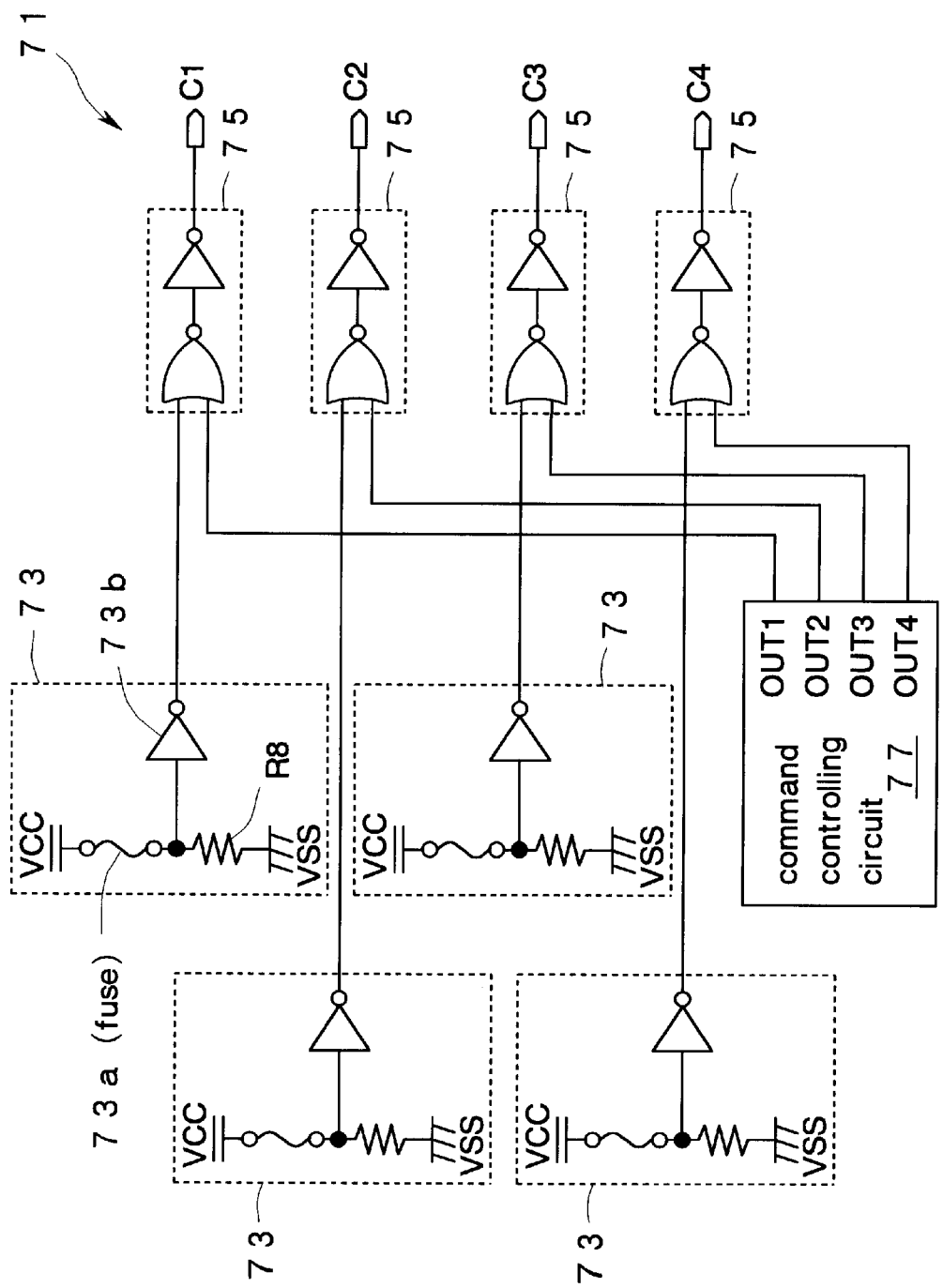
FIG. 35 is a circuit diagram of the controlling circuit according to the third embodiment.

FIGS. 33 through 35 show a first clock pulse generator 67, a second clock pulse generator 69 and a controlling circuit 71 in the third embodiment. The first clock pulse generator 67 corresponds to the reference timing signal generator and the activation period modifying circuit, while the second clock pulse generator 69 corresponds to the activation period modifying circuit.

A circuit configuration of this embodiment is the same as in the first embodiment described above, except for the first and second clock pulse generators 67 and 69, and the controlling circuit 71. In this embodiment, the first and second clock pulse generators 67 and 69 generate the clock pulse signals CEPZ and WCEPZ having any one of 4 types of activation periods.

As shown in FIG. 33, the first clock pulse generator 67 comprises three inverters 67a, 67b, and 67c, a flip-flop circuit 67d comprising two 2-input NAND gates, inverter rows 67e, 67f, 67g, and 67h each comprising two inverters connected in cascade, four 2-input NAND gates 67j, 67k, 67m, and 67n and a 4-input NAND gate 67p. The input of the inverter 67a receives the internal clock signal CLKZ. The output of the inverter 67a is connected to one of the inputs of the flip-flop circuit 67d. The output of the NAND gate of the flip-flop circuit 67d having the connection to the inverter 67a is connected to the input of the inverter 67b. The output of the inverter 67b is connected to the input of the inverter 67c and to the input of the inverter row 67e. The output of the inverter 67c outputs the clock pulse signal CEPZ. The output of the inverter row 67e is connected to the input of the inverter row 67f and to one of the inputs of the NAND gate 67j. The output of the inverter row 67f is connected to the input of the inverter row 67g and one of the inputs of the NAND gate 67k. The output of the inverter row 67g is connected to the input of the inverter row 67h and to one of the inputs of the NAND gate 67m. The output of the inverter row 67h is connected to one of the inputs of the NAND gate 67n. The other input of the NAND gate 67j receives a controlling signal C1. The other input of the NAND gate 67k receives a controlling signal C2. The other input of the NAND gate 67m receives a controlling signal C3. The other input of the NAND gate 67n receives a controlling signal C4. Outputs of the NAND gates 67j, 67k, 67m and 67n are connected to the inputs of the NAND gate 67p. The output of the NAND gate 67p is supplied back to the other input of the flip-flop circuit 67d.

FIG. 34 shows the second clock pulse generator 69 in detail.

The second clock pulse generator 69 is the same as the first clock pulse generator 67. The input of the inverter 67a receives the internal clock signal CLKWZ. The output of the inverter 67c outputs the clock pulse signal WCEPZ.

FIG. 35 shows the controlling circuit 71 in detail.

The controlling circuit 71 comprises four fuse circuits 73, four OR circuits 75, and a command controlling circuit 77.

Each of the fuse circuits 73 comprises a fuse 73a whose one end is connected to the supply line VCC, a resistor R8 whose one end is connected to the ground line VSS, and an inverter 73b whose input is connected to the other end of the fuse 73a and to the other end of the resistor R8. The fuse 73a is made of polysilicon or the like, and the resistor R8 is formed with a diffusion resistance or the like. The resistor R8 has a high-level resistance value in order to cause a feed through current flowing when the fuse 73a is not blown to become small. The output of the inverter 73b of each of the fuse circuits 73 is connected to one of the inputs of each of the OR circuits 75.

The other input of each of the OR circuits 75 receives an output signal OUT1, OUT2, OUT3 or OUT4 from the command controlling circuit 77. The output of the OR circuit 75 to which the output signal OUT1 is supplied outputs the controlling signal C1. Likewise, the outputs of the OR circuits 75 to which the output signals OUT2, OUT3 and OUT4 are supplied output the controlling signals C2, C3, and C4 respectively.

The command controlling circuit 77 is activated by a predetermined activation period modifying command supplied to the chip from an external terminal. The command controlling circuit 77 has functions of changing all the output signals OUT1, OUT2, OUT3 and OUT4 to a low level, and changing any one of the output signals to a high level by receiving the activation period modifying command.

In the semiconductor integrated circuit described above, the activation period modifying command is supplied from the exterior. The command controlling circuit 77 turns any one of the output signals OUT1, OUT2, OUT3 and OUT4 to a high level one by one, and evaluation of data reading and writing is carried out.

For example, when the output signal OUT1 is at high level, the first clock pulse generator 67 shown in FIG. 33 outputs the clock pulse signal CEPZ having an activation period equivalent to a delay time of the inverter row 67e. The second clock pulse generator 69 shown in FIG. 34 generates the clock pulse signal CEPZ having an activation period equivalent to the delay time of the inverter row 67e. As in the first embodiment, the column selecting signal CLZ, the read controlling signal SEBZ, and the write controlling signal WAEZ each having an activation period equivalent to the delay time of the inverter row 67e are generated.

When the output signal OUT2 is at high level, the activation periods of the signals CLZ, SEBZ and WAEZ are equivalent to a delay time of the inverter rows 67e and 67f. When the output signal OUT3 is at high level, the activation periods of the signals CLZ, SEBZ and WAEZ are equivalent to a delay time of the inverter rows 67e, 67f, and 67g. When the output signal OUT4 is at high level, the activation periods of the signals CLZ, SEBZ and WAEZ are equivalent to a delay time by the inverter rows 67e, 67f, 67g, and 67h.

An optimal activation period of each of the signals CLZ, SEBZ and WAEZ which cannot be measured directly from the exterior can be found indirectly by using evaluations of data reading and writing. Therefore, the characteristic of the chip can be improved by changing a photomask or a manufacturing process based on the evaluation results, and the yield thereof improves.

By blowing of the predetermined fuse 73a shown in FIG. 35 thereafter, the activation periods of the signals CLZ, SEBZ and WAEZ are set to the optimal values. For example, when the optimal activation period is observed in the case of the output signal OUT2 being at high level, the fuse 73a connected to the OR circuit 75 outputting the controlling signal C2 is blown. The fuse is blown in each of chips of the same manufacturing lot as the chip evaluated, for example. After the fuse has been blown, the command controlling circuit 77 turns all the output signals OUT1, OUT2, OUT3 and OUT4 to a low level, by inhibiting input of the activation period modifying commands or the like.

Therefore, by blowing the fuse 73a, chips operating at optimal timings can be manufactured and shipped, without a change in the photomask or the manufacturing process. Furthermore, since the activation periods of the signals CLZ, SEBZ and WAEZ can be modified for each chip, a variance in the characteristic of chips due to a manufacturing lot or a position of the chip on a wafer or in the manufacturing lot can be suppressed.

By the semiconductor integrated circuit according to this embodiment, the same effect as by the first embodiment described above can be obtained. Furthermore, in this embodiment, the activation periods of the signals CLZ, SEBZ and WAEZ can be modified by the activation period modifying command input from the exterior. Therefore, the characteristic of the chip can be improved by a change of the photomask or manufacturing process based on the evaluation results, and the yield improves.

The activation periods of the signals CLZ, SEBZ and WAEZ can be modified by blowing the fuse 73a. Therefore, the chip operating at the optimal timings can be manufactured without a change of the photomask or manufacturing process, and the variance in the chip characteristic due to a manufacturing lot or a position of each chip on a wafer or in the manufacturing lot can be suppressed.

Figure 36:
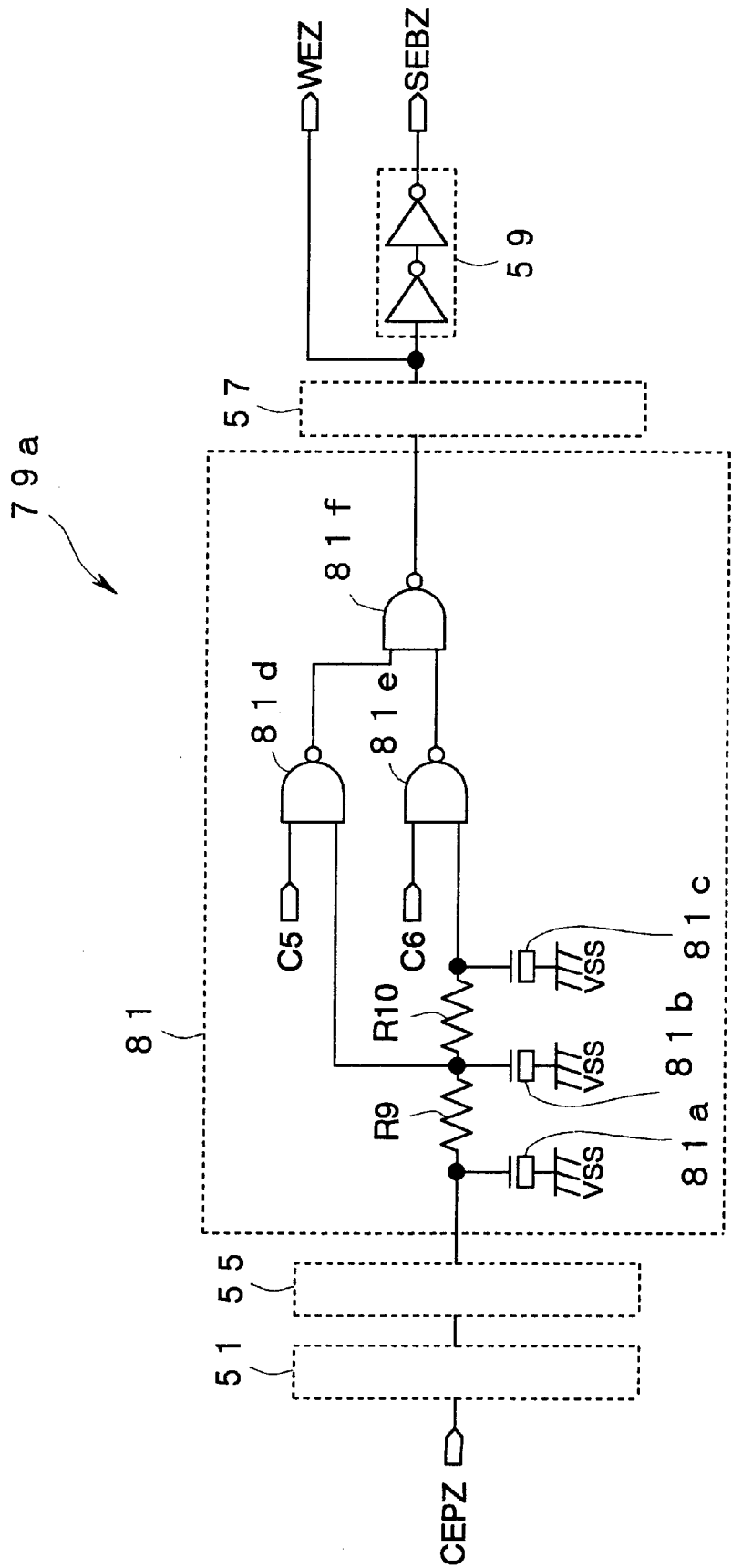
FIG.36 is a circuit diagram of the first timing controlling circuit according to the forth embodiment.
Figure 37:
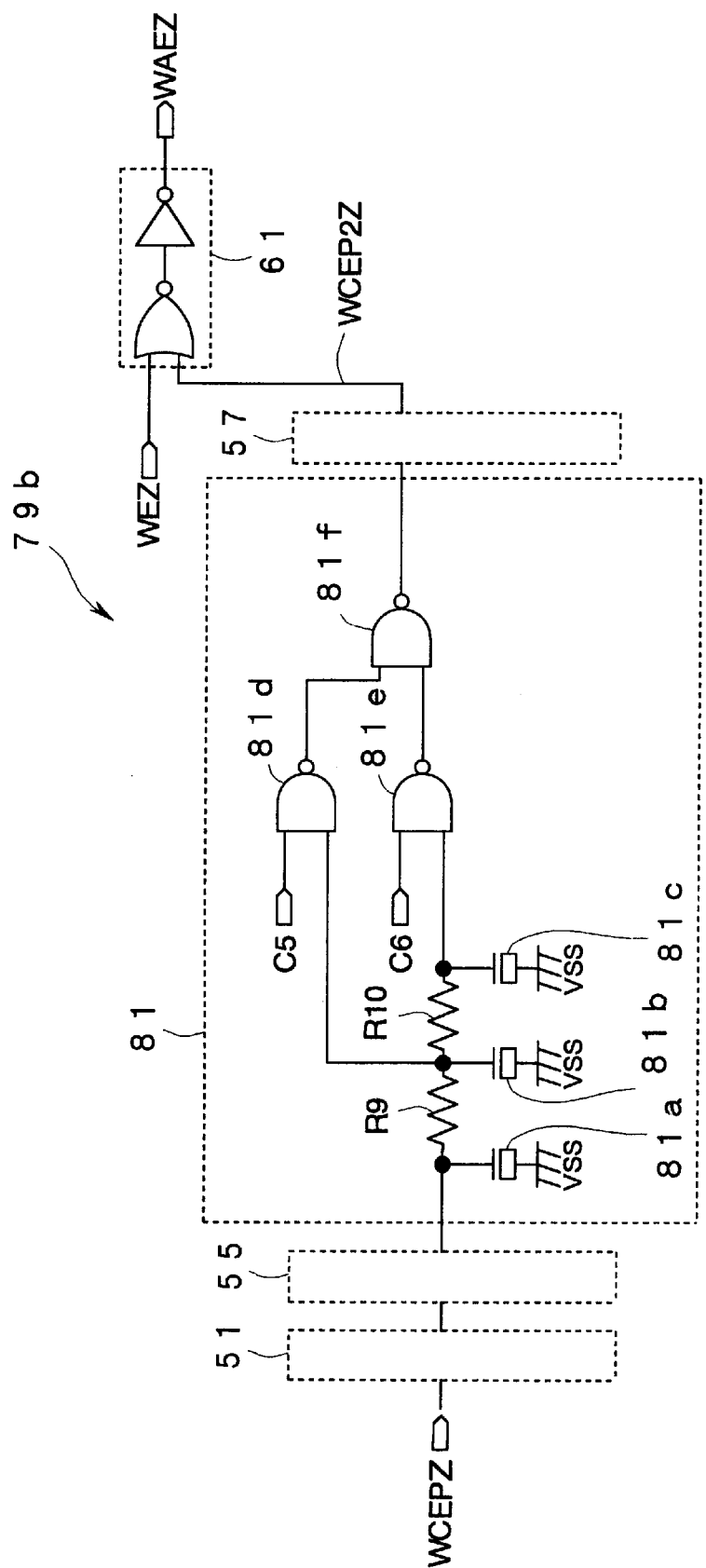
FIG. 37 is a circuit diagram of the second timing controlling circuit according to the forth embodiment.
Figure 38:
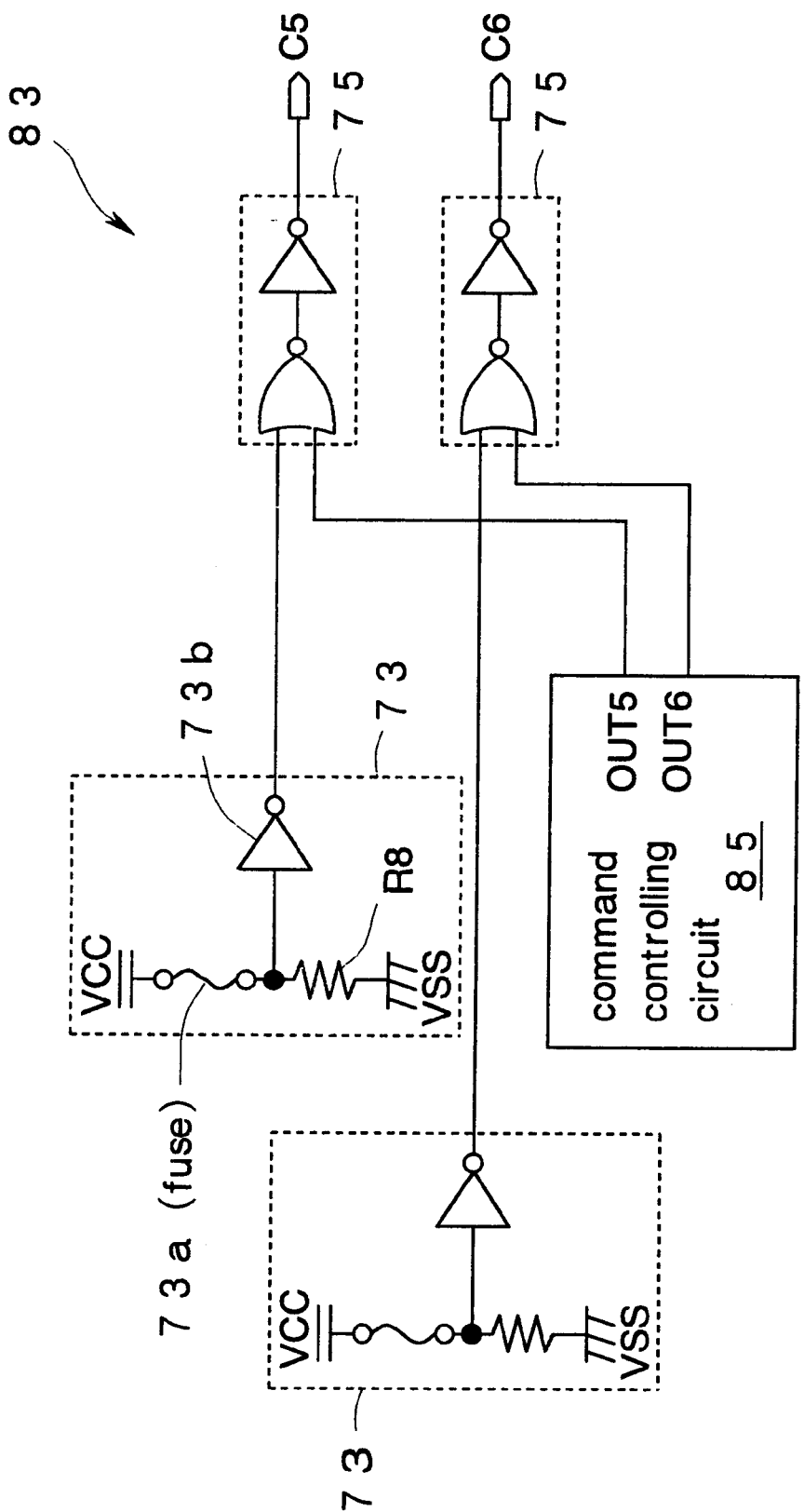
FIG. 38 is a circuit diagram of the controlling circuit according to the forth embodiment.

FIGS. 36 through 38 show a first timing controlling circuit 79a, a second timing controlling circuit 79b, and a controlling circuit 83 in the fourth embodiment of the semiconductor integrated circuit of the present invention. The first timing controlling circuit 79a, the second timing controlling circuit 79b, and the controlling circuit 83 correspond to activation timing modifying circuits.

A circuit configuration of this embodiment is the same as the configuration of the first embodiment described above, except for the first and second timing modifying circuits 79a and 79b and the controlling circuit 83. In this embodiment, the first and second timing controlling circuits 79a and 79b can modify timings of the read controlling signal SEBZ and the write controlling signal WAEZ output therefrom, in two manners.

FIG. 36 shows the first timing controlling circuit 79a in detail. The first timing controlling circuit 79a is the same as the first timing controlling circuit 49a in the first embodiment, except for a delay circuit 81 replacing the delay circuit 53.

The delay circuit 81 comprises MOS capacitors 81a, 81b, and 81c in each of which the source and the drain of an nMOS is connected to a ground line VSS, a resistor R9 connecting the gates of the MOS capacitors 81a and 81b to each other, a resistor R10 connecting the gates of the MOS capacitors 81b and 81c to each other, and three 2-input NAND gates 81d, 81e and 81f. The resistors R9 and R10 are formed with diffusion resistances or the like.

The gate of the MOS capacitor 81a is connected to the output of a logic circuit 55. The gate of the MOS capacitor 81b is connected to one of the inputs of the NAND gate 81d. The gate of the MOS capacitor 81c is connected to one of the inputs of the NAND gate 81e.

The other input of the NAND gate 81d receives a controlling signal C5. The other input of the NAND gate 81e receives a controlling signal C6. The input of the NAND gate 81f is connected to the outputs of the NAND gates 81d and 81e. The output of the NAND gate 81f is connected to the input of a logic circuit 57.

FIG. 37 shows the second timing controlling circuit 79b in detail. The second timing controlling circuit 79b has the same configuration as the second timing controlling circuit 49b in the first embodiment, except for a delay circuit 81 replacing the delay circuit 53. The delay circuit 81 is the same as the delay circuit of the first timing controlling circuit 79a.

FIG. 38 shows the controlling circuit 83 in detail.

The controlling circuit 83 comprises two fuse circuits 73, two OR circuits 75 and a command controlling circuit 85.

One of the inputs of each of the OR circuits 75 is connected to the output of each of the fuse circuits 73. The other inputs of the OR circuits 75 respectively receive output signals OUT5 and OUT6 from the command controlling circuit 85. The output of the OR circuit 75 to which the output signal OUT5 is supplied outputs the controlling signal C5. The output of the OR circuit 75 to which the output signal OUT6 is supplied outputs the controlling signal C6.

The command controlling circuit 85 is activated by a predetermined activation period modifying command supplied from the exterior to the chip. The command controlling circuit 85 has functions of changing all the output signals OUT5 and OUT6 to a low level or changing any one of the output signals to a high level by receiving the activation period modifying command.

In the semiconductor integrated circuit described above, the activation period modifying command is supplied from the exterior. The command controlling circuit 85 turns any one of the output signals OUT5 and OUT6 to a high level one by one and evaluation of data reading and writing is carried out. For example, when the output signal OUT5 is at high level, the controlling circuit 83 turns the controlling signals C5 and C6 to a high level and low level respectively.

The first timing controlling circuit 79a shown in FIG. 36 activates the NAND gate 81d and inactivates the NAND gate 81e. The first timing controlling circuit 79a outputs the read controlling signal SEBZ. Likewise, the second timing controlling circuit 79b shown in FIG. 37 outputs the write controlling signal WAEZ.

An optimal activation period of each of the signals SEBZ and WAEZ which cannot be measured directly from the exterior can be found indirectly by using the evaluation of data reading and writing. Therefore, the characteristic of the chip can be improved by changing a photomask or a manufacturing process based on the evaluation results, and the yield improves.

By blowing the fuse 73a shown in FIG. 38 thereafter, the activation periods of the signals SEBZ and WAEZ are set to the optimal values. For example, when the optimal activation period is observed in the case of the output signal OUT5 being a high level, the fuse 73a connected to the OR circuit 75 outputting the controlling signal C5 is blown. The fuse is blown in each of chips in the same manufacturing lot as the chip evaluated, for example. After the fuse has been blown, the command controlling circuit 85 turns all the output signals OUT5 and OUT6 to a low level, by prohibiting input of the activation period modifying command.

Therefore, by blowing the fuse 73a, the chip operating at the optimal timings can be manufactured, without changing the photomask or manufacturing process. Furthermore, since the activation periods of the signals SEBZ and WAEZ can be modified for each chip, a variance in a chip characteristic of due to a manufacturing lot or a position of the chip on a wafer or in the manufacturing lot can be suppressed.

By the semiconductor integrated circuit according to this embodiment, the same effect as by the first and the third embodiments described above can be obtained. Furthermore, in this embodiment, the activation periods of the signals SEBZ and WAEZ can be modified by the activation period modifying command input from the exterior. Therefore, the characteristic of the chip can be improved by changing the photomask or manufacturing process based on the evaluation results, and the yield is increased.

By blowing the fuse 73a, the activation periods of the signals SEBZ and WAEZ can be modified. Therefore, the chip operating at optimal timings can be manufactured, without changing the photomask or manufacturing process.

In the first embodiment described above, the present invention is applied to the SDRAM. However, the present invention is not limited to this embodiment. For example, the present invention may be applied to a semiconductor memory such as DRAMs or SRAMS. Furthermore, the present invention may be applied to a system LSI including a DRAM memory core.

In the first embodiment described above, the read controlling signal SEBZ and the write controlling signal WAEZ are generated by using the first timing controlling circuit 49a, the delay circuits 51 and 53 of the second timing controlling circuit 49b, and the logic circuits 55 and 57. However, the present invention is not limited to this embodiment, and only either the read controlling signal SEBZ or the write controlling signal WAEZ may be generated by using the delay circuits 51 and 53 and the logic circuits 55 and 57.

In the first embodiment, the delay circuit 51 is formed with the delay element equivalent to the portion of the load of wiring of the clock pulse signal CEPZ formed along the memory core unit 2 in the vertical direction, and the delay circuit 53 is formed with the delay element equivalent to the wiring load of the column decoding signal CAZ. However, the present invention is not limited to this embodiment. For example, the delay circuit 51 may be formed by using wiring having the same width and length of the wiring of the clock pulse signal CEPZ, and the delay circuit 53 may be formed by using wiring having the same width and length of the wiring of the column decoding signal CAZ. In this case, the wiring of the delay circuit 51 may be formed along the wiring of the clock pulse signal CEPZ, for example.

In the first embodiment, the logic circuits 55 and 57 are formed in the same manner as the decoding circuits 4a and 10a. However, the present invention is not limited to this embodiment. For example, the logic circuits 55 and 57 may be formed by delay elements equivalent to the decoding circuits 4a and 10a.

In the first embodiment, the delay time of the delay circuit 53 is set to the average of the wiring load of the column decoding signal CAZ. However, the present invention is not limited to this embodiment, and the delay time of the delay circuit 53 may be set to a worst value of the wiring load of the column decoding signal CAZ.

In the third embodiment described above, the activation periods of the column selecting signal CLZ, the read and write controlling signals SEBZ and WAEZ are modified by modifying the activation periods of the clock pulse signals CEPZ and WCEPZ. However, the present invention is not limited to this embodiment. For example, a plurality of the first clock pulse generators 67 may be used to modify the activation periods of the column selecting signal CLZ and the read and write controlling signals SEBZ and WAEZ.

In the fourth embodiment described above, the semiconductor integrated circuit comprises the circuits for modifying the activation timings of the read and write controlling signals SEBZ and WAEZ. However, the present invention is not limited to this embodiment, and circuits for modifying the activation periods of the column selecting signal CLZ and the read and write controlling signals SEBZ and WAEZ may be used as in the third embodiment, for example.

The invention is not limited to the above embodiments and various modifications may be made without departing from the spirit and the scope of the invention. Any improvement may be made in part or all of the components.

What is claimed is:

1. A semiconductor integrated circuit comprising:
   a memory cell;
   a sense amplifier for amplifying data read from and written to said memory cell;
   an input/output controlling circuit comprising at least one of either a read controlling circuit receiving said data amplified by said sense amplifier in a read operation or a write controlling circuit for outputting said data to said sense amplifier in a write operation;
   a switching circuit for carrying out on/off control of a transmission path of said data between said sense amplifier and said input/output controlling circuit;
   a reference timing signal generator for generating a reference timing signal used in said read operation and said write operation;
   a timing controlling circuit for receiving said reference timing signal and for generating at least one of either a read controlling signal or a write controlling signal for controlling said input/output controlling circuit; and
   a switch controlling circuit for receiving said reference timing signal and for generating a switch controlling signal for the on/off control of said switching circuit, wherein
       said timing controlling circuit comprises a delay element identical or equivalent to a delay element existing in said switch controlling circuit.

2. A semiconductor integrated circuit according to claim 1, comprising a plurality of said sense amplifiers, a plurality of said input/output controlling circuits, and a plurality of said switching circuits respectively connecting said sense amplifiers and said input/output controlling circuits, wherein,
   said switch controlling circuit generates a plurality of said switch controlling signals corresponding to said switching circuits and
   said delay element of said timing controlling circuit is formed in accordance with an average of activation timings of said switch controlling signals.

3. A semiconductor integrated circuit according to claim 1, wherein said timing controlling circuit comprises a delay element identical or equivalent to a delay element of a circuit existing in said signal path.

4. A semiconductor integrated circuit according to claim 1, wherein said timing controlling circuit comprises a delay element identical or equivalent to a delay element of a wiring existing in said signal path.

5. A semiconductor integrated circuit according to claim 1, wherein,
   said input/output controlling circuit comprises said read controlling circuit and
   said timing controlling circuit comprises a delay gate for delaying an activation timing of said read controlling signal behind an activation timing of said switch controlling signal.

6. A semiconductor integrated circuit according to claim 5, comprising a fuse on the integrated circuit, and wherein said activation timing can be set to a predetermined value by blowing said fuse.

7. A semiconductor integrated circuit according to claim 5, comprising an activation timing modifying circuit for modifying an activation period of at least any one of said switch controlling signal, said read controlling signal, and said write controlling signal.

8. A semiconductor integrated circuit according to claim 7, comprising a fuse on the integrated circuit, and wherein said activation timing can be set to a predetermined value by blowing said fuse.

9. A semiconductor integrated circuit according to claim 1, comprising a plurality of said sense amplifiers, a plurality of said input/output controlling circuits, and a plurality of said switching circuits respectively connecting said sense amplifiers and said input/output controlling circuits, wherein,
   said switch controlling circuit generates a plurality of said switch controlling signals respectively corresponding to said switching circuits and
   said delay element of said timing controlling circuit is formed in accordance with the switch controlling signal which is activated the latest among said switch controlling signals.

10. A semiconductor integrated circuit according to claim 1, said semiconductor integrated circuit comprising a plurality of said sense amplifiers, a plurality of said switching circuits, and a plurality of said input/output controlling circuits respectively connected to said sense amplifiers respectively through said switching circuits, wherein
   said switch controlling circuit generates a plurality of said switch controlling signals corresponding to said each switching circuit and,
   said timing controlling circuit respectively generates at least one of either a plurality of said read controlling signals or a plurality of said write controlling signals in accordance with each activation timing of said switch controlling signals.

11. A semiconductor integrated circuit comprising:
   a memory cell;
   a sense amplifier for amplifying data read from or written to said memory cell;
   a write controlling circuit for outputting said data to said sense amplifier by receiving a write controlling signal activated in a write operation; and
   a switching circuit for carrying out on/off control of a transmission path of said data between said sense amplifier and said write controlling circuit, in response to a switch controlling signal in said write operation, and
   wherein an activation period of said write controlling signal is longer than that of said switch controlling signal.

12. A semiconductor integrated circuit according to claim 11, wherein said write controlling signals are generated by using OR logic of:
   a first write controlling signal being generated by using a delay element identical or equivalent to a delay element existing in a signal path of said switch controlling signal and activated at a timing substantially the same as an activation timing of said switch controlling signal; and a second write controlling signal being generated by a delay element identical or equivalent to a delay element exiting in said signal path of said switch controlling signal and activated at a timing earlier than said activation timing of said switch controlling signal.

13. A semiconductor integrated circuit according to claim 12, wherein an activation period of said first write controlling signal and an activation period of said second write controlling signal are substantially equal.

14. A semiconductor integrated circuit comprising:

a memory cell;

a sense amplifier for amplifying data read from or written to said memory cell;

an input/output circuit comprising at least one of either a read controlling circuit receiving said data amplified by said sense amplifier in a read operation or a write controlling circuit for outputting said data to said sense amplifier in a write operation;

a switching circuit for carrying out on/off control of a transmission path of said data between said sense amplifier and said input/output controlling circuit;

a timing controlling circuit for receiving said reference timing signal and for generating at least one of either a read controlling signal or a write controlling signal for controlling said input/output circuit;

a switch controlling circuit for receiving said reference timing signal and for generating a switch controlling signal for controlling said switching circuit; and an activation timing modifying circuit for modifying an activation period of at least any one of said switch controlling signal, said read controlling signal, and said write controlling signal.

* * * * *